(12) United States Patent
Lee et al.

(10) Patent No.: US 12,418,006 B2
(45) Date of Patent: Sep. 16, 2025

(54) PIXEL AND DISPLAY DEVICE INCLUDING THE SAME

(71) Applicant: Samsung Display Co., LTD., Yongin-si (KR)

(72) Inventors: Hyun Wook Lee, Yongin-si (KR); Young Woon Kho, Yongin-si (KR); Sung Geun Bae, Yongin-si (KR); Tae Hee Lee, Yongin-si (KR); Won Hyeong Heo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 774 days.

(21) Appl. No.: 17/824,398

(22) Filed: May 25, 2022

(65) Prior Publication Data

US 2023/0005898 A1    Jan. 5, 2023

(30) Foreign Application Priority Data

Jun. 30, 2021 (KR) .................. 10-2021-0086008

(51) Int. Cl.
*H01L 25/16* (2023.01)
*H01L 23/00* (2006.01)
(Continued)

(52) U.S. Cl.
CPC ............ *H01L 25/167* (2013.01); *H01L 24/24* (2013.01); *H10D 86/441* (2025.01); *H10D 86/60* (2025.01);
(Continued)

(58) Field of Classification Search
CPC ....... H10H 29/142; H10H 2224/95133; H10H 20/83; H10H 20/831; H10H 20/032
See application file for complete search history.

(56) References Cited

U.S. PATENT DOCUMENTS 10,797,212 B2   10/2020   Im et al.
2011/0058126 A1   3/2011   Okada et al.
(Continued)

FOREIGN PATENT DOCUMENTS

KR   10-2019-0042130   4/2019
KR   10-2020-0027136   3/2020
(Continued)

OTHER PUBLICATIONS

International Search Report corresponding to International Application No. PCT/KR2022/009186 dated Oct. 11, 2022.

*Primary Examiner* — Alia Sabur
(74) *Attorney, Agent, or Firm* — Womble Bond Dickinson (US) LLP

(57) ABSTRACT

A pixel includes an emission area and a non-emission area; first to fourth alignment electrodes spaced apart from each other in the emission area and an area of the non-emission area; an insulating layer disposed on the first to fourth alignment electrodes; first to fourth bridge patterns disposed on the insulating layer in the non-emission area; a bank disposed on the first to fourth bridge patterns in the non-emission area, and including a first opening and a second opening; first and second pixel electrodes disposed in the emission area; and light emitting elements disposed in the emission area, and electrically connected with the first and second pixel electrodes. The first alignment electrode, the first bridge pattern, and the first pixel electrode are electrically connected to each other. The third alignment electrode, the third bridge pattern, and the second pixel electrode are electrically connected to each other.

20 Claims, 26 Drawing Sheets

(51) Int. Cl.
*H10D 86/40* (2025.01)
*H10D 86/60* (2025.01)
*H10H 20/825* (2025.01)
*H10H 20/857* (2025.01)

(52) U.S. Cl.
CPC .......... *H10H 20/857* (2025.01); *H01L 24/25* (2013.01); *H01L 24/82* (2013.01); *H01L 24/95* (2013.01); *H01L 2224/24051* (2013.01); *H01L 2224/24145* (2013.01); *H01L 2224/25175* (2013.01); *H01L 2224/82986* (2013.01); *H01L 2224/95101* (2013.01); *H01L 2224/95133* (2013.01); *H10H 20/8252* (2025.01)

(56) References Cited

U.S. PATENT DOCUMENTS

| | | | |
|---|---|---|---|
| 2018/0175106 A1* | 6/2018 | Kim | ............... H10H 20/84 |
| 2021/0159250 A1 | 5/2021 | Chang et al. | |
| 2021/0217739 A1 | 7/2021 | Lee et al. | |
| 2021/0265541 A1 | 8/2021 | Kim et al. | |
| 2021/0305222 A1* | 9/2021 | Min | ............... H10H 20/857 |
| 2022/0293835 A1 | 9/2022 | Li et al. | |

FOREIGN PATENT DOCUMENTS

| | | |
|---|---|---|
| KR | 10-2020-0028350 | 3/2020 |
| KR | 10-2020-0070493 | 6/2020 |
| KR | 10-2020-0073340 | 6/2020 |
| KR | 10-2021-0008252 | 1/2021 |
| KR | 10-2021-0045572 | 4/2021 |
| KR | 10-2021-0065238 | 6/2021 |

* cited by examiner

PIXEL AND DISPLAY DEVICE INCLUDING THE SAME

CROSS-REFERENCE TO RELATED APPLICATION(S)

The application claims priority to and the benefit of Korean patent application number 10-2021-0086008 under 35 U.S.C. § 119, filed in the Korean Intellectual Property Office (KIPO) on Jun. 30, 2021, the entire contents of which are incorporated herein by reference.

BACKGROUND

1. Technical Field

Various embodiments of the disclosure relate to a pixel and a display device including the pixel.

2. Description of Related Art

Recently, as interest in information display increases, research and development on display devices have been continuously conducted.

SUMMARY

Various embodiments of the disclosure are directed to a pixel having improved reliability, and a display device including the pixel.

A pixel in accordance with an embodiment may include an emission area and a non-emission area; a first alignment electrode, a second alignment electrode, a third alignment electrode, and a fourth alignment electrode spaced apart from each other in the emission area and an area of the non-emission area; an insulating layer disposed on the first to the fourth alignment electrodes; a first bridge pattern, a second bridge pattern, a third bridge pattern, and a fourth bridge pattern disposed on the insulating layer in the non-emission area, and spaced apart from each other; a bank disposed on the first to the fourth bridge patterns in the non-emission area, and including a first opening corresponding to the emission area, and a second opening spaced apart from the first opening; a first pixel electrode and a second pixel electrode disposed in the emission area, and spaced apart from each other; and light emitting elements disposed in the emission area, and electrically connected with the first and the second pixel electrodes.

In an embodiment, the first alignment electrode, the first bridge pattern, and the first pixel electrode may be electrically connected to each other. The third alignment electrode, the third bridge pattern, and the second pixel electrode may be electrically connected to each other.

In an embodiment, the insulating layer may include at least one first contact hole exposing a portion of the first alignment electrode, at least one second contact hole exposing a portion of the second alignment electrode, at least one third contact hole exposing a portion of the third alignment electrode, and at least one fourth contact hole exposing a portion of the fourth alignment electrode.

In an embodiment, the first bridge pattern may be electrically connected with the first alignment electrode through the first contact hole. The second bridge pattern may be electrically connected with the second alignment electrode through the second contact hole. The third bridge pattern may be electrically connected with the third alignment electrode through the third contact hole. The fourth bridge pattern may be electrically connected with the fourth alignment electrode through the fourth contact hole.

In an embodiment, the first, the second, the third, and the fourth contact holes may be disposed in the non-emission area. The first, the second, the third, and the fourth contact holes may overlap the bank in a plan view.

In an embodiment, the first to the fourth alignment electrodes and the first to the fourth bridge patterns may include different materials.

In an embodiment, the first to the fourth alignment electrodes may include opaque conductive material, and the first to the fourth bridge patterns may include transparent conductive oxide.

In an embodiment, the first pixel electrode may be disposed directly on the first bridge pattern in the second opening and electrically connected with the first bridge pattern. Furthermore, the second pixel electrode may be disposed directly on the third bridge pattern in the second opening and electrically connected with the third bridge pattern.

In an embodiment, the first pixel electrode may be disposed on the first alignment electrode in the first opening with the insulating layer disposed between the first pixel electrode and the first alignment electrode, and the second pixel electrode may be disposed on the third alignment electrode in the first opening with the insulating layer disposed the second pixel electrode and the third alignment electrode.

In an embodiment, the pixel may further include a substrate; at least one transistor disposed on the substrate; at least one power line disposed on the substrate and supplied with a power voltage; a passivation layer disposed on the transistor and the power line, and including a first contact portion exposing a portion of the transistor, and a second contact portion exposing a portion of the power line; and a via layer including a first contact portion corresponding to the first contact portion of the passivation layer, and a second contact portion corresponding to the second contact portion of the passivation layer.

In an embodiment, the insulating layer may be disposed on the via layer, and include a first contact portion corresponding to the first contact portion of the via layer, and a second contact portion corresponding to the second contact portion of the via layer.

In an embodiment, the first contact portion and the second contact portion may be disposed in the non-emission area and overlap the bank in a plan view.

In an embodiment, the first bridge pattern is electrically connected with the transistor through the first contactor portion, and the third bridge pattern may be electrically connected with the power line through the second contact portion.

In an embodiment, the pixel may further include a color conversion layer disposed over the light emitting elements, and converting a first color of light emitted from the light emitting elements to a second color of light; and a color filter disposed over the color conversion layer and allowing the second color of light to selectively pass therethrough.

In an embodiment, the pixel may further include an intermediate electrode spaced apart from the first and the second pixel electrodes.

A display device in accordance with an embodiment may include a substrate including a display area and a non-display area; pixels provided in the display area of the substrate; and a pad disposed in the non-display area of the substrate, and electrically connected with each of the pixels.

In an embodiment, each of the pixels may include: an emission area and a non-emission area; a first alignment electrode, a second alignment electrode, a third alignment electrode, and a fourth alignment electrode spaced apart from each other in the emission area and an area of the non-emission area; an insulating layer disposed on the first to the fourth alignment electrodes; a first bridge pattern, a second bridge pattern, a third bridge pattern, and a fourth bridge pattern disposed on the insulating layer in the non-emission area, and spaced apart from each other; a bank disposed on the first to the fourth bridge patterns in the non-emission area, and including a first opening corresponding to the emission area, and a second opening spaced apart from the first opening; a first pixel electrode and a second pixel electrode disposed in the emission area, and spaced apart from each other; and light emitting elements disposed in the emission area, and electrically connected with the first and the second pixel electrodes.

In an embodiment, the first alignment electrode, the first bridge pattern, and the first pixel electrode may be electrically connected to each other. The third alignment electrode, the third bridge pattern, and the second pixel electrode may be electrically connected to each other.

In an embodiment, the insulating layer may include at least one first contact hole exposing a portion of the first alignment electrode, at least one second contact hole exposing a portion of the second alignment electrode, at least one third contact hole exposing a portion of the third alignment electrode, and at least one fourth contact hole exposing a portion of the fourth alignment electrode.

In an embodiment, the first bridge pattern may be electrically connected with the first alignment electrode through the first contact hole. The second bridge pattern may be electrically connected with the second alignment electrode through the second contact hole. The third bridge pattern may be electrically connected with the third alignment electrode through the third contact hole. The fourth bridge pattern may be electrically connected with the fourth alignment electrode through the fourth contact hole.

In an embodiment, the first, the second, the third, and the fourth contact holes may be disposed in the non-emission area, and may overlap the bank in a plan view.

In an embodiment, the pad may include a first pad electrode disposed on the substrate; the insulating layer disposed on the first pad electrode, and including a pad electrode contact hole exposing a portion of the first pad electrode; and a second pad electrode disposed on the insulating layer and electrically connected with the first pad electrode through the pad electrode contact hole. The second pad electrode and the first to the fourth bridge patterns may be disposed on a same layer, and the second pad electrode and the first to the fourth bridge patterns include may include a same material.

In an embodiment, the first to the fourth alignment electrodes and the first to the fourth bridge patterns may include different materials. The first to the fourth alignment electrodes may include opaque conductive material. The first to the fourth bridge patterns may include transparent conductive material.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
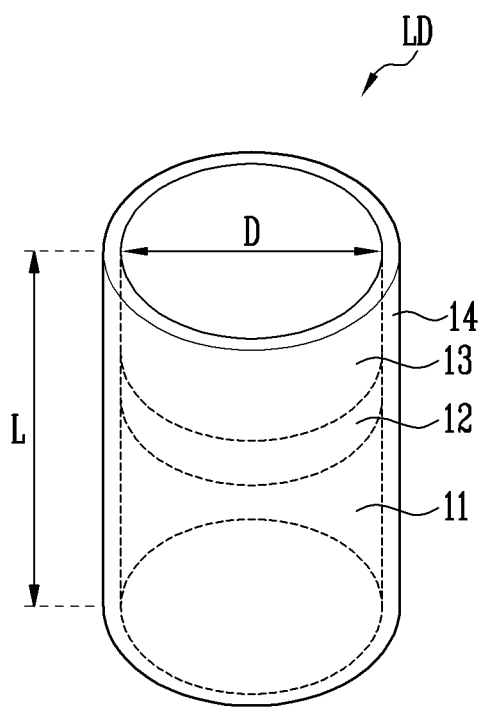
FIGS. 1 and 2 are perspective views schematically illustrating a light emitting element in accordance with an embodiment.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first", "second", and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be further understood that the terms "comprise", "include", "have", and the like when used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, in case that it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

It will be understood that when an element (e.g., a first element) is referred to as being (operatively or communicatively) "coupled with/to," or "connected with/to" another element (e.g., a second element), the first element may be coupled or connected with/to the second element directly or via another element (e.g., a third element). In contrast, it will be understood that when an element (e.g., a first element) is referred to as being "directly coupled with/to" or "directly connected with/to" another element (e.g., a second element), no other element (e.g., a third element) intervenes between the element and the other element.

Embodiments and required details of the disclosure are described with reference to the accompanying drawings in order to describe the disclosure in detail so that those having ordinary knowledge in the technical field to which the disclosure pertains may easily practice the disclosure. Furthermore, a singular form may include a plural form as long as it is not specifically mentioned in a sentence.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling, and vice versa.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
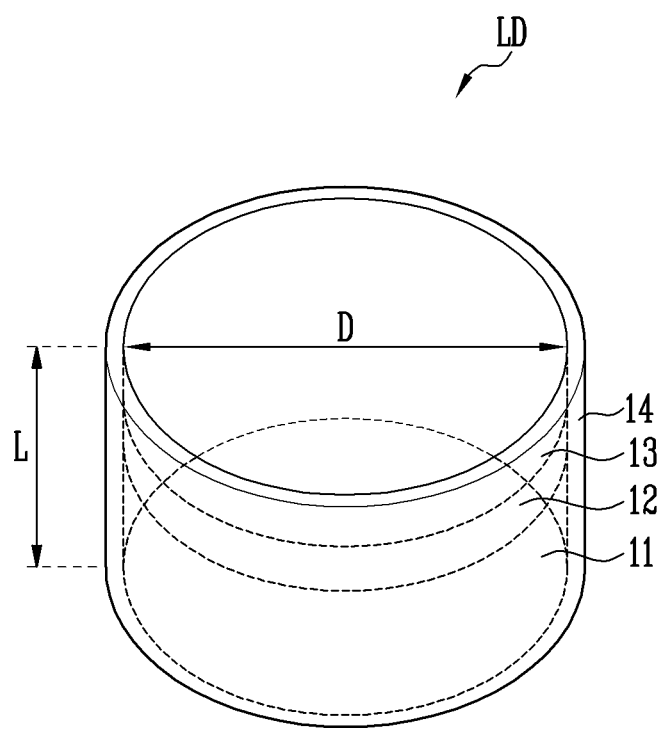
Figure 3:
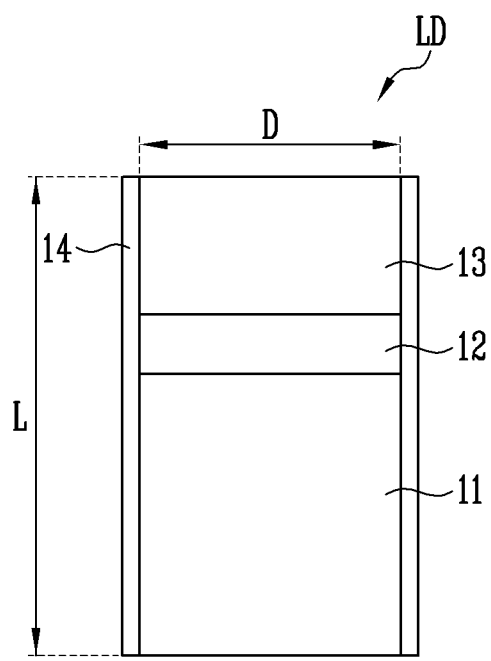
FIG. 3 is a cross-sectional view schematically illustrating the light emitting element of FIG. 1.

FIGS. 1 and 2 are perspective views schematically illustrating a light emitting element (or light emitting diode) LD in accordance with an embodiment. FIG. 3 is a schematic cross-sectional view illustrating the light emitting element LD of FIG. 1.

In an embodiment, the type and/or shape of the light emitting element LD is not limited to the embodiment illustrated in FIGS. 1 to 3.

Referring to FIGS. 1 to 3, the light emitting element LD may include a first semiconductor layer 11, a second semiconductor layer 13, and an active layer 12 disposed (or interposed) between the first and second semiconductor layers 11 and 13. For example, the light emitting element LD may be implemented as an emission stack (or also referred to as "stack") formed by successively stacking the first conductive semiconductor layer 11, the active layer 12, and the second conductive semiconductor layer 13.

The light emitting element LD may extend in a direction. If the direction in which the light emitting element LD extends is defined as a longitudinal direction, the light emitting element LD may have one end (or a lower end) and a remaining end (or an upper end or another end) in the longitudinal direction. One of the first and second semiconductor layers 11 and 13 may be disposed on the one end of the light emitting element LD, and the other one of the first and second semiconductor layers 11 and 13 may be disposed on the remaining end of the light emitting element LD. For example, the first semiconductor layer 11 may be disposed on the one end of the light emitting element LD, and the second semiconductor layer 13 may be disposed on the remaining end of the light emitting element LD.

The light emitting element LD may have various shapes. For example, as illustrated in FIG. 1, the light emitting element LD may have a rod-like shape, a bar-like shape, or a pillar-like shape which is long (for example, to have an aspect ratio greater than 1) in the longitudinal direction. In an embodiment, a length L of the light emitting element LD in the longitudinal direction may be greater than a diameter D (or a width of a cross-section) thereof. However, the disclosure is not limited thereto. In an embodiment, as illustrated in FIG. 2, the light emitting element LD may have a rod-like shape, a bar-like shape, or a pillar-like shape which is short in the longitudinal direction (for example, to have an aspect ratio less than 1). In an embodiment, the light emitting element LD may have a rod-like shape, a bar-like shape, or a pillar-like shape in which the length L there and the diameter D thereof are the same as each other.

The light emitting element LD may include a light-emitting diode (LED) fabricated to have a subminiature size, e.g., with a diameter D and/or a length L corresponding to the micro scale or the nano scale.

In case that the light emitting element LD is long (for example, to have an aspect ratio greater than 1) in the longitudinal direction, the diameter D of the light emitting element LD may be in a range of about 0.5 μm to about 6 μm, and the length L thereof may be in a range of about 1 μm to about 10 μm. However, the diameter D and the length L of the light emitting element LD are not limited thereto. The size of the light emitting element LD may be changed to meet conditions (or design conditions) of a lighting device or a self-emissive display device to which the light emitting element LD is applied.

The first semiconductor layer 11 may include, for example, at least one n-type semiconductor layer. For instance, the first semiconductor layer 11 may include an n-type semiconductor layer which includes any one semiconductor material of InAlGaN, GaN, AlGaN, InGaN, AlN, and InN and is doped with a first conductive dopant (or an n-type dopant) such as Si, Ge, or Sn. However, the material of the first semiconductor layer 11 is not limited to thereto, and the first semiconductor layer 11 may be formed of (or include) various other materials. The first semiconductor layer 11 may include, in the longitudinal direction of the light emitting element LD, an upper surface that contacts the active layer 12, and a lower surface exposed to the outside. The lower surface of the first semiconductor layer 11 may correspond to the one end (or the lower end) of the light emitting element LD.

The active layer 12 may be disposed on the first semiconductor layer 11 and have a single or multiple quantum well structure. For example, in case that the active layer 12 has a multiple quantum well structure, the active layer 12 may be formed by periodically repeatedly stacking a barrier layer, a stain reinforcing layer, and a well layer which are provided as a unit. The stain reinforcing layer may have a lattice constant less than that of the barrier layer so that strain, e.g., compressive strain, to be applied to the well layer may be further reinforced. However, the structure of the active layer 12 is not limited to that of the foregoing embodiment.

The active layer 12 may emit light having a wavelength ranging from about 400 nm to about 900 nm and use a double hetero structure. In an embodiment, a clad layer (not shown) doped with a conductive dopant may be formed over or under the active layer 12 in the longitudinal direction of the light emitting element LD. For example, the cladding layer may be formed of (or include) an AlGaN layer or an InAlGaN layer. In an embodiment, material such as AlGaN or InAlGaN may be used to form the active layer 12, and various other materials may be used to form the active layer 12. The active layer 12 may include a first surface which contacts the first semiconductor layer 11, and a second surface which contacts the second semiconductor layer 13.

If an electric field having a predetermined voltage or more is applied to the opposite ends of the light emitting element LD, the light emitting element LD may emit light by coupling of electron-hole pairs in the active layer 12. Since light emission of the light emitting element LD may be controlled based on the foregoing principle, the light emitting element LD may be used as a light source (or a light emitting source) of various light emitting devices as well as a pixel of the display device.

The second semiconductor layer 13 may be disposed on the second surface of the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer which includes any one semiconductor material of InAlGaN, GaN, AlGaN, InGaN, AlN, and InN and is doped with a second conductive dopant (or a p-type dopant) such as Mg, Zn, Ca, Sr, or Ba. However, the material for forming the second semiconductor layer 13 is not limited thereto, and the second semiconductor layer 13 may be formed of (or include) various other materials. The second semiconductor layer 13 may include, in the longitudinal direction of the light emitting element LD, a lower surface that contacts the second surface of the active layer 12, and an upper surface exposed to the outside. Here, the upper surface of the second semiconductor layer 13 may correspond to the remaining end (or the upper end or another end) of the light emitting element LD.

In an embodiment, the first semiconductor layer 11 and the second semiconductor layer 13 may have different thicknesses in the longitudinal direction of the light emitting element LD. For example, the first semiconductor layer 11 may have a thickness greater than that of the second semiconductor layer 13 in the longitudinal direction of the light emitting element LD. Hence, the active layer 12 of the light emitting element LD may be disposed closer to the upper surface of the second semiconductor layer 13 than to the lower surface of the first semiconductor layer 11.

Although the first semiconductor layer 11 and the second semiconductor layer 13 each is formed of a single layer, the disclosure is not limited thereto. In an embodiment, depending on the material of the active layer 12, the first semiconductor layer 11 and the second semiconductor layer 13 each may further include one or more layers, for example, a clad layer and/or a tensile strain barrier reducing (TSBR) layer. The TSBR layer may be a strain relief layer of which a lattice structure is disposed between other semiconductor layers so that the strain relief layer functions as a buffer layer to reduce a difference in lattice constant. Although the TSBR layer may be formed of a p-type semiconductor layer such as p-GaInP, p-AlInP, or p-AlGaInP, the disclosure is not limited thereto.

In an embodiment, the light emitting element LD may further include a contact electrode (hereinafter referred to as "first contact electrode") disposed on the second semiconductor layer 13, as well as including the first semiconductor layer 11, the active layer 12, and the second semiconductor layer 13. Furthermore, in an embodiment, the light emitting element LD may further include another contact electrode (hereinafter referred to as "second contact electrode") disposed on one end of the first semiconductor layer 11.

Each of the first and second contact electrodes may be an ohmic contact electrode, but the disclosure is not limited thereto. In an embodiment, each of the first and second contact electrodes may be a Schottky contact electrode. The first and second contact electrodes may include conductive material. For example, the first and second contact electrodes may include opaque metal such as chromium (Cr), titanium (Ti), aluminum (Al), gold (Au), nickel (Ni), and oxides or alloys thereof, which are used alone or in combination, but the disclosure is not limited thereto. In an embodiment, the first and second contact electrodes may also include transparent conductive oxides such as indium tin oxide (ITO), indium zinc oxide (IZO), zinc oxide (ZnO), indium gallium zinc oxide (IGZO), and indium tin zinc oxide (ITZO).

Materials included in the first and second contact electrodes may be equal to or different from each other. The first and second contact electrodes may be substantially transparent or translucent. Therefore, light generated from the light emitting element LD may pass through the first and second contact electrodes and then be emitted outside the light emitting element LD. In some embodiments, in case that light generated from the light emitting element LD is emitted outside the light emitting element LD through an area other than the opposite ends of the light emitting element LD rather than passing through the first and second contact electrodes, the first and second contact electrodes may include opaque metal.

In an embodiment, the light emitting element LD may further include an insulating film 14. However, in some embodiments, the insulating film 14 may be omitted, or may be provided to cover only some of the first semiconductor layer 11, the active layer 12, and the second semiconductor layer 13.

The insulating film 14 may prevent the active layer 12 from short-circuiting due to contact with conductive material except the first and second semiconductor layers 13. Furthermore, the insulating film 14 may minimize a surface defect of the light emitting element LD, thus enhancing the lifespan and emission efficiency of the light emitting element LD. In case that light emitting elements LD are disposed in close contact with each other, the insulating film 14 may prevent undesired short circuit between the light emitting elements LD. It is not limited whether the insulating film 14 is provided or not, so long as the active layer 12 may be prevented from short-circuiting with external conductive material.

The insulating film 14 may be provided to enclose an overall outer circumferential surface of the emission stack including the first semiconductor layer 11, the active layer 12, and the second semiconductor layer 13.

Although in the foregoing embodiment the insulating film 14 has been described as enclosing the entirety of the respective outer circumferential surfaces of the first semiconductor layer 11, the active layer 12, and the second semiconductor layer 13, the disclosure is not limited thereto. In an embodiment, in case that the light emitting element LD includes the first contact electrode, the insulating film 14 may enclose the entirety of the respective outer circumferential surfaces of the first semiconductor layer 11, the active layer 12, the second semiconductor layer 13, and the first contact electrode. In an embodiment, the insulating film 14 may not enclose the entirety of the outer circumferential surface of the first contact electrode, or may enclose only a portion of the outer circumferential surface of the first contact electrode, but may not enclose the other portion of the outer circumferential surface of the first contact electrode. Furthermore, in an embodiment, in case that the first contact electrode is disposed on the remaining end (or the upper end or another end) of the light emitting element LD and the second contact electrode is disposed on the one end (or the lower end) of the light emitting element LD, the insulating film 14 may allow at least one area of each of the first and second contact electrodes to be exposed.

The insulating film 14 may include transparent insulating material. For example, the insulating film 14 may be include one or more insulating materials selected from the group constituting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanstrontium oxide ($SrTiO_x$), cobalt oxide ($CoxO_y$), magnesium oxide (MgO), zinc oxide (ZnO), ruthenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, $In_xO_y$:H, niobium oxide ($Nb_xO_y$), magnesium fluoride ($MgF_x$), aluminum fluoride ($AlF_x$), an alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN). However, the disclosure is not limited thereto, and various materials having insulation may be used as the material of the insulating film 14.

The insulating film 14 may be provided in the form of a single layer or in the form of multiple layers including at least two layers. For example, in case that the insulating film 14 is formed of a double layer structure including a first layer and a second layer that are successively stacked, the first layer and the second layer may be made of different materials (or substances) and be formed by different processes. In an embodiment, the first layer and the second layer may include the same material and be formed by a successive process.

In an embodiment, the light emitting element LD may be implemented as a light emitting pattern having a core-shell structure. In this case, the first semiconductor layer 11 may be disposed in a core of the light emitting element LD, for example, a central portion of the light emitting element LD. The active layer 12 may be provided and/or formed to enclose the outer circumferential surface of the first semiconductor layer 11. The second semiconductor layer 13 may be provided and/or formed to enclose the active layer 12. Furthermore, the light emitting element LD may further include a contact electrode (not illustrated) formed to enclose at least one side of the second semiconductor layer 13. In an embodiment, the light emitting element LD may further include an insulating film 14 which is provided on the outer circumferential surface of the light emitting pattern having a core-shell structure and has transparent insulating material. The light emitting element LD implemented as the light emitting pattern having the core-shell structure may be manufactured in a growth manner.

The light emitting element LD may be employed as a light emitting source (or referred to as "light source") for various display devices. The light emitting element LD may be fabricated by a surface treatment process. For example, the light emitting element LD may be surface-treated so that, in case that light emitting elements LD are mixed with a fluidic solution (or solvent) and then supplied to each pixel area (e.g., an emission area of each pixel or an emission area of each sub-pixel), the light emitting elements LD may be evenly distributed rather than unevenly aggregating in the solution.

A light emitting unit (or light emitting part or light emitting device) including the light emitting element LD described above may be used in various types of devices including a display device which requires a light source. For instance, in case that light emitting elements LD are disposed in the pixel area of each pixel of a display panel, the light emitting elements LD may be used as a light source of the pixel. However, the application field of the light emitting element LD is not limited to the above-mentioned examples. For example, the light emitting element LD may also be used in other types of electronic devices such as a lighting device, which requires a light source.

Figure 4:
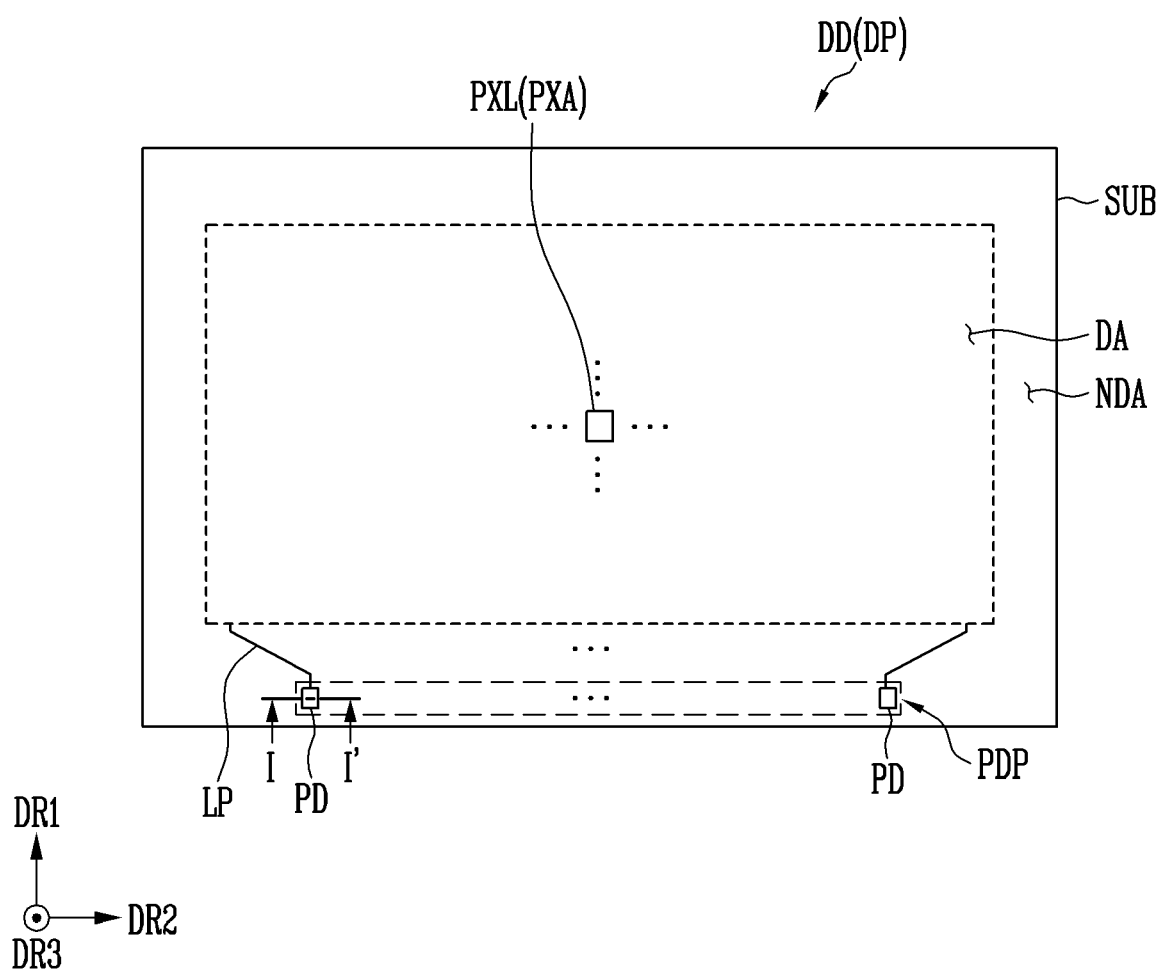
FIG. 4 is a plan view schematically illustrating a display device in accordance with an embodiment.

FIG. 4 is a plan view schematically illustrating a display device DD in accordance with an embodiment.

In FIG. 4, for the sake of explanation, there is schematically illustrated the display device DD, particularly, the structure of a display panel DP provided in the display device DD, centered on a display area DA in which an image is displayed.

If the display device DD is an electronic device having a display surface on at least one surface thereof, e.g., a smartphone, a television, a tablet PC, a mobile phone, a video phone, an electronic reader, a desktop PC, a laptop PC, a netbook computer, a workstation, a server, a personal digital assistant (PDA), a portable multimedia player (PMP), an MP3 player, a medical appliance, a camera, or a wearable device, the disclosure may be applied to the display device DD.

Referring to FIGS. 1 to 4, the display device DD may include a substrate SUB, pixels PXL provided in or on the substrate SUB and each including at least one light emitting element LD, a driver provided on the substrate SUB and configured to drive the pixels PXL, and a line component LP provided to electrically connect the pixels PXL with the driver.

The display device DD may be classified into a passive matrix type display device and an active matrix type display device according to a method of driving the light emitting element LD. For example, in case that the display device DD is implemented as an active matrix type, each of the pixels PXL may include a driving transistor configured to control the amount of current to be supplied to the light emitting element LD, and a switching transistor configured to transmit data signals to the driving transistor.

The display device DD may be provided in various forms, for example, in the form of a rectangular plate having two pairs of parallel sides, but the disclosure is not limited thereto. In case that the display device DD is provided in the form of a rectangular plate, any one pair of sides of the two pairs of sides may be longer than the other pair of sides. For the sake of explanation, there is illustrated the case where the display device DD has a rectangular shape with a pair of long sides and a pair of short sides. A direction in which the long sides extend is indicated by a second direction DR2, a direction in which the short sides extend is indicated by a first direction DR1, and a thickness-wise direction of the substrate SUB is indicated by a third direction DR3. In the display device DD provided in a rectangular planar shape, each corner on which one long side and one short side contact (or meet) each other may have a round shape.

The substrate SUB may include a display area DA and a non-display area NDA.

The display area DA may be an area in which the pixels PXL for displaying an image are provided. The non-display area NDA may be an area in which the driver for driving the pixels PXL and the line component LP for electrically connecting the pixels PXL to the driver are provided. For the sake of explanation, FIG. 4 illustrates only a pixel PXL, but pixels PXL may be substantially provided in the display area DA of the substrate SUB.

The non-display area NDA may be provided in at least one side of the display area DA. The non-display area NDA may enclose the perimeter (or edges) of the display area DA. The line component LP and a pad component PDP may be disposed in the non-display area NDA.

The line component LP may electrically connect the driver with the pixels PXL. The line component LP may include a fanout line electrically connected with signal lines, e.g., a scan line, a data line, and an emission control line, which are electrically connected to each pixel PXL to provide signals to the pixel PXL. Furthermore, the line component LP may be a fanout line electrically connected to signal lines, e.g., a control line and a sensing line, which are electrically connected to each pixel PXL to compensate in real time for a variation in electrical characteristics of the pixel PXL.

The pad component PDP may include pads PD. The pads PD may supply (or transmit) driving power voltages and signals for driving the pixels PXL and/or internal circuits provided in the display area DA. Each of the pads PD may be electrically connected to the corresponding fanout line of the line component LP to supply the driving power voltages and signals to the corresponding pixels PXL. The pads PD may be exposed to the outside and be electrically connected to the driver through a separate connector such as a conductive adhesive component.

The substrate SUB may include transparent insulating material to allow light transmission. The substrate SUB may be a rigid substrate or a flexible substrate.

One area in the substrate SUB may be provided as the display area DA in which the pixels PXL are disposed, and the other area thereof may be provided as the non-display area NDA. For example, the substrate SUB may include a display area DA including pixel areas in which the respective pixels PXL are disposed, and a non-display area NDA disposed around the perimeter of the display area DA (or adjacent to the display area DA).

The pixels PXL may be provided in the display area DA of the substrate SUB. In an embodiment, the pixels PXL may be arranged in the display area DA in a stripe arrangement manner, but the disclosure is not limited thereto.

Each of the pixels PXL may include at least one light emitting element LD configured to be driven in response to a corresponding scan signal and a corresponding data signal. The light emitting element LD may have a small size corresponding to the nanometer scale or the micrometer scale and be electrically connected in parallel to light emitting elements LD disposed adjacent thereto, but the disclosure is not limited thereto. The light emitting element LD may form a light source of each pixel PXL.

Each of the pixels PXL may include at least one light source, e.g., the light emitting element LD illustrated in FIGS. 1 to 3, which is driven by a predetermined signal (e.g., a scan signal and a data signal) and/or a predetermined power supply (e.g., a first driving power supply and a second driving power supply). However, the type of the light emitting element LD which may be used as a light source of each pixel PXL is not limited thereto.

Figure 5:
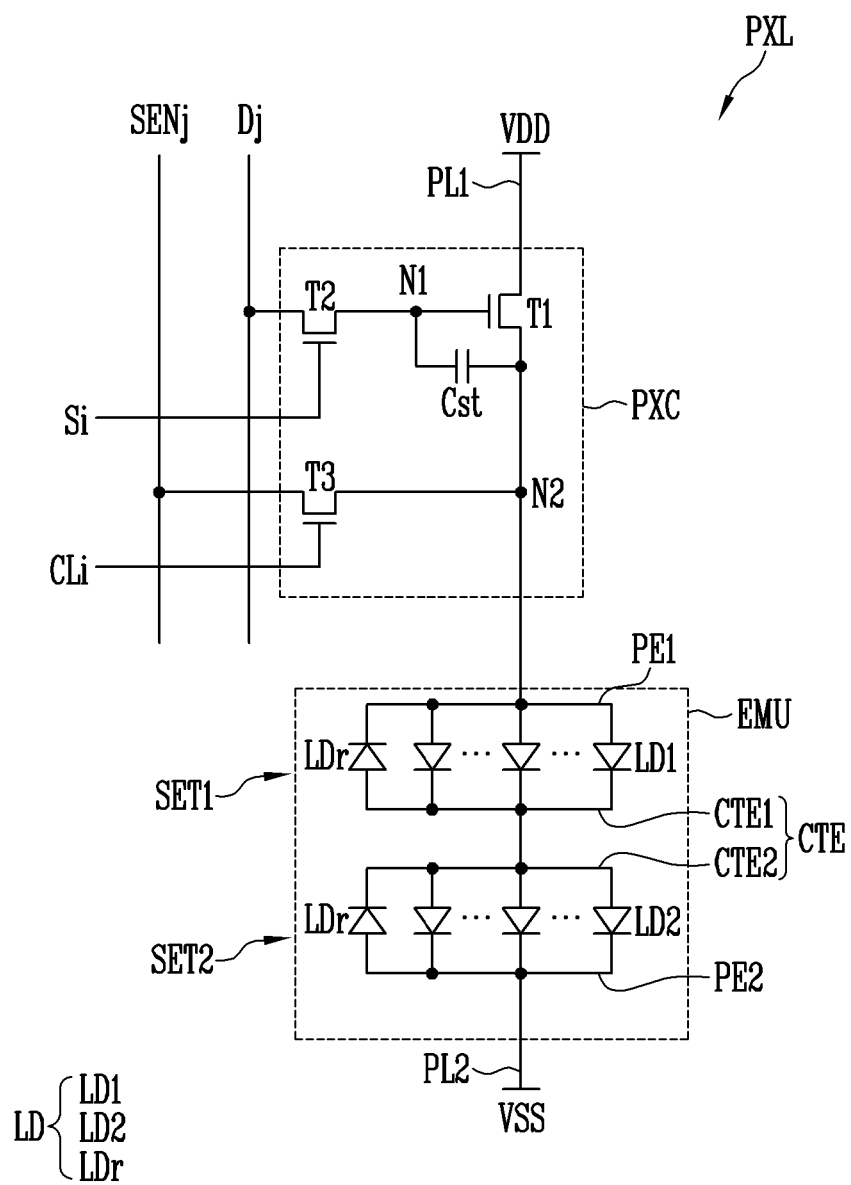
FIGS. 5 and 6 are schematic diagrams of equivalent circuits illustrating various embodiments of electrical connection relationship of components included in each pixel illustrated in FIG. 4.
Figure 6:
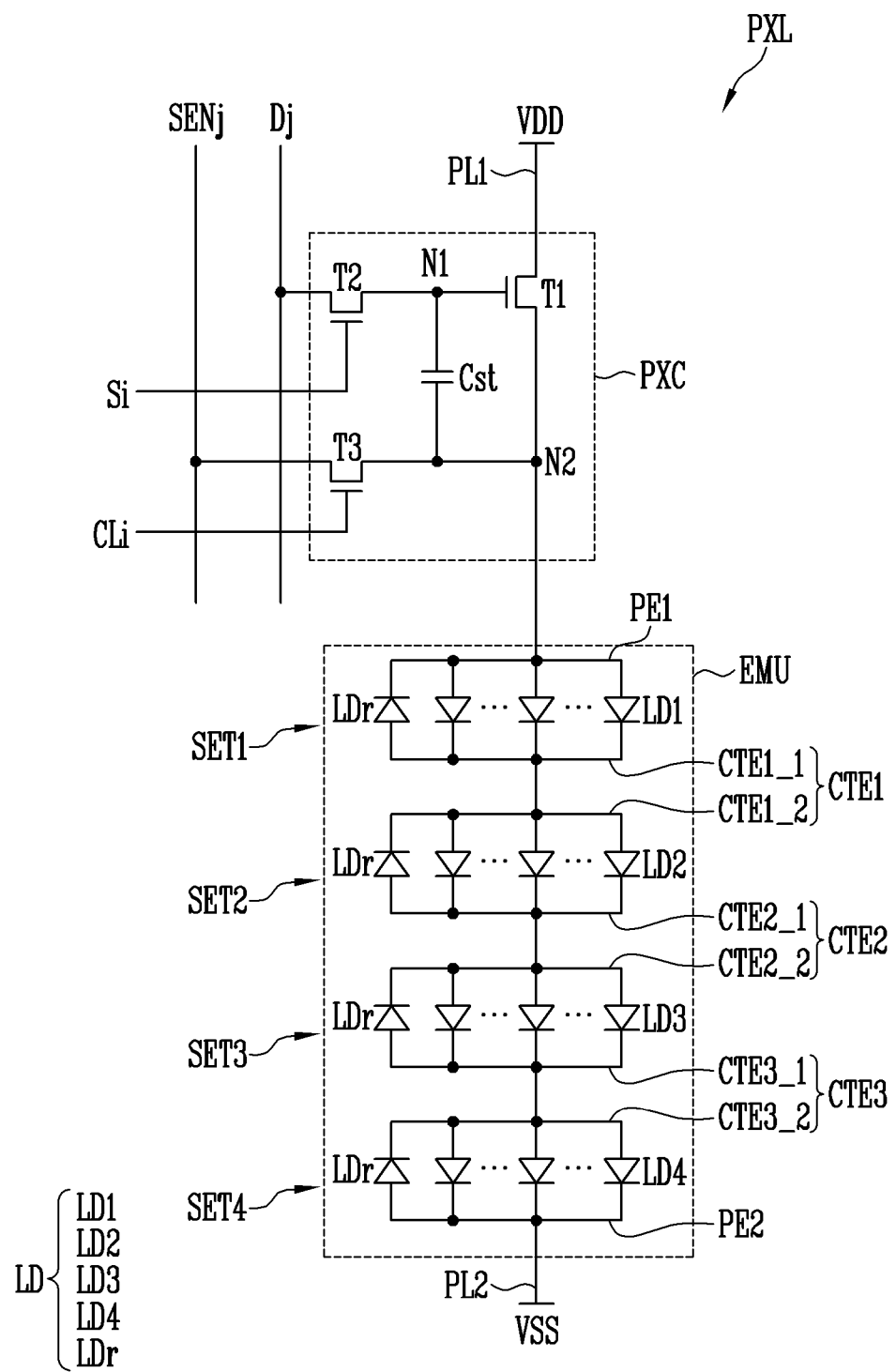

The driver may provide a predetermined signal and a power voltage to each of the pixels PXL through the pad component PDP and the line component LP and thus may control the operation of the pixel PXL. FIGS. 5 and 6 are schematic diagrams of equivalent circuits illustrating various embodiments of electrical connection relationship of components included in the pixel PXL illustrated in FIG. 4.

For example, FIGS. 5 and 6 illustrate various embodiments of the electrical connection relationship of components included in the pixel PXL that may be employed in an active matrix type display device. However, the types of the components included in the pixel PXL to which embodiments may be applied are not limited thereto.

As illustrated in FIGS. 5 and 6, not only the components included in the pixel PXL illustrated in FIG. 4 but also an area in which the components are provided may be referred to as "pixel PXL".

Referring to FIGS. 1 to 6, the pixel PXL may include an emission unit (or emission part) EMU (or referred to as "emitter") EMU configured to generate light having a luminance corresponding to a data signal. Furthermore, the pixel PXL may selectively further include a pixel circuit PXC configured to drive the emission part EMU.

In an embodiment, the emission part EMU may include light emitting elements LD electrically connected between a first power line PL1 which is electrically connected to a first driving power supply VDD and to which a voltage of the first driving power supply VDD is applied, and a second power line PL2 which is electrically connected to a second driving power supply VSS and to which a voltage of the second driving power supply VSS is applied. For example, the emission part EMU may include a first pixel electrode PE1 electrically connected to the first driving power supply VDD by the pixel circuit PXC and the first power line PL1, a second pixel electrode PE2 electrically connected to the second driving power supply VSS through the second power line PL2, and light emitting elements LD electrically connected in parallel to each other in a same direction between the first and second pixel electrodes PE1 and PE2. In an embodiment, the first pixel electrode PE1 may be an anode, and the second pixel electrode PE2 may be a cathode.

Each of the light emitting elements LD included in the emission part EMU may include one end electrically connected to the first driving power supply VDD by the first pixel electrode PE1, and a remaining end (or another end) electrically connected to the second driving power supply VSS through the second pixel electrode PE2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the pixel PXL.

As described above, the light emitting elements LD that are electrically connected in parallel to each other in the same direction (e.g., in a forward direction) between the first pixel electrode PE1 and the second pixel electrode PE2 to which the voltages of the different power supplies (or first and second driving power supplies VDD and VSS) are respectively supplied may form respective valid light sources.

The light emitting elements LD of the emission part EMU may emit light having a luminance corresponding to driving current supplied thereto through the pixel circuit PXC. For example, during each frame period, the pixel circuit PXC may supply driving current corresponding to a grayscale value of corresponding frame data to the emission part EMU. The driving current supplied to the emission part EMU may be divided into parts which flow into the respective light emitting elements LD. Hence, each of the light emitting elements LD may emit light having a luminance corresponding to current applied thereto, so that the emission part EMU may emit light having a luminance corresponding to the driving current.

Although there has been described the embodiment in which the opposite ends of the light emitting elements LD are electrically connected in the same direction between the first and second driving power supplies VDD and VSS, the disclosure is not limited thereto. In an embodiment, the emission part EMU may further include at least one invalid light source, e.g., a reverse light emitting element LDr, as well as the light emitting elements LD that form the respective valid light sources. The reverse light emitting element LDr, along with the light emitting elements LD that form the valid light sources, may be electrically connected in parallel to each other between the first and second pixel electrodes PE1 and PE1. The reverse light emitting element LDr may be electrically connected between the first and second pixel electrodes PE1 and PE2 in a direction opposite to that of the light emitting elements LD. Even if a predetermined driving voltage (e.g., a forward driving voltage) is applied between the first and second pixel electrodes PE1 and PE2, the reverse light emitting element LDr remains disabled. Hence, current substantially does not flow through the reverse light emitting element LDr.

The pixel circuit PXC may be electrically connected to a scan line Si and a data line Dj of the pixel PXL. The pixel circuit PXC may be electrically connected to a control line CLi and a sensing line SENj of the pixel PXL. For example, in case that the pixel PXL is disposed on an i-th row and a j-th column of the display area DA, the pixel circuit PXC of the pixel PXL may be electrically connected to an i-th scan line Si, a j-th data line Dj, an i-th control line CLi, and a j-th sensing line SENj of the display area DA.

The pixel circuit PXC may include first to third transistors T1 to T3 and a storage capacitor Cst.

The first transistor T1 may be a driving transistor that controls driving current to be applied to the emission part EMU and be electrically connected between the first driving power supply VDD and the emission part EMU. In detail, a first terminal of the first transistor T1 may be electrically connected (or coupled) to the first driving power supply VDD through the first power line PL1. A second terminal of the first transistor T1 may be electrically connected to a second node N2. A gate electrode of the first transistor T1 may be electrically connected to a first node N1. The first transistor T1 may control, in response to a voltage applied to the first node N1, the amount of driving current to be applied from the first driving power supply VDD to the emission part EMU through the second node N2. In an embodiment, the first terminal of the first transistor T1 may be a drain electrode, and the second terminal of the first transistor T1 may be a source electrode, and the disclosure is not limited thereto. In an embodiment, the first terminal may be a source electrode, and the second terminal may be a drain electrode.

The second transistor T2 may be a switching transistor which selects a pixel PXL in response to a scan signal and activates the pixel PXL, and may be electrically connected between the data line Dj and the first node N1. A first terminal of the second transistor T2 may be electrically connected to the data line Dj. A second terminal of the second transistor T2 may be electrically connected to the first node N1. A gate electrode of the second transistor T2 may be electrically connected to the scan line Si. The first terminal and the second terminal of the second transistor T2 are different from each other, and, for example, if the first terminal is a drain electrode, and the second terminal is a source electrode.

In case that a scan signal having a gate-on voltage (e.g., a high-level voltage) is supplied from the scan line Si, the second transistor T2 may be turned on to electrically connect the data line Dj with the first node N1. The first node N1 may be a point at which the second terminal of the second transistor T2 and the gate electrode of the first transistor T1 are electrically connected to each other. The second transistor T2 may transmit a data signal to the gate electrode of the first transistor T1.

The third transistor T3 may obtain a sensing signal through the sensing line SENj by electrically connecting the first transistor T1 to the sensing line SENj, and detect, using the sensing signal, characteristics of the pixel PXL such as a threshold voltage of the first transistor T1. Information about the characteristics of the pixel PXL may be used to convert image data such that a deviation in characteristic between pixels PXL may be compensated for. A second terminal of the transistor T3 may be electrically connected to the second terminal of the first transistor T1. A first terminal of the third transistor T3 may be electrically connected to the sensing line SENj. A gate electrode of the third transistor T3 may be electrically connected to the control line CLi. Furthermore, the first terminal of the third transistor T3 may be electrically connected to an initialization power supply. The third transistor T3 may be an initialization transistor configured to initialize the second node N2, and may be turned on in case that a sensing control signal is supplied thereto from the control line CLi, so that a voltage of the initialization power supply may be transmitted to the second node N2. Hence, a second storage electrode of the storage capacitor Cst electrically connected to the second node N2 may be initialized.

A first storage electrode of the storage capacitor Cst may be electrically connected to the first node N1. The second storage electrode of the storage capacitor Cst may be electrically connected to the second node N2. The storage capacitor Cst may be charged with a data voltage corresponding to a data signal to be supplied to the first node N1 during a frame period. Hence, the storage capacitor Cst may store a voltage corresponding to a difference between a voltage of the gate electrode of the first transistor T1 and a voltage of the second node N2.

The emission part EMU may include at least one serial set (or stage) including light emitting elements LD electrically connected in parallel to each other. For example, as illustrated in FIGS. 5 and 6, the emission part EMU may have a serial-parallel combination structure.

Referring to FIG. 5, the emission part EMU may include first and second serial sets SET1 and SET2 which are successively connected between the first and second driving power supplies VDD and VSS. Each of the first and second serial sets SET1 and SET2 may include two electrodes PE1 and CTE1, CTE2 and PE2 that form an electrode pair of the corresponding serial set, and light emitting elements LD electrically connected in parallel to each other in the same direction between the two electrodes PE1 and CTE1, CTE2 and PE2.

The first serial set (or the first stage) SET1 may include a first pixel electrode PE1, a first intermediate electrode CTE1, and at least one first light emitting element LD1 electrically connected between the first pixel electrode PE1 and the first intermediate electrode CTE1. Furthermore, the first serial set SET1 may include a reverse light emitting element LDr electrically connected between the first pixel electrode PE1 and the first intermediate electrode CTE1 in a direction opposite to that of the first light emitting element LD1.

The second serial set (or the second stage) SET2 may include a second intermediate electrode CTE2, a second pixel electrode PE2, and at least one second light emitting element LD2 electrically connected between the second intermediate electrode CTE2 and the second pixel electrode PE2. Furthermore, the second serial set SET2 may include a reverse light emitting element LDr electrically connected between the second intermediate electrode CTE2 and the second pixel electrode PE2 in a direction opposite to that of the second light emitting element LD2.

The first intermediate electrode CTE1 and the second intermediate electrode CTE2 may be electrically and/or physically connected with each other. The first intermediate electrode CTE1 and the second intermediate electrode CTE2 may form an intermediate electrode CTE that electrically connect the first serial set SET1 and the second serial set SET2 that are successively provided.

In the foregoing embodiment, the first pixel electrode PE1 of the first serial set SET1 may be an anode of each pixel PXL, and the second pixel electrode PE2 of the second serial set SET2 may be a cathode of the corresponding pixel PXL.

As described above, the emission part EMU of the pixel PXL including the serial sets SET1 and SET2 (e.g., first and second serial sets SET1 and SET2) (or the light emitting elements LD) electrically connected to each other in the serial-parallel combination structure may readily adjust driving current/voltage conditions in response to specifications of a product to which the emission part EMU is to be applied.

The emission part EMU of the pixel PXL including the serial sets SET1 and SET2 (or the light emitting elements LD) electrically connected to each other in the serial-parallel combination structure may reduce driving current, compared to that of the emission part EMU having a structure such that the light emitting elements LD are electrically connected only in parallel to each other. Furthermore, the emission part EMU of the pixel PXL including the serial sets SET1 and SET2 electrically connected to each other in the serial-parallel combination structure may reduce driving current to be applied to the opposite ends of the emission part EMU, compared to that of the emission part having a structure such that all of the light emitting elements LD, the number of which is the same as that of the emission unit EMU, are electrically connected in series to each other. The emission part EMU of the pixel PXL including the first and second serial sets SET1 and SET2 (or the light emitting elements LD) electrically connected to each other in the serial-parallel combination structure may include a greater number of light emitting elements LD included between the electrodes PE1, CTE1, CTE2, and PE2, compared to that of the emission part having a structure such that all of the serial sets (or stages) are electrically connected in series to each other. In this case, the light output efficiency of the light emitting elements LD may be enhanced. Even if a defect occurs in a specific serial set (or stage), the ratio of light emitting elements LD that may not emit light because of the defect may be reduced, so that a reduction in the light output efficiency of the light emitting elements LD may be mitigated.

Although in the foregoing embodiment the emission part EMU including the first serial set SET1 and the second serial set SET2 has been described, the disclosure is not limited thereto. In an embodiment, as illustrated in FIG. 6, the emission part EMU may include a first serial set SET1, a second serial set SET2, a third serial set SET3, and a fourth serial set SET4.

Referring to FIG. 6, the emission part EMU may include first to fourth serial sets SET1 and SET2 which are successively electrically connected to each other between the first and second driving power supplies VDD and VSS. Each of the first to fourth serial sets SET1, SET2, SET3, and SET4 may include two electrodes PE1 and CTE1_1, CTE1_2 and CTE2_1, CTE2_2 and CTE3_1, and CTE3_2 and PE2 that form an electrode pair of the corresponding serial set, and light emitting elements LD electrically connected in parallel to each other in a same direction between the two electrodes PE1 and CTE1_1, CTE1_2 and CTE2_1, CTE2_2 and CTE3_1, and CTE3_2 and PE2.

The first serial set (or the first stage) SET1 may include a first pixel electrode PE1, a 1-1-th intermediate electrode CTE1_1, and at least one first light emitting element LD1 electrically connected between the first pixel electrode PE1 and the 1-1-th intermediate electrode CTE1_1. Furthermore, the first serial set SET1 may include a reverse light emitting element LDr electrically connected between the first pixel electrode PE1 and the 1-1-th intermediate electrode CTE1_1 in a direction opposite to that of the first light emitting element LD1.

The second serial set (or the second stage) SET2 may include a 1-2-th intermediate electrode CTE1_2, a 2-1-th intermediate electrode CTE2_1, and at least one second light emitting element LD2 electrically connected between the 1-2-th intermediate electrode CTE1_2 and the 2-1-th intermediate electrode CTE2_1. Furthermore, the second serial set SET2 may include a reverse light emitting element LDr electrically connected between the 1-2-th intermediate electrode CTE1_2 and the 2-1-th intermediate electrode CTE2_1 in a direction opposite to that of the second light emitting element LD2.

The 1-1-th intermediate electrode CTE1_1 and the 1-2-th intermediate electrode CTE1_2 may be electrically and/or physically connected with each other. The 1-1-th intermediate electrode CTE1_1 and the 1-2-th intermediate electrode CTE1_2 may form a first intermediate electrode CTE1 that electrically connect the first serial set SET1 and the second serial set SET2 that are successively provided.

The third serial set (or the third stage) SET3 may include a 2-2-th intermediate electrode CTE2_2, a 3-1-th intermediate electrode CTE3_1, and at least one third light emitting element LD3 electrically connected between the 2-2-th intermediate electrode CTE2_2 and the 3-1-th intermediate electrode CTE3_1. Furthermore, the third serial set SET3 may include a reverse light emitting element LDr electrically connected between the 2-2-th intermediate electrode CTE2_2 and the 3-1-th intermediate electrode CTE3_1 in a direction opposite to that of the third light emitting element LD3.

The 2-1-th intermediate electrode CTE2_1 and the 2-2-th intermediate electrode CTE2_2 may be electrically and/or physically connected with each other. The 2-1-th intermediate electrode CTE2_1 and the 2-2-th intermediate electrode CTE2_2 may form a second intermediate electrode CTE2 that electrically connect the second serial set SET2 and the third serial set SET3 that are successively provided.

The fourth serial set (or the fourth stage) SET4 may include a 3-2-th intermediate electrode CTE3_2, a second pixel electrode PE2, and at least one fourth light emitting element LD4 electrically connected between the 3-2-th intermediate electrode CTE3_2 and the second pixel electrode PE2. Furthermore, the fourth serial set SET4 may include a reverse light emitting element LDr electrically connected between the 3-2-th intermediate electrode CTE3_2 and the second pixel electrode PE2 in a direction opposite to that of the fourth light emitting element LD4.

The 3-1-th intermediate electrode CTE3_1 and the 3-2-th intermediate electrode CTE3_2 may be electrically and/or physically connected with each other. The 3-1-th intermediate electrode CTE3_1 and the 3-2-th intermediate electrode CTE3_2 may form a third intermediate electrode CTE3 that electrically connect the third serial set SET3 and the fourth serial set SET4 that are successively provided.

In the foregoing embodiment, the first pixel electrode PE1 of the first serial set SET1 may be an anode of the emission part EMU, and the second pixel electrode PE2 of the fourth serial set SET4 may be a cathode of the emission part EMU.

Although FIGS. 5 and 6 illustrate an embodiment where all of the first to third transistors T1, T2, and T3 included in the pixel circuit PXC are formed of N-type transistors, the disclosure is not limited thereto. For example, at least one of the first to third transistors T1, T2, and T3 may be changed to a P-type transistor. Furthermore, although FIGS. 5 and 6 illustrate an embodiment where the emission part EMU is electrically connected between the pixel circuit PXC and the second driving power supply VSS, the emission part EMU may be electrically connected between the first driving power supply VDD and the pixel circuit PXC.

The structure of the pixel circuit PXC may be changed in various ways. For example, the pixel circuit PXC may further include at least one transistor element such as a transistor element configured to initialize the first node N1, and/or a transistor element configured to control an emission time of the light emitting elements LD, or other circuit elements such as a boosting capacitor for boosting the voltage of the first node N1.

The structure of the pixel PXL which may be applied to the disclosure is not limited to the embodiments illustrated in FIGS. 5 and 6, and the pixel PXL may have various structures. For example, the pixel PXL may be configured in a passive light emitting display device, or the like. In this case, the pixel circuit PXC may be omitted, and the opposite ends of the light emitting elements LD included in the emission part EMU may be directly electrically connected to the scan lines Si, the data linen Dj, the first power line PL1 to which a voltage of the first driving power supply VDD is to be applied, the second power line PL2 to which a voltage of the second driving power supply VSS is to be applied, and/or a control line.

Figure 7:
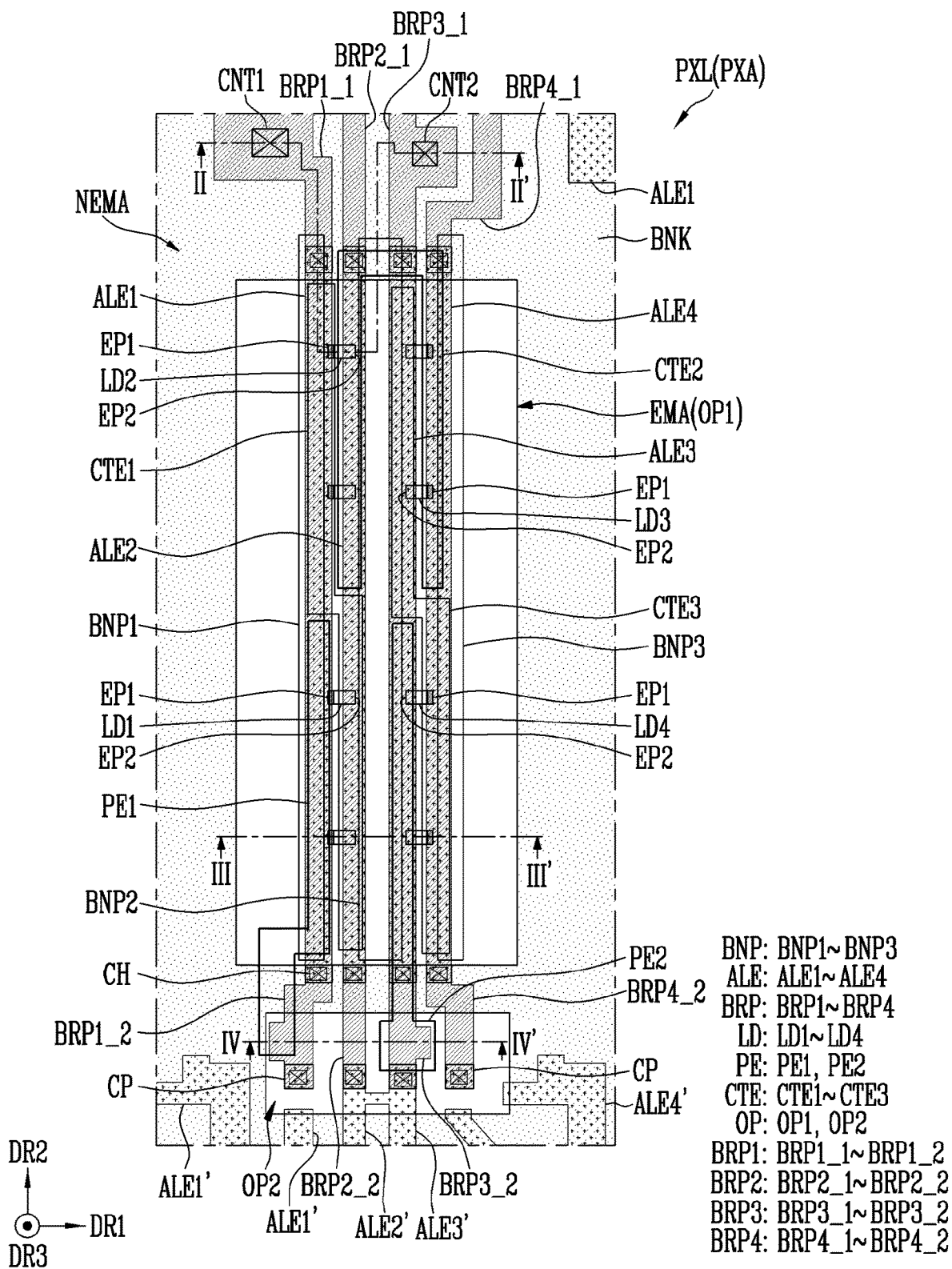
FIG. 7 is a plan view schematically illustrating each pixel illustrated in FIG. 4.
Figure 8:
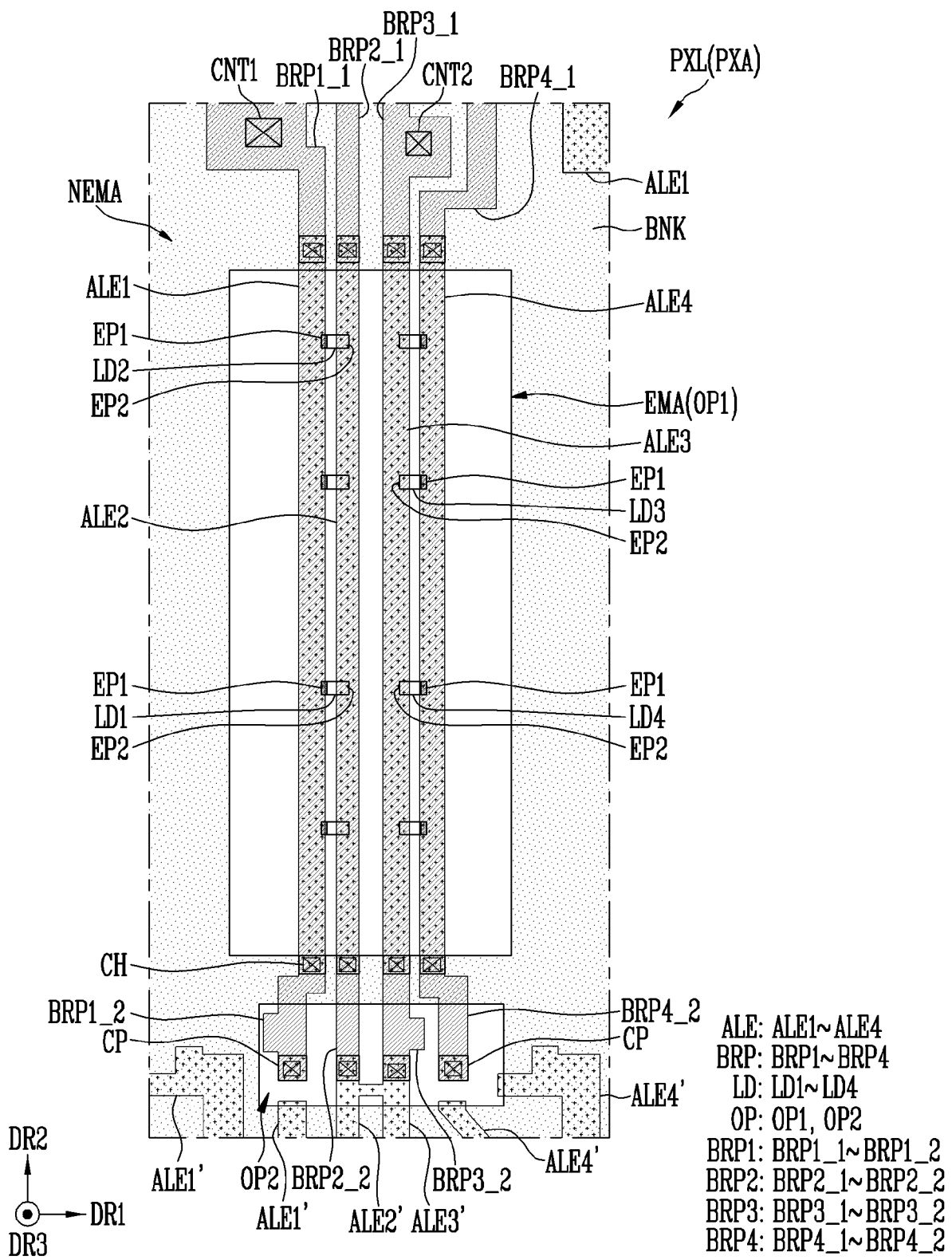
FIG. 8 is a plan view schematically illustrating only some components of the pixel of FIG. 7.

FIG. 7 is a plan view schematically illustrating each pixel PXL illustrated in FIG. 4. FIG. 8 is a plan view schematically illustrating only some components of the pixel PXL of FIG. 7.

In FIG. 7, for the sake of explanation, illustration of the transistors T electrically connected to the light emitting elements LD and the signal lines connected to the transistors T is omitted.

In an embodiment, for the sake of explanation, a transverse direction (or a horizontal direction) in a plan view is indicated by a first direction DR1, a longitudinal direction (or a vertical direction) in a plan view is indicated by a second direction DR2, and a thickness-wise direction of the substrate SUB is indicated by a third direction DR3. The first to third directions DR1, DR2, and DR3 may refer to the directions indicated by the first to third directions DR1, DR2, and DR3, respectively.

In an embodiment, the term "connection" between two components may electrical connection and physical connection, but the disclosure is not limited thereto.

Referring to FIGS. 4 and 6 to 8, the pixel PXL may be disposed in a pixel area PXA provided in the substrate SUB. The pixel area PXA may include an emission area EMA and a non-emission area NEMA.

The pixel PXL may include a bank BNK disposed in the non-emission area NEMA.

The bank BNK may be a structure for defining (or partitioning) the respective pixel areas PXA (or the respective emission areas EMA) of the pixel PXL and pixels PXL adjacent thereto and, for example, may be a pixel defining layer.

In an embodiment, the bank BNK may be a pixel defining layer or a dam structure for defining each emission area EMA to which the light emitting elements LD are to be supplied, during a process of supplying (or inputting) the light emitting elements LD to the pixel PXL. For example, since the emission area EMA of the pixel PXL is defined by the bank BNK, a mixed solution (e.g., ink) including a target amount and/or type of light emitting elements LD may be supplied (or input) to the emission area EMA.

The bank BNK may include at least one light shielding material and/or at least one reflective material, thus preventing a light leakage defect in which light (or rays) leaks between the pixel PXL and the pixels PXL adjacent thereto. In an embodiment, the bank BNK may include transparent material (or substance). The transparent material may include, for example, polyamides resin, polyimides resin, etc., but the disclosure is not limited thereto. In an embodiment, in order to enhance the efficiency of light emitted from the pixel PXL, a separate reflective material layer (or separate reflective layer) may be provided and/or formed on the bank BNK.

The bank BNK may include, in the pixel area PXA, at least one opening OP which expose components disposed thereunder. For example, the bank BNK may include a first opening OPN1 and a second opening OPN2 which expose components disposed under the bank BNK in the pixel area PXA. In an embodiment, the emission area EMA of the pixel PXL and the first opening OP1 of the bank BNK may correspond to each other.

In the pixel area PXA, the second opening OP2 may be disposed at a position spaced apart from the first opening OP1, and may be disposed adjacent to a side of the pixel area PXA, e.g., a lower side of the pixel area PXA In an embodiment, the second opening OP2 may be an electrode separation area where at least one alignment electrode ALE is separated from at least one alignment electrode ALE provided in pixels PXL adjacent thereto in the second direction DR2.

The pixel PXL may include pixel electrodes PE and intermediate electrodes CTE which are provided at least in the emission area EMA, light emitting elements LD electrically connected between the pixel electrodes PE and the intermediate electrodes CTE, bridge patterns BRP provided at least in the non-emission area NEMA, alignment electrodes ALE provided at positions corresponding to the pixel electrodes PE and the intermediate electrodes CTE, and bank patterns BNP (or patterns) provided under the alignment electrodes ALE such that each bank pattern BNP overlaps (in a plan view) at least one alignment electrode ALE. For example, the pixel PXL may include first and second pixel electrodes PE1 and PE2, first to third intermediate electrodes CTE1, CTE2, and CTE3, light emitting elements LD, first to fourth alignment electrodes ALE1, ALE2, ALE3, and ALE4, and first to third bank patterns BNP1, BNP2, and BNP3 which are provided at least in the emission area EMA, and include first to fourth bridge patterns BRP1, BRP2, BRP3, and BRP4 which are provided at least in the non-emission area NEMA.

The pixel PXL may include at least one pair of pixel electrodes PE, intermediate electrodes CTE, bridge patterns BRP, alignment electrodes ALE, and/or bank patterns BNP. The number, shape, size, arrangement structure, etc. of each of the pixel electrodes PE, the intermediate electrodes CTE, the bridge patterns BRP, the alignment electrodes ALE, and/or the bank patterns BNP may be changed in various ways depending on the structure of the pixel PXL (particularly, the emission part EMU).

In an embodiment, based on a surface of the substrate SUB on which the pixel PXL is provided, the bank patterns BNP, the alignment electrodes ALE, the bridge patterns BRP, the light emitting elements LD, the pixel electrodes PE, and/or the intermediate electrodes CTE may be provided in the order listed, but the disclosure is not limited thereto. The positions and formation sequence of the electrode patterns and/or insulating patterns (or layers) that form the pixel PXL may be changed in various ways depending on embodiments. A stacked structure of the pixel PXL will be described below with reference to FIGS. 9 to 15.

The bank patterns BNP may be provided at least in the emission area EMA, and be spaced apart from each other in the first direction DR1 in the emission area EMA, and each may extend in the second direction DR2.

Each bank pattern BNP (referred also to as "wall pattern", "protrusion pattern", "support patter", or "pattern") may have a uniform width in the emission area EA. For example, each of the first, second, and third bank patterns BNP1, BNP2, and BNP3 may have a bar-like shape having a constant width in the emission area EMA, in a plan view.

The bank patterns BNP may have the same width or may have different widths. For example, the first and third bank patterns BNP1 and BNP3 may have the same width at least in the emission area EMA, and face each other with the second bank pattern BNP2 interposed therebetween. For example, the first and third bank patterns BNP1 and BNP3 may be symmetrical with each other based on the second bank pattern BNP2 in the emission area EMA.

The bank patterns BNP may be arranged at regular intervals in the emission area EMA. For example, the first, second, and third bank patterns BNP1, BNP2, and BNP3 may be successively arranged in the emission area EA at intervals (e.g., regular intervals) in the first direction DR1.

Each of the first and third bank patterns BNP1 and BNP3 may partially overlap at least one alignment electrode ALE at least in the emission area EMA. For example, the first bank pattern BNP1 may be disposed under the first alignment electrode ALE1 to overlap an area of the first alignment electrode ALE1. The third bank pattern BNP3 may be disposed under the fourth alignment electrode ALE4 to overlap an area of the fourth alignment electrode ALE4.

The second bank pattern BNP2 may partially overlap the second and third alignment electrodes ALE2 and ALE3 at least in the emission area EMA. For example, the second bank pattern BNP2 may be provided under the second and third alignment electrodes ALE2 and ALE3 to overlap each of an area of the second alignment electrode ALE2 and an area of the third alignment electrode ALE3.

Since the bank patterns BNP are provided under an area of each of the alignment electrodes ALE, the area of each of the alignment electrodes ALE may protrude upward in the areas where the bank patterns BNP are formed. Consequently, a wall structure may be formed around the light emitting elements LD. For example, the wall structure may be formed in the emission area EMA and face first and second ends EP1 and EP2 of the light emitting elements LD.

In an embodiment, in case that the bank patterns BNP and/or the alignment electrodes ALE include reflective material, a reflective wall structure may be formed around the light emitting elements LD. Hence, light emitted from the light emitting elements LD may be oriented in an upward direction of the pixel PXL (e.g., in an image display direction of the display device), so that the light efficiency of the pixel PXL may be further improved.

The alignment electrodes ALE may be disposed at least in the emission area EMA, and be spaced apart from each other in the first direction DR1 in the emission area EMA, and each may extend in the second direction DR2. Furthermore, the alignment electrodes ALE may be separated from the alignment electrodes ALE of the pixels PXL that are adjacent to each other in the second direction DR2 by removing a portion thereof in the second opening OP2 of the bank BNK.

In an embodiment, the alignment electrodes ALE may include a first alignment electrode ALE1 (or a first alignment line), a second alignment electrode ALE2 (or a second alignment line), a third alignment electrode ALE3 (or a third alignment line), and a fourth alignment electrode ALE4 (or a fourth alignment line), which are arranged at positions spaced apart from each other in the first direction DR1.

The first alignment electrode ALE1 may be disposed on the first bank pattern BNP1 at least in the emission area EMA and overlap the first bank pattern BNP1. Furthermore, the first alignment electrode ALE1 may partially overlap a first bridge pattern BRP1 at least in the non-emission area NEMA. In an embodiment, the first alignment electrode ALE1 may be electrically connected with the first bridge pattern BRP1 through a contact hole CH (or a first contact hole CH) at least in the non-emission area NEMA. The first alignment electrode ALE1 may be electrically separated from a first alignment electrode ALE1' provided in each of the pixels PXL adjacent thereto in the second direction DR2, in the second opening OP2 (or the electrode separation area) of the bank BNK.

The second alignment electrode ALE2 may be disposed on a side of the second bank pattern BNP2 at least in the emission area EMA and partially overlap the second bank pattern BNP2. Furthermore, the second alignment electrode ALE2 may partially overlap the second bridge pattern BRP2 at least in the non-emission area NEMA. In an embodiment, the second alignment electrode ALE2 may be electrically connected with the second bridge pattern BRP2 through a contact hole CH (or a second contact hole CH) at least in the non-emission area NEMA. Furthermore, the second alignment electrode ALE2 may be electrically connected with a second alignment electrode ALE2' provided in the pixel PXL adjacent thereto in the second direction DR2, through the second bridge pattern BRP2, in the second opening OP2 (or the electrode separation area) of the bank BNK. The second alignment electrode ALE2' provided in the adjacent pixel PXL may be integrally provided with (or integral with) a third alignment electrode ALE3' provided in the corresponding pixel PXL and thus electrically and/or physically connected with the third alignment electrode ALE3'.

The third alignment electrode ALE3 may be disposed on another side of the second bank pattern BNP2 at least in the emission area EMA and partially overlap the second bank pattern BNP2. In an embodiment, the third alignment electrode ALE3 may be electrically connected with the third bridge pattern BRP3 through a contact hole CH (or a third contact hole CH) at least in the non-emission area NEMA. Furthermore, the third alignment electrode ALE3 may be electrically connected with the third alignment electrode ALE3' provided in the pixel PXL adjacent thereto in the second direction DR2, through the third bridge pattern BRP3, in the second opening OP2 (or the electrode separation area) of the bank BNK. The third alignment electrode ALE3' provided in the adjacent pixel PXL may be integral with the second alignment electrode ALE2' provided in the corresponding pixel PXL to thus be electrically and/or physically connected with the second alignment electrode ALE2'.

The fourth alignment electrode ALE4 may be disposed on the third bank pattern BNP3 at least in the emission area EMA and overlap the third bank pattern BNP3. Furthermore, the fourth alignment electrode ALE4 may be electrically connected with the fourth bridge pattern BRP4 through a contact hole CH (or a fourth contact hole CH) at least in the non-emission area NEMA. The fourth alignment electrode ALE4 may be electrically separated from a fourth alignment electrode ALE4' provided in each of the pixels PXL adjacent thereto in the second direction DR2, in the second opening OP2 (or the electrode separation area) of the bank BNK.

The bridge patterns BRP may be disposed at least in the non-emission area NEMA, and be spaced apart from each other in the first direction DR1 in the non-emission area NEMA, and each may extend in the second direction DR2. Furthermore, the bridge patterns BRP may be spaced apart from each other in the first direction DR1 in the opening OP2 (or the electrode separation area) of the bank BNK corresponding to one area of the non-emission area NEMA, and each may extend in the second direction DR2.

The bridge patterns BRP may include a first bridge pattern BRP1, a second bridge pattern BRP2, a third bridge pattern BRP3, and a fourth bridge pattern BRP4 which are spaced apart from each other in the first direction DR1 at least in the non-emission area NEMA.

The first bridge pattern BRP1 may partially overlap at least one alignment electrode ALE, e.g., the first alignment electrode ALE1, in the non-emission area NEMA, and be electrically connected with the first alignment electrode ALE1. The bridge pattern BRP1 may include a 1-1-th bridge pattern BRP1_1 and a 1-2-th bridge pattern BRP1_2 which are arranged in the second direction DR2 and electrically connected with each other.

The 1-1-th bridge pattern BRP1_1 may be disposed in an upper end of the non-emission area NEMA in a plan view, and partially overlap at least a portion of the first alignment electrode ALE1 in the non-emission area NEMA. For example, the 1-1-th bridge pattern BRP1_1 may be disposed on one end (e.g., an upper end) of the first alignment electrode ALE1 in the non-emission area NEMA and partially overlap the one end of the first alignment electrode ALE1. The 1-1-th bridge pattern BRP1_1 may be electrically connected with the first alignment electrode ALE1 through a corresponding contact hole CH in the non-emission area NEMA. The contact hole CH may be formed by removing a portion of at least one insulating layer disposed between the 1-1-th bridge pattern BRP1_1 and the one end of the first alignment electrode ALE1.

In an embodiment, the 1-1-th bridge pattern BRP1_1 may be electrically connected with a component of the pixel circuit PXC, e.g., the first transistor T1, through a first contact portion CNT1 in the upper end of the non-emission area NEMA. The first contact portion CNT1 may be formed by removing a portion of at least one insulating layer disposed between the 1-1-th bridge pattern BRP1_1 and the first transistor T1.

The 1-2-th bridge pattern BRP1_2 may be disposed in a lower end of the non-emission area NEMA in a plan view. The 1-2-th bridge pattern BRP1_2 may partially overlap at least a portion of the first alignment electrode ALE1 in the non-emission area NEMA. For example, the 1-2-th bridge pattern BRP1_2 may be disposed on a remaining end (or another end) (e.g., a lower end) of the first alignment electrode ALE1 in the non-emission area NEMA and partially overlap the remaining end of the first alignment electrode ALE1.

One end of the 1-2-th bridge pattern BRP1_2 may be electrically connected with the first alignment electrode ALE1 through a corresponding contact hole CH in the non-emission area NEMA. The contact hole CH may be formed by removing a portion of at least one insulating layer disposed between the 1-2-th bridge pattern BRP1_2 and the remaining end of the first alignment electrode ALE1.

A remaining end of the 1-2-th bridge pattern BRP1_2 may be electrically connected to a residual conductive pattern CP through a corresponding contact hole CH in the second opening OP2 of the bank BNK. The residual conductive pattern CP may not be removed during an electrode separation process (e.g., a process for blocking electrical connection between the first alignment electrode ALE1 and the first alignment electrode ALE1' provided in the adjacent pixel PXL that is adjacent thereto in the second direction DR2), and may be a portion of the first alignment electrode ALE1' provided in the adjacent pixel PXL that overlaps the 1-2-th bridge pattern BRP1_2.

In an embodiment, the 1-2-th bridge pattern BRP1_2 may directly contact the first pixel electrode PE1 in the second opening OP2 of the bank BNK and thus may be electrically connected with the first pixel electrode PE1.

The second bridge pattern BRP2 may partially overlap at least one alignment electrode ALE, e.g., the second alignment electrode ALE2, in the non-emission area NEMA, and be electrically connected with the second alignment electrode ALE2. The second bridge pattern BRP2 may include a 2-1-th bridge pattern BRP2_1 and a 2-2-th bridge pattern BRP2_2 which are arranged in the second direction DR2 and electrically connected with each other.

The 2-1-th bridge pattern BRP2_1 may be disposed in the upper end of the non-emission area NEMA in a plan view, and be spaced apart from the 1-1-th bridge pattern BRP1_1 in the first direction DR1. The 2-1-th bridge pattern BRP2_1 may partially overlap at least a portion of the second alignment electrode ALE2 in the non-emission area NEMA. For example, the 2-1-th bridge pattern BRP2_1 may be disposed on one end (e.g., an upper end) of the second alignment electrode ALE2 in the non-emission area NEMA and partially overlap the one end of the second alignment electrode ALE2. The 2-1-th bridge pattern BRP2_1 may be electrically connected with the second alignment electrode ALE2 through a corresponding contact hole CH in the non-emission area NEMA. The contact hole CH may be formed by removing a portion of at least one insulating layer disposed between the 2-1-th bridge pattern BRP2_1 and the one end of the second alignment electrode ALE2.

The 2-2-th bridge pattern BRP2_2 may be disposed in the lower end of the non-emission area NEMA in a plan view, and be spaced apart from the 1-2-th bridge pattern BRP1_2 in the first direction DR1. The 2-2-th bridge pattern BRP2_2 may partially overlap at least a portion of the second alignment electrode ALE2 in the non-emission area NEMA. For example, the 2-2-th bridge pattern BRP2_2 may be disposed on a remaining end (or another end) (e.g., a lower end) of the second alignment electrode ALE2 in the non-emission area NEMA and partially overlap the remaining end of the second alignment electrode ALE2.

One end of the 2-2-th bridge pattern BRP2_2 may be electrically connected with the second alignment electrode ALE2 through a corresponding contact hole CH in the non-emission area NEMA. The contact hole CH may be formed by removing a portion of at least one insulating layer disposed between the 2-2-th bridge pattern BRP2_2 and the remaining end of the second alignment electrode ALE2.

In an embodiment, the 2-2-th bridge pattern BRP2_2 may be electrically connected with the second alignment electrode ALE2' of the pixel PXL adjacent thereto in the second direction DR2 through a corresponding contact hole CH in the second opening OP2 of the bank BNK.

The third bridge pattern BRP3 may partially overlap at least one alignment electrode ALE, e.g., the third alignment electrode ALE3, in the non-emission area NEMA, and be electrically connected with the third alignment electrode ALE3. The third bridge pattern BRP3 may include a 3-1-th bridge pattern BRP3_1 and a 3-2-th bridge pattern BRP3_2 which are arranged in the second direction DR2 and electrically connected with each other.

The 3-1-th bridge pattern BRP3_1 may be disposed in the upper end of the non-emission area NEMA in a plan view, and be spaced apart from the 2-1-th bridge pattern BRP2_1 in the first direction DR1 in the non-emission area NEMA. The 3-1-th bridge pattern BRP3_1 may partially overlap at least a portion of the third alignment electrode ALE3 in the non-emission area NEMA. For example, the 3-1-th bridge pattern BRP3_1 may be disposed on one end (e.g., an upper end) of the third alignment electrode ALE3 in the non-emission area NEMA and partially overlap the one end of the third alignment electrode ALE3. The 3-1-th bridge pattern BRP3_1 may be electrically connected with the third alignment electrode ALE3 through a corresponding contact hole CH in the non-emission area NEMA. The contact hole CH may be formed by removing a portion of at least one insulating layer disposed between the 3-1-th bridge pattern BRP3_1 and the one end of the third alignment electrode ALE3.

In an embodiment, the 3-1-th bridge pattern BRP3_1 may be electrically connected with a component of the pixel circuit PXC, e.g., the second power line PL2, through a second contact portion CNT2 in the upper end of the non-emission area NEMA. The second contact portion CNT2 may be formed by removing a portion of at least one insulating layer disposed between the 3-1-th bridge pattern BRP3_1 and the second power line PL2.

The 3-2-th bridge pattern BRP3_2 may be disposed in the lower end of the non-emission area NEMA in a plan view, and be spaced apart from the 2-2-th bridge pattern BRP2_2 in the first direction DR1. The 3-2-th bridge pattern BRP3_2 may partially overlap at least a portion of the third alignment electrode ALE3 in the non-emission area NEMA. For example, the 3-2-th bridge pattern BRP3_2 may be disposed on a remaining end (or another end) (e.g., a lower end) of the third alignment electrode ALE3 in the non-emission area NEMA and partially overlap the remaining end of the third alignment electrode ALE3. The 3-2-th bridge pattern BRP3_2 may be electrically connected with the third alignment electrode ALE3 through a corresponding contact hole CH in the non-emission area NEMA. The contact hole CH may be formed by removing a portion of at least one insulating layer disposed between the 3-2-th bridge pattern BRP3_2 and the remaining end of the third alignment electrode ALE3.

In an embodiment, the 3-2-th bridge pattern BRP3_2 may directly contact the second pixel electrode PE2 in the second opening OP2 of the bank BNK and thus may be electrically connected with the second pixel electrode PE2. The 3-2-th bridge pattern BRP3_2 may be electrically connected with the third alignment electrode ALE3' provided in the pixel PXL adjacent thereto in the second direction DR2 through a corresponding contact hole CH in the second opening OP2 of the bank BNK.

The fourth bridge pattern BRP4 may partially overlap at least one alignment electrode ALE, e.g., the fourth alignment electrode ALE4, in the non-emission area NEMA, and be electrically connected with the fourth alignment electrode ALE4. The fourth bridge pattern BRP4 may include a 4-1-th bridge pattern BRP4_1 and a 4-2-th bridge pattern BRP4_2 which are arranged in the second direction DR2 and electrically connected with each other.

The 4-1-th bridge pattern BRP4_1 may be disposed in the upper end of the non-emission area NEMA in a plan view, and be spaced apart from the 3-1-th bridge pattern BRP3_1 in the first direction DR1. The 4-1-th bridge pattern BRP4_1 may partially overlap at least a portion of the fourth alignment electrode ALE4 in the non-emission area NEMA. For example, the 4-1-th bridge pattern BRP4_1 may be disposed on one end (e.g., an upper end) of the fourth alignment electrode ALE4 in the non-emission area NEMA and partially overlap the one end of the fourth alignment electrode ALE4. The 4-1-th bridge pattern BRP4_1 may be electrically connected with the fourth alignment electrode ALE4 through a corresponding contact hole CH in the non-emission area NEMA. The contact hole CH may be formed by removing a portion of at least one insulating layer disposed between the 4-1-th bridge pattern BRP4_1 and the one end of the fourth alignment electrode ALE4.

The 4-2-th bridge pattern BRP4_2 may be disposed in the lower end of the non-emission area NEMA in a plan view, and be spaced apart from the 3-2-th bridge pattern BRP3_2 in the first direction DR1. The 4-2-th bridge pattern BRP4_2 may partially overlap at least a portion of the fourth alignment electrode ALE4 in the non-emission area NEMA. For example, the 4-2-th bridge pattern BRP4_2 may be disposed on a remaining end (or another end) (e.g., a lower end) of the fourth alignment electrode ALE4 in the non-emission area NEMA and partially overlap the remaining end of the fourth alignment electrode ALE4.

One end of the 4-2-th bridge pattern BRP4_2 may be electrically connected with the fourth alignment electrode ALE4 through a corresponding contact hole CH in the non-emission area NEMA. The contact hole CH may be formed by removing a portion of at least one insulating layer disposed between the 4-2-th bridge pattern BRP4_2 and the remaining end of the fourth alignment electrode ALE4.

The remaining end of the 4-2-th bridge pattern BRP4_2 may be electrically connected to a residual conductive pattern CP through a corresponding contact hole CH in the second opening OP2 of the bank BNK. The residual conductive pattern CP may not be removed during an electrode separation process (e.g., a process for blocking electrical connection between the fourth alignment electrode ALE4 and the fourth alignment electrode ALE4' provided in the adjacent pixel PXL that is adjacent thereto in the second direction DR2), and may be a portion of the fourth alignment electrode ALE4' provided in the adjacent pixel PXL that overlaps the 4-2-th bridge pattern BRP4_2.

One of the alignment electrodes ALE and the bridge patterns BRP or the other one may be electrically connected to the pixel circuit PXC of the corresponding pixel PXL and/or a power line through a corresponding contact portion. For example, the first alignment electrode ALE1 and/or the first bridge pattern BRP1 may be electrically connected to the pixel circuit PXC and/or the first power line PL1 through the first contact portion CNT1. The third alignment electrode ALE3 and/or the third bridge pattern BRP3 may be electrically connected to the second power line PL2 through the second contact portion CNT2.

In an embodiment, the first contact portion CNT1 and the second contact portion CNT2 may be disposed in the non-emission area NEMA and overlap the bank BNK. In an embodiment, the first contact portion CNT1 may allow some components of the pixel circuit PXC to be exposed to the outside, and the second contact portion CNT2 may allow the second power line PL2 to be exposed to the outside.

A pair of alignment electrodes ALE adjacent to each other may be supplied with different signals through the bridge patterns BRP at the step of aligning the light emitting elements LD and be spaced apart from each other by a uniform distance in the emission area EMA. Furthermore, in case that at least two pairs of alignment electrodes ALE are provided in the emission area EMA, each pair of alignment elements ALE may be spaced apart from each other by the same distance.

The first and second alignment electrodes ALE1 and ALE2 may form a pair and be supplied with different alignment signals, and the third and fourth alignment electrodes ALE3 and ALE4 may form a pair and be supplied with different alignment signals. In this case, in the emission area EMA, the first and second alignment electrodes ALE1 and ALE2 may be spaced apart from each other by a predetermined distance in the first direction DR1, and the third and fourth alignment electrodes ALE3 and ALE4 may also be spaced apart from each other by a predetermined distance in the first direction DR1.

At the step of aligning the light emitting elements LD, the first alignment electrode ALE1 may be electrically connected, through the first bridge pattern BRP1, with the first alignment electrode ALE1' disposed in the adjacent pixel PXL that is adjacent thereto in the second direction DR2. The second alignment electrode ALE2 may be electrically connected, through the second bridge pattern BRP2, with the second alignment electrodes ALE2' disposed in the adjacent pixel PXL that is adjacent thereto in the second direction DR2. The third alignment electrode ALE3 may be electrically connected, through the third bridge pattern BRP3, with the third alignment electrodes ALE3' disposed in the adjacent pixel PXL that is adjacent thereto in the second direction DR2. The fourth alignment electrode ALE4 may be electrically connected, through the fourth bridge pattern BRP4, with the fourth alignment electrodes ALE4' disposed in the adjacent pixel PXL that is adjacent thereto in the second direction DR2.

The second and third alignment electrodes ALE2 and ALE3 may be supplied with the same signal at the step of aligning the light emitting elements LD. The second and third alignment electrodes ALE2 and ALE3 may be integrally or non-integrally electrically connected to each other at the step of aligning the light emitting elements LD.

The foregoing alignment signals may be signals having a voltage difference and/or a phase difference to align the light emitting elements LD between the alignment electrodes ALE. At least one of the alignment signals may be an AC signal (or voltage), but the disclosure is not limited thereto.

Some components of the pixel circuit PXC an area of which is exposed through the first contact portion CNT1 may directly contact and be electrically connected to the 1-1-th bridge pattern BRP1_1 disposed over the first contact portion CNT1. Hence, the first alignment electrode ALE1 that is electrically connected with the 1-1-th bridge pattern BRP1_1 through a corresponding contact hole CH may be electrically connected with some components of the pixel circuit PXC. Furthermore, the first alignment electrode ALE1 may be electrically connected with the 1-2-th bridge pattern BRP1_2 through a corresponding contact hole CH. The 1-2-th bridge pattern BRP1_2 may be electrically connected with the first pixel electrode PE1 that is directly disposed thereon. Therefore, the some components of the pixel circuit PXC, the 1-1-th bridge pattern BRP1_1, the first alignment electrode ALE1, the 1-2-th bridge pattern BRP1_2, and the first pixel electrode PE1 may be electrically connected with each other. In an embodiment, the first alignment electrode ALE1 may be electrically connected with the some components of the pixel circuit PXC through the first contact portion CNT1 and the 1-1-th bridge pattern BRP1_1, and may be electrically connected with the first pixel electrode PE1 through the 1-2-th bridge pattern BRP1_2.

The second power line PL2 an area of which is exposed through the second contact portion CNT2 may directly contact and be electrically connected to the 3-1-th bridge pattern BRP3_1 disposed over the second contact portion CNT2. Hence, the third alignment electrode ALE3 that is electrically connected with the 3-1-th bridge pattern BRP3_1 through a corresponding contact hole CH may be electrically connected with the second power line PL2. Furthermore, the third alignment electrode ALE3 may be electrically connected with the 3-2-th bridge pattern BRP3_2 through a corresponding contact hole CH. The 3-2-th bridge pattern BRP3_2 may be electrically connected with the second pixel electrode PE2 that is directly disposed thereon. Therefore, the second power line PL2, the 3-1-th bridge pattern BRP3_1, the third alignment electrode ALE3, the 3-2-th bridge pattern BRP3_2, and the second pixel electrode PE2 may be electrically connected with each other. In an embodiment, the third alignment electrode ALE3 may be electrically connected with the second power line PL2 through the second contact portion CNT2 and the 3-1-th bridge pattern BRP3_1, and may be electrically connected with the second pixel electrode PE2 through the 3-2-th bridge pattern BRP3_2.

Although at least two to several tens of light emitting elements LD may be aligned with each other and/or provided in the emission area EMA (or the pixel area PXA), the number of light emitting elements LD is not limited thereto. In an embodiment, the number of light emitting elements LD aligned with each other and/or provided in the emission area EMA (or the pixel area PXA) may be changed in various ways.

The light emitting elements LD may include a first light emitting element LD1, a second light emitting element LD2, a third light emitting element LD3, and a fourth light emitting element LD4.

The first light emitting element LD1 may be aligned between the first alignment electrode ALE1 and the second alignment electrode ALE2 and may be electrically connected between the first pixel electrode PE1 and the first intermediate electrode CTE1. The second light emitting element LD2 may be aligned between the first alignment electrode ALE1 and the second alignment electrode ALE2 and may be electrically connected between the first intermediate electrode CTE1 and the second intermediate electrode CTE2. In a plan view, the first light emitting element LD1 may be aligned in a lower end of an area between the first alignment electrode ALE1 and the second alignment electrode ALE2, and the second light emitting element LD2 may be aligned in an upper end of the area.

In an embodiment, first light emitting elements LD1 and second light emitting elements LD2 may be provided. The first end EP1 of each of the first light emitting elements LD1 may be electrically connected to the first pixel electrode PE1. The second end EP2 of each of the first light emitting elements LD1 may be electrically connected to the first intermediate electrode CTE1. The first end EP1 of each of the second light emitting elements LD2 may be electrically connected to the first intermediate electrode CTE1. The second end EP2 of each of the second light emitting elements LD2 may be electrically connected to the second intermediate electrode CTE2.

The third light emitting element LD3 may be aligned between the third alignment electrode ALE3 and the fourth alignment electrode ALE4 and electrically connected between the second intermediate electrode CTE2 and the third intermediate electrode CTE3. The fourth light emitting element LD4 may be aligned between the third alignment electrode ALE3 and the fourth alignment electrode ALE4 and electrically connected between the third intermediate electrode CTE3 and the second pixel electrode PE2. In a plan view, the third light emitting element LD3 may be aligned in an upper end of an area between the third alignment electrode ALE3 and the fourth alignment electrode ALE4, and the fourth light emitting element LD4 may be aligned in a lower end of the area.

In an embodiment, third light emitting elements LD3 and fourth light emitting elements LD4 may be provided. The first end EP1 of each of the third light emitting elements LD3 may be electrically connected to the second intermediate electrode CTE2. The second end EP2 of each of the third light emitting elements LD3 may be electrically connected to the third intermediate electrode CTE3. The first end EP1 of each of the fourth light emitting elements LD4 may be electrically connected to the third intermediate electrode CTE3. The second end EP2 of each of the fourth light emitting elements LD4 may be electrically connected to the second pixel electrode PE2.

As described above, the first light emitting elements LD1 may be disposed in a lower left end of the emission area EMA, the second light emitting elements LD2 may be disposed in an upper left end of the emission area EMA, the third light emitting elements LD3 may be disposed in an upper right end of the emission area EMA, and the fourth light emitting elements LD4 may be disposed in a lower right end of the emission area EMA. The arrangement and/or connection structure of the light emitting elements LD is not limited to the foregoing embodiment. In an embodiment, the arrangement and/or connection structure of the light emitting elements LD may be changed in various ways depending on components included in the emission part EMU and/or the number of serial sets (or stages).

The first light emitting elements LD1 may be electrically connected in parallel with each other between the first pixel electrode PE1 and the first intermediate electrode CTE1, and form the first serial stage SET1. The second light emitting elements LD2 may be electrically connected in parallel with each other between the first intermediate electrode CTE1 and the second intermediate electrode CTE2, and form the second serial stage SET2. The third light emitting elements LD3 may be electrically connected in parallel with each other between the second intermediate electrode CTE2 and the third intermediate electrode CTE3, and form the third serial stage SET3. The fourth light emitting elements LD4 may be electrically connected in parallel with each other between the third intermediate electrode CTE3 and the second pixel electrode PE2, and form the fourth serial stage SET4.

In an embodiment, the first light emitting elements LD1, the second light emitting elements LD2, the third light emitting elements LD3, and the fourth light emitting elements LD4 each may be a light emitting diode which is made of material having an inorganic crystal structure and has a subminiature size, e.g., ranging from the nanometer scale to the micrometer scale. For example, the first light emitting element LD1, the second light emitting element LD2, the third light emitting element LD3, and the fourth light emitting element LD4 each may be the light emitting element LD described with reference to FIGS. 1 to 3.

The pixel electrodes (or the electrodes) PE and the intermediate electrodes CTE may be provided at least in the emission area EMA, and each may be provided at a position corresponding to at least one alignment electrode ALE and at least one light emitting element LD. For example, each pixel electrode PE and each intermediate electrode CTE may be formed on the corresponding alignment electrodes ALE and the corresponding light emitting elements LD to overlap the alignment electrodes ALE and the light emitting elements LD, and thus may be electrically connected to at least the light emitting elements LD.

The first pixel electrode (or first electrode) PE1 may be formed on an area (e.g., a lower area) of the first alignment electrode ALE1 and the respective first ends EP1 of the first light emitting elements LD1, and thus may be electrically connected to the respective first ends EP1 of the first light emitting elements LD1.

The second pixel electrode (or second electrode) PE2 may be formed on an area (e.g., a lower area) of the third alignment electrode ALE3 and the respective second ends EP2 of the fourth light emitting elements LD4, and thus may be electrically connected to the respective second ends EP2 of the fourth light emitting elements LD4. Furthermore, the second pixel electrode PE2 may be electrically connected to the first, second, and third light emitting elements LD1, LD2, and LD3 via at least one intermediate electrode CTE and/or the light emitting elements LD. For example, the second pixel electrode PE2 may be electrically connected to the second end EP2 of each first light emitting element LD1 via the first intermediate electrode CTE1, the second light emitting element LD2, the second intermediate electrode CTE2, the third light emitting element LD3, the third intermediate electrode CTE3, and the fourth light emitting element LD4.

The first intermediate electrode CTE1 may be formed on an area (e.g., a lower area) of the second alignment electrode ALE2 and the respective second ends EP2 of the first light emitting elements LD1, and thus may be electrically connected to the second end EP2 of each first light emitting element LD1. Furthermore, the first intermediate electrode CTE1 may be formed on another area (e.g., an upper area) of the first alignment electrode ALE1 and the respective first ends EP1 of the second light emitting elements LD2, and thus may be electrically connected to the first end EP1 of each second light emitting element LD2. The first intermediate electrode CTE1 may be a first connection electrode configured to connect the first serial set SET1 (or the first light emitting elements LD1) and the second serial set SET2 (or the second light emitting elements LD2).

To this end, the first intermediate electrode CTE1 may be bent at least one or more times. For example, the first intermediate electrode CTE1 may be bent, folded, or curved at least one or more times in an area (or a boundary) between an area where at least one first light emitting element LD1 is disposed and an area where at least one second light emitting element LD2 is disposed, but the disclosure is not limited thereto. In an embodiment, the first intermediate electrode CTE1 may be changed in various shapes, so long as the first intermediate electrode CTE1 may reliably connect the first serial set SET1 and the second serial set SET2 that are successively provided.

The first intermediate electrode CTE1 may be disposed between the first pixel electrode PE1 and the second pixel electrode PE2 and may be electrically connected between the first pixel electrode PE1 and the second pixel electrode PE2 through the light emitting elements LD. For example, the first intermediate electrode CTE1 may be electrically connected to the first pixel electrode PE1 through at least one first light emitting element LD1, and be electrically connected to the second pixel electrode PE2 through at least one second, third, and/or fourth light emitting element LD2, LD3, and/or LD4.

The second intermediate electrode CTE2 may be formed on another area (e.g., an upper area) of the second alignment electrode ALE2 and the respective second ends EP2 of the second light emitting elements LD2, and thus may be electrically connected to the second end EP2 of each second light emitting element LD2. Furthermore, the second intermediate electrode CTE2 may be formed on an area (e.g., an upper area) of the fourth alignment electrode ALE4 and the respective first ends EP1 of the third light emitting elements LD3, and thus may be electrically connected to the first end EP1 of each third light emitting element LD3. For example, the second intermediate electrode CTE2 may be electrically connected, in the emission area EMA, to the respective second ends EP2 of the second light emitting elements LD2 and the respective first ends EP1 of the third light emitting elements LD3. The second intermediate electrode CTE2 may be a second connection electrode configured to connect the second serial set SET2 (or the second light emitting elements LD2) and the third serial set SET3 (or the third light emitting elements LD3).

To this end, the second intermediate electrode CTE2 may be bent at least one or more times. For example, the second intermediate electrode CTE2 may have a bent, folded, or curved shape in or around a boundary (or an area) between an area where at least one second light emitting element LD2 is disposed and an area where at least one third light emitting element LD3 is disposed, but the disclosure is not limited thereto. In an embodiment, the second intermediate electrode CTE2 may be changed in various shapes, so long as the second intermediate electrode CTE2 may reliably electrically connect the second serial set SET2 and the third serial set SET3 that are successively provided. In an embodiment, the second intermediate electrode CTE2 may be disposed only in the emission area EMA rather than extending into the non-emission area NEMA, but the disclosure is not limited thereto.

Furthermore, the second intermediate electrode CTE2 may be electrically connected between the first and second pixel electrodes PE1 and PE2 through the light emitting elements LD. For example, the second intermediate electrode CTE2 may be electrically connected to the first pixel electrode PE1 through at least one first and/or second light emitting element LD1 and/or LD2, and connected to the second pixel electrode PE2 through at least one third and/or fourth light emitting element LD3 and/or LD4.

The third intermediate electrode CTE3 may be formed on another area (e.g., an upper area) of the third alignment electrode ALE3 and the respective second ends EP2 of the third light emitting elements LD3, and thus may be electrically connected to the second end EP2 of each third light emitting element LD3. Furthermore, the third intermediate electrode CTE3 may be formed on another area (e.g., a lower area) of the fourth alignment electrode ALE4 and the respective first ends EP1 of the fourth light emitting elements LD4, and thus may be electrically connected to the first end EP1 of each fourth light emitting element LD4. For example, the third intermediate electrode CTE3 may be electrically connected, in the emission area EMA, to the respective second ends EP2 of the third light emitting elements LD3 and the respective first ends EP1 of the fourth light emitting elements LD4. The third intermediate electrode CTE3 may be a third connection electrode that electrically connects the third serial set SET3 (or the third light emitting elements LD3) and the fourth serial set SET4 (or the fourth light emitting elements LD4).

To this end, the third intermediate electrode CTE3 may be bent at least one or more times. For example, the third intermediate electrode CTE3 may be bent, folded, or curved in an area (or a boundary) between an area where at least one third light emitting element LD3 is disposed and an area where at least one fourth light emitting element LD4 is disposed, but the disclosure is not limited thereto. In an embodiment, the third intermediate electrode CTE3 may be changed in various shapes, so long as the third intermediate electrode CTE3 may reliably electrically connect the third serial set SET3 and the fourth serial set SET4 that are successively provided.

Furthermore, the third intermediate electrode CTE3 may be electrically connected between the first pixel electrode PE1 and the second pixel electrode PE2 through the light emitting elements LD. For example, the third intermediate electrode CTE3 may be electrically connected to the first pixel electrode PE1 through at least one first, second, and/or third light emitting element LD1, LD2, and/or LD3, and electrically connected to the second pixel electrode PE2 through at least one fourth light emitting element LD4.

As described above, the first light emitting element LD1 may be electrically connected in series to the second light emitting element LD2 through the first intermediate electrode CTE1. The second light emitting element LD2 may be electrically connected in series to the third light emitting element LD3 through the second intermediate electrode CTE2. The third light emitting element LD3 may be electrically connected in series to the fourth light emitting element LD4 through the third intermediate electrode CTE3.

In the pixel PXL during each frame period, driving current may flow from the first pixel electrode PE1 to the second pixel electrode PE2 via the first light emitting element LD1, the first intermediate electrode CTE1, the second light emitting element LD2, the second intermediate electrode CTE2, the third light emitting element LD3, the third intermediate electrode CTE3, and the fourth light emitting element LD4.

The first light emitting element LD1, the second light emitting element LD2, the third light emitting element LD3, and the fourth light emitting element LD4 may be electrically connected in series between first pixel electrode PE1 and the second pixel electrode PE2 through the first intermediate electrode CTE1, the second intermediate electrode CTE2, and the third intermediate electrode CTE3. In this way, the light emitting elements LD aligned with each other in the emission area EMA may be electrically connected in a serial-parallel combination structure to form the emission part EMU of the pixel PXL. Hence, it is possible to minimize a surface area occupied by the alignment electrode ALE (or prevent the number of alignment electrodes ALE from increasing) and also form the emission part EMU having a serial-parallel combination structure including four serial stages SET1, SET2, SET3, and SET4, so that a high-resolution and high-definition display device may be easily implemented.

According to the foregoing embodiment, since the 1-1-th bridge pattern BRP1_1 and some components of the pixel circuit PXC directly contact and are electrically connected with each other through the first contact portion CNT1, a defect (e.g., corrosion) which may occur between the some components of the pixel circuit PXC and the first alignment electrode ALE1 during a fabrication process may be prevented from being caused by material characteristics of each of the first alignment electrode ALE1 and the some components (e.g., conductive patterns made of copper) of the pixel circuit PXC. Furthermore, since the 3-1-th bridge pattern BRP3_1 and the second power line PL2 directly contact and are electrically connected with each other through the second contact portion CNT2, a defect which may occur between the second power line PL2 and the third alignment electrode ALE3 during a fabrication process may be prevented from being caused by material characteristics of each of the second power line PL2 and the third alignment electrode ALE3.

According to the foregoing embodiment, the 1-2-th bridge pattern BRP1_2 and the first pixel electrode PE1 directly contact and are electrically connected with each other. Consequently, since the first alignment electrode ALE1 having relatively large resistance does not directly contact the first pixel electrode PE1 because of material characteristics and/or oxidation which may occur during the fabrication process, contact resistance of the first pixel electrode PE1 may not be increased. Furthermore, the 3-2-th bridge pattern BRP3_2 and the second pixel electrode PE2 directly contact and are electrically connected with each other. Consequently, since the third alignment electrode ALE3 having relatively large resistance does not directly contact the second pixel electrode PE2 because of material characteristics and/or oxidation which may occur during the fabrication process, contact resistance of the second pixel electrode PE2 may not be increased. Therefore, the reliability of the pixel electrode PE may be enhanced, so that in case that a predetermined signal (or voltage) is supplied to the light emitting elements LD, distortion attributable to a signal delay may be mitigated or minimized, whereby the light emitting elements LD may be more reliably driven. In this case, the reliability of the display device DD may be enhanced.

Hereinafter, the stacked structure of the pixel PXL in accordance with the foregoing embodiment will be mainly described with reference to FIGS. 9 to 15.

Figure 9:
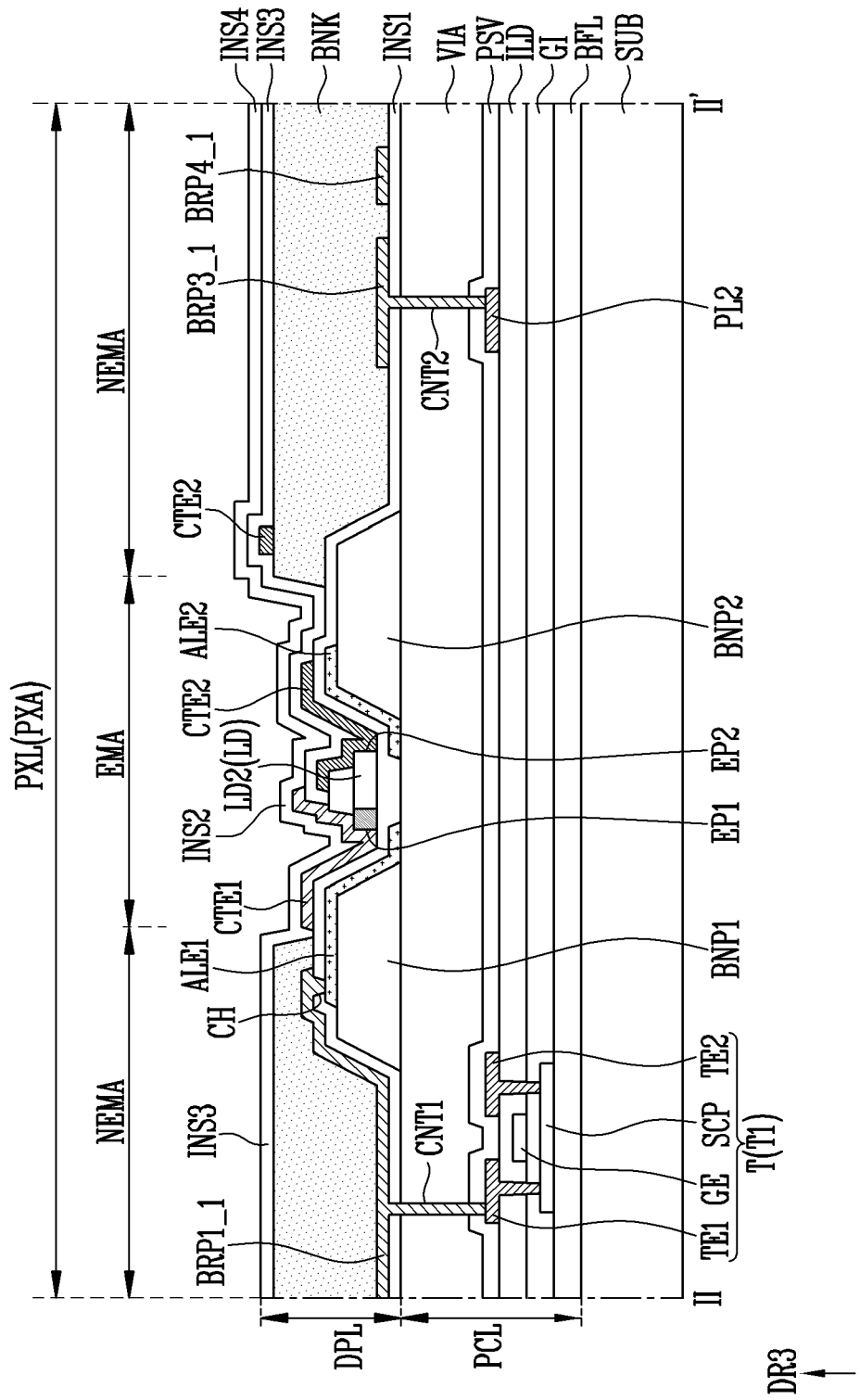
FIG. 9 is a schematic cross-sectional view taken along line II-II' of FIG. 7.

FIG. 9 is a schematic cross-sectional view taken along line II-II' of FIG. 7. FIGS. 10 to 14 are schematic cross-sectional views taken along line III-III' of FIG. 7. FIG. 15 is a schematic cross-sectional view taken along line IV-IV' of FIG. 7.

In the description of embodiments, "components are provided and/or formed on the same layer" may mean that the components are formed by the same process, and "components are provided and/or formed on different layers may mean that the components are formed by different processes.

Figure 10:
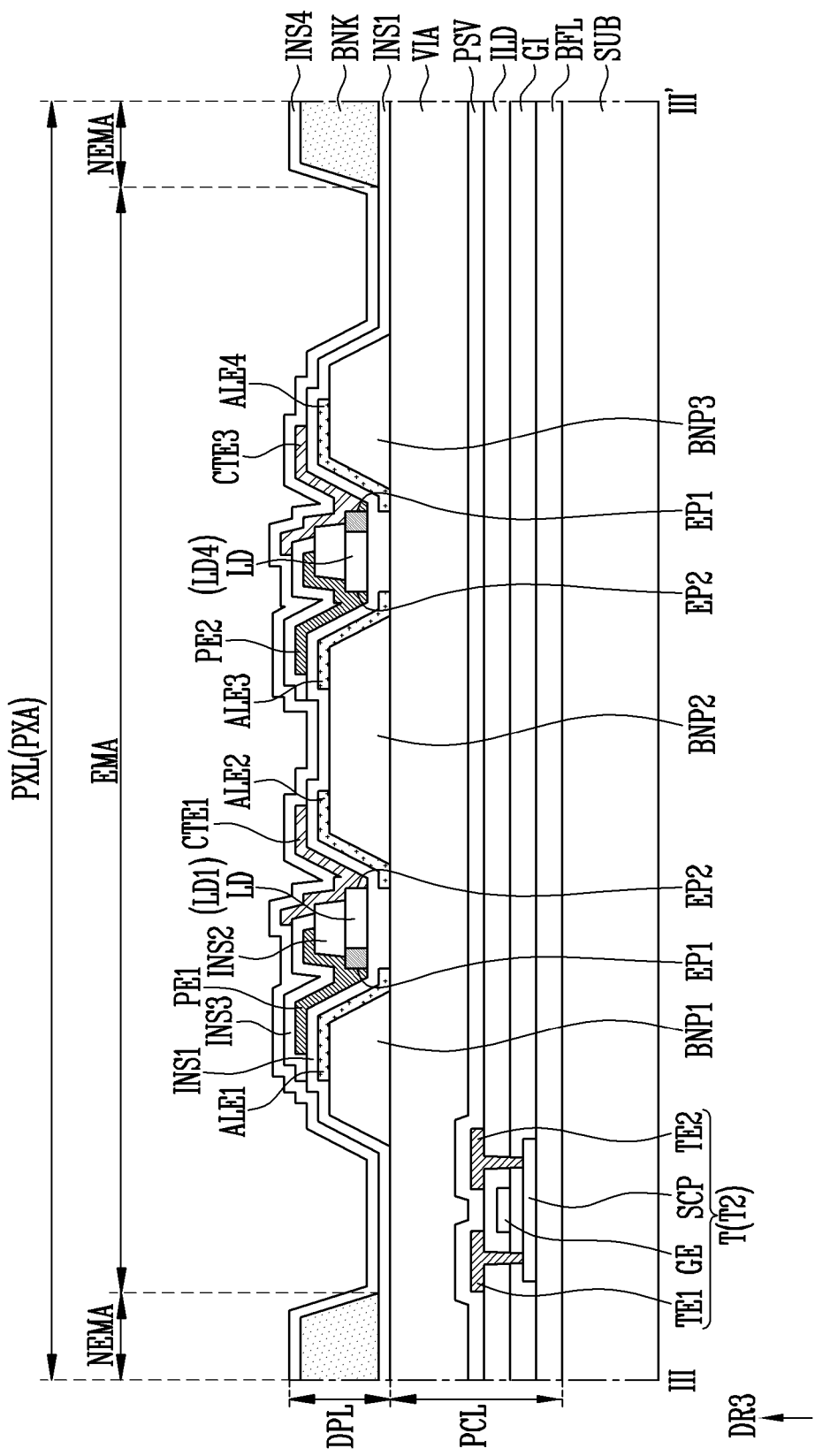
FIGS. 10 to 14 are schematic cross-sectional views taken along line III-III' of FIG. 7.
Figure 12:
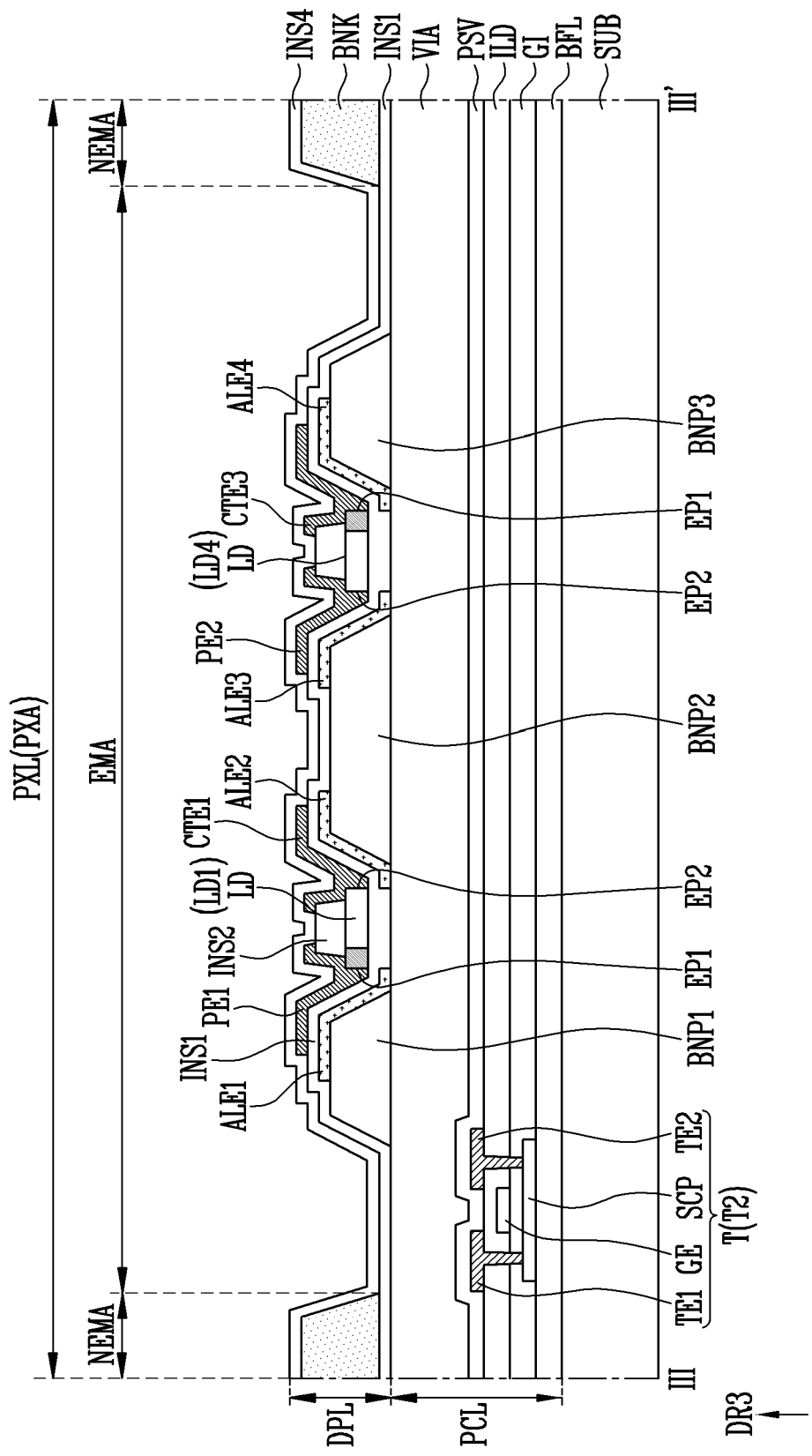

Embodiments of FIGS. 10 and 12 refer to different embodiments pertaining both to the step of forming the pixel electrode PE and the intermediate electrode CTE and to whether a third insulating layer INS3 is present. For example, FIG. 10 illustrates an embodiment where intermediate electrodes CTE are formed after pixel electrodes PE and a third insulating layer INS3 have been formed. FIG. 12 illustrates an embodiment where the pixel electrodes PE and the intermediate electrodes CTE are formed in the same layer.

Figure 11:
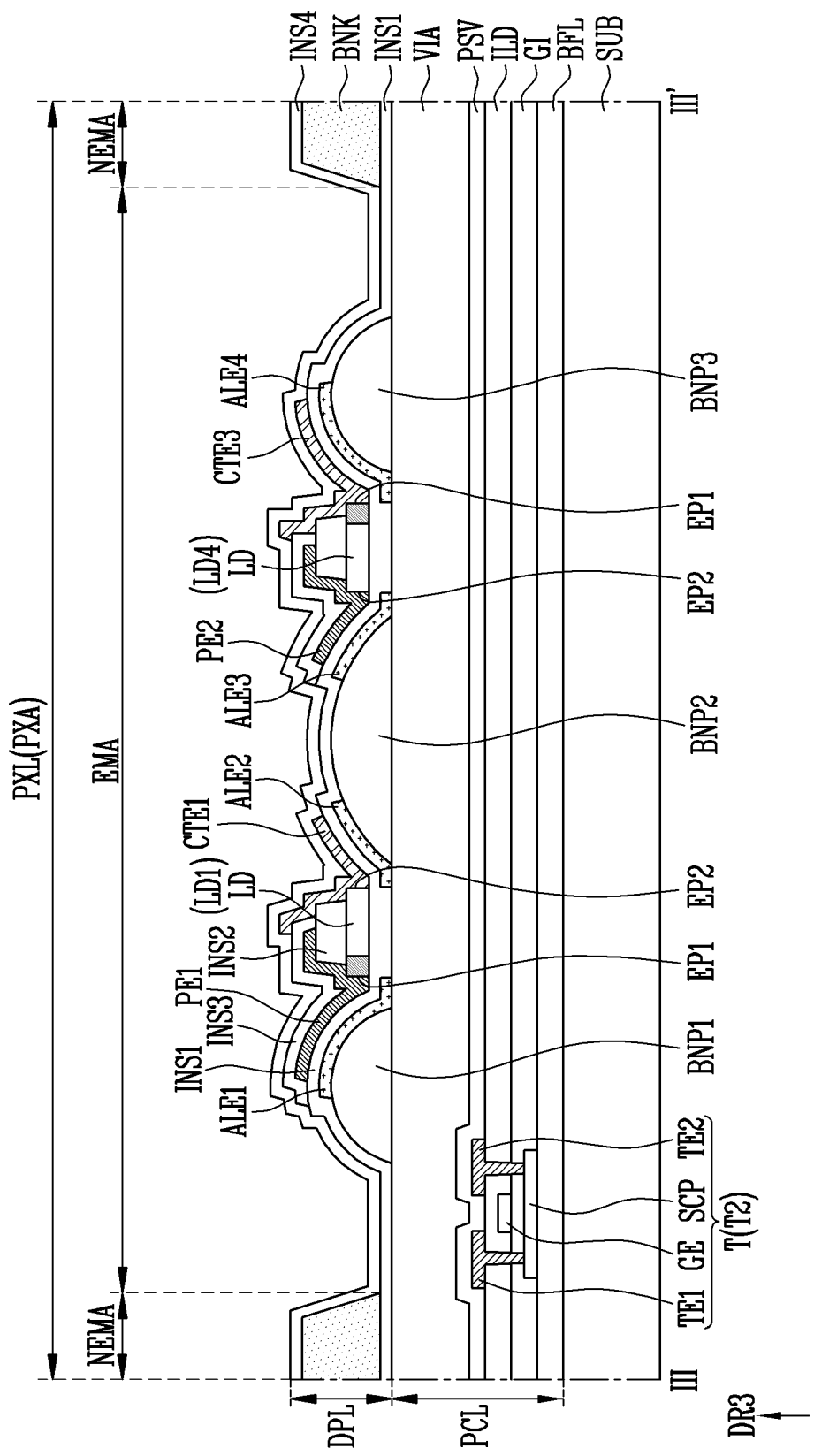

FIG. 11 illustrates a modification of the embodiment of FIG. 10 with regard to the bank pattern BNP, etc.

Figure 13:
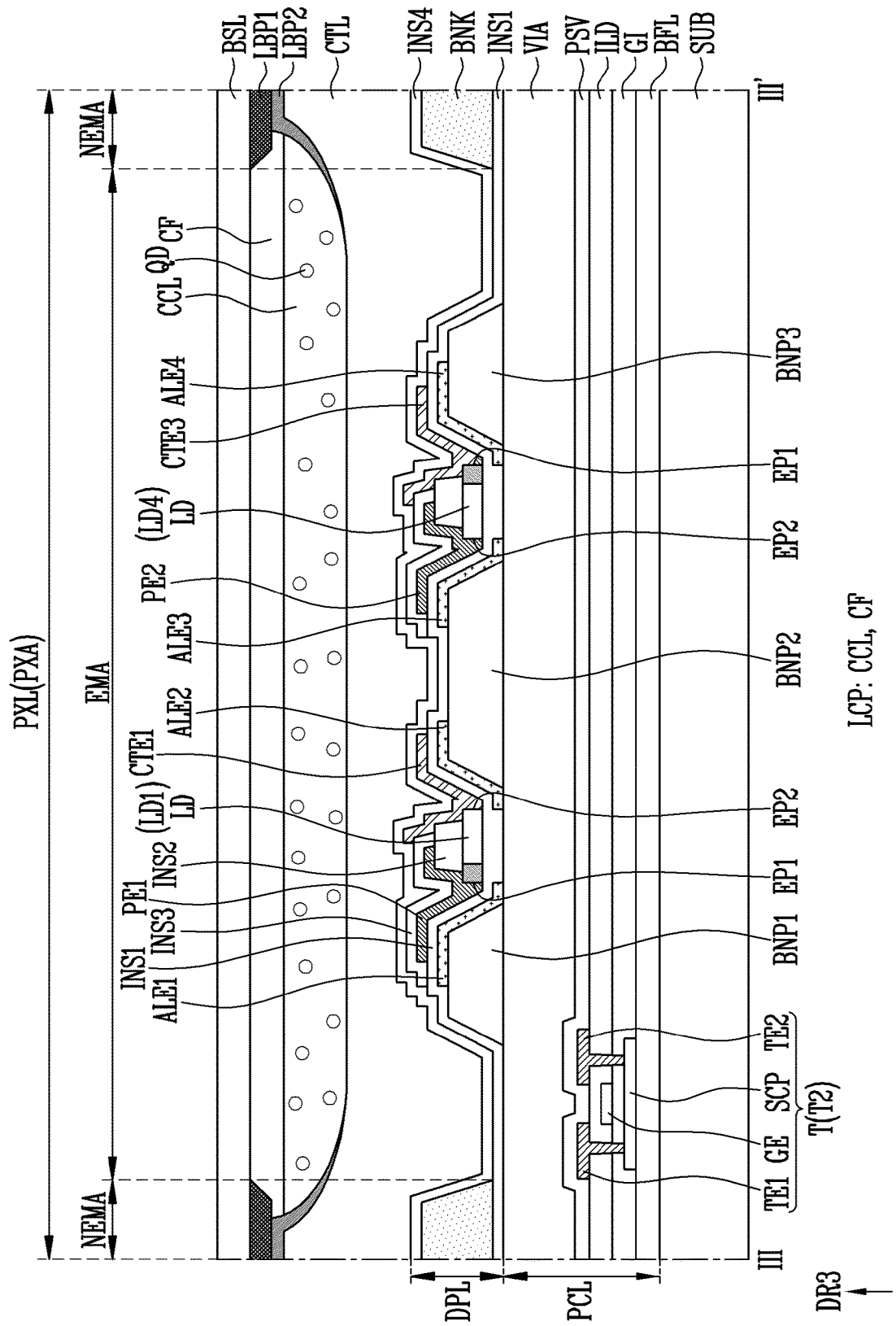
Figure 14:
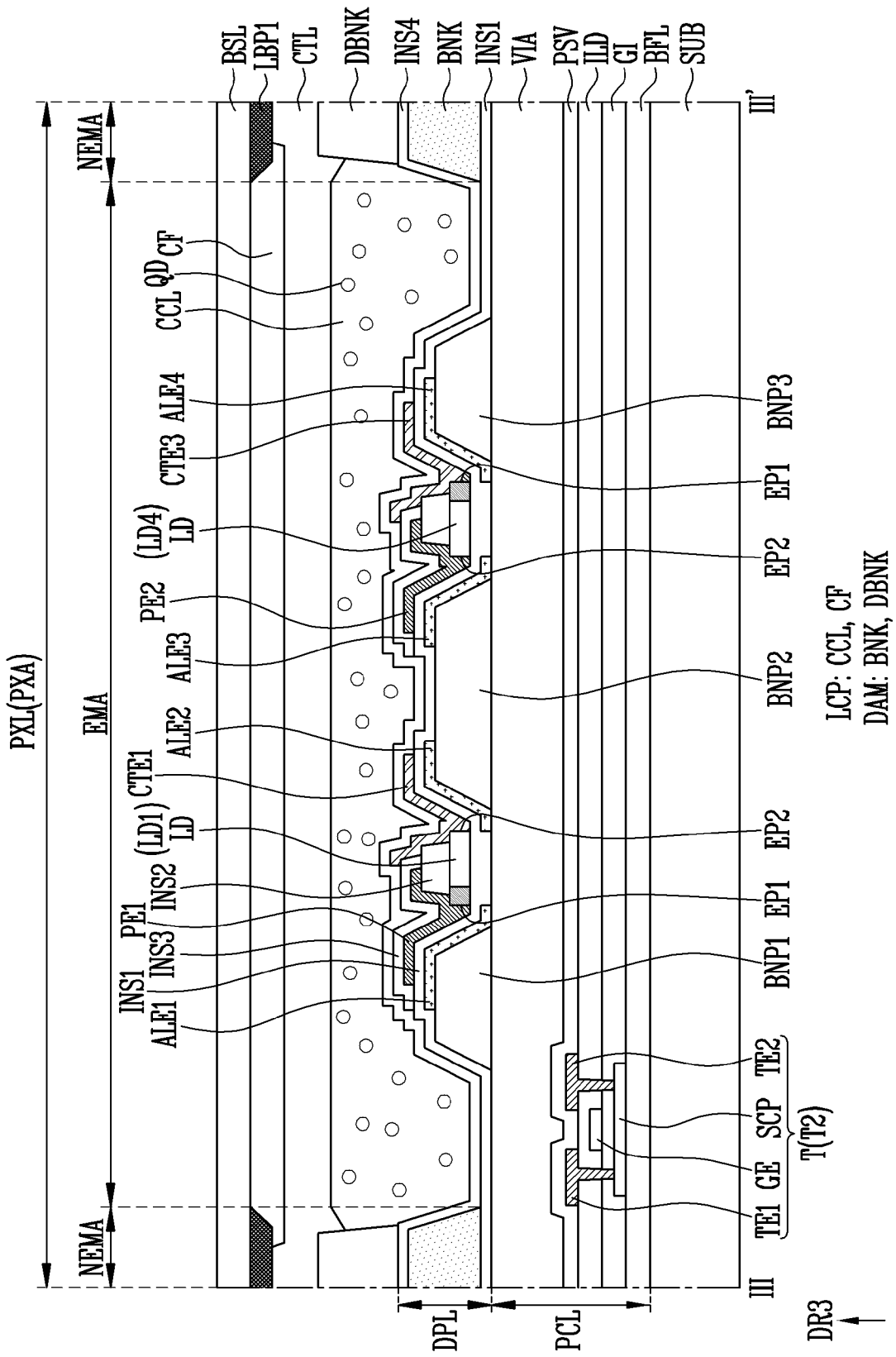
Figure 15:
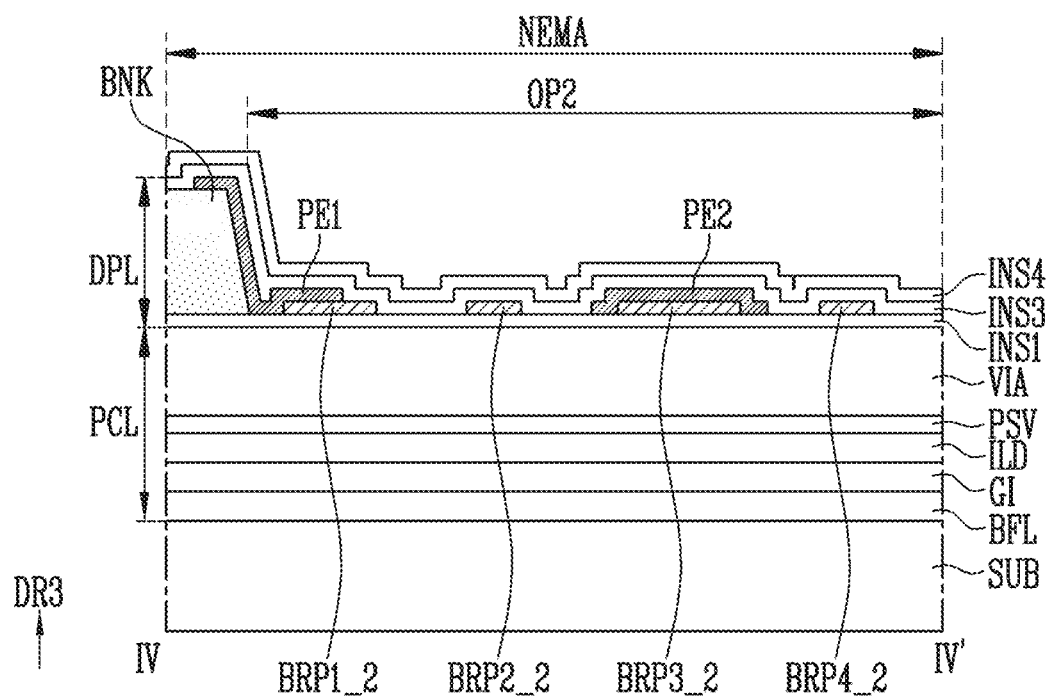
FIG. 15 is a schematic cross-sectional view taken along line IV-IV' of FIG. 7.

FIGS. 13 and 14 illustrate modifications of the embodiment of FIG. 10 with regard to a light conversion pattern LCP, etc. For example, FIG. 13 illustrates an embodiment in which an upper substrate including the light conversion pattern LCP is disposed on the display element layer DPL by an adhesive process using an adhesive layer. FIG. 14 illustrates an embodiment in which a color conversion layer CCL and a color filter CF face each other with an intermediate layer CTL interposed therebetween.

Although FIGS. 9 to 15 schematically illustrate a pixel PXL, e.g., by illustrating that each electrode is formed of an electrode having a single-layer (or single-film) structure and each insulating layer is formed of an insulating layer having a single-layer (or single-film) structure, the disclosure is not limited thereto.

Furthermore, in FIGS. 9 to 15, a height direction (or a vertical direction) in a cross-sectional view is represented by a third direction DR3. The third direction DR3 may mean a direction indicated by the third direction DR3.

Referring to FIGS. 1 to 4 and 6 to 15, the pixel PXL may include a substrate SUB, a pixel circuit layer PCL, and a display element layer DPL. The pixel circuit layer PCL and the display element layer DPL may be disposed on one surface of the substrate SUB and overlap each other. For example, the display area DA of the substrate SUB may include the pixel circuit layer PCL disposed on the one surface of the substrate SUB, and the display element layer DPL disposed on the pixel circuit layer PCL. However, relative positions of the pixel circuit layer PCL and the display element layer DPL on the substrate SUB may be changed depending on embodiments. In case that the pixel circuit layer PCL and the display element layer DPL are separated from each other as separate layers and overlap each other, layout space sufficient to form each of the pixel circuit PXC and the emission part EMU may be secured.

The substrate SUB may include transparent insulating material to allow light transmission. The substrate SUB may be a rigid substrate or a flexible substrate. The substrate SUB is the same as the substrate SUB described with reference to FIG. 4; and thus detailed descriptions thereof will be omitted.

In each pixel area PXA of the pixel circuit layer PCL, circuit elements (e.g., transistors T and a storage capacitor Cst) for forming the pixel circuit PXC of the corresponding pixel PXL and predetermined signal lines electrically connected to the circuit elements may be disposed. Furthermore, in each pixel area PXA of the display circuit layer DPL, the alignment electrodes ALE, the bridge patterns BRP, the light emitting elements LD, and/or the pixel electrodes PE that form the emission part EMU of the corresponding pixel PXL may be disposed.

The pixel circuit layer PCL may include at least one insulating layer as well as the circuit elements and the signal lines. For example, the pixel circuit layer PCL may include a buffer layer BFL, a gate insulating layer GI, an interlayer insulating layer ILD, a passivation layer PSV, and a via layer VIA which are successively stacked in the third direction DR3.

The buffer layer BFL may prevent impurities from diffusing into a transistor T included in the pixel circuit PXC. The buffer layer BFL may be an inorganic insulating layer formed of (or include) inorganic material. The buffer layer BFL may include at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided in a single-layer structure or a multi-layer structure having at least two or more layers. In case that the buffer layer BFL has a multi-layer structure, the respective layers may be formed of (or include) the same material or different materials. The buffer layer BFL may be omitted depending on the material of the substrate SUB or processing conditions.

The pixel circuit PXC may include a first transistor T1 (or a driving transistor) configured to control driving current of the light emitting elements LD, and a second transistor T2 (or a switching transistor) electrically connected to the first transistor T1. However, the disclosure is not limited thereto. The pixel circuit PXC may further include circuit elements configured to perform other functions, as well as the first transistor T1 and the second transistor T2. In the following embodiments, the first transistor T1 and the second transistor T2 may be referred to as "transistor T" or "transistors T".

The transistors T each may include a semiconductor pattern SCP, a gate electrode GE, a first terminal TE1, and a second terminal TE2. The first terminal TE1 may be either a source electrode or a drain electrode, and the second terminal TE2 may be the other electrode of the source electrode and the drain electrode. For example, in case that the first terminal TE1 is a drain electrode, the second terminal TE2 may be a source electrode.

The semiconductor pattern SCP may be provided and/or formed on the buffer layer BFL. The semiconductor pattern SCP may include a first contact area which contacts the first terminal TE1, and a second contact area which contacts the second terminal TE2. An area between the first contact area and the second contact area may be a channel area. The channel area may overlap the gate electrode GE of the corresponding transistor T. The semiconductor pattern SCP may be a semiconductor pattern formed of (or include) polysilicon, amorphous silicon, an oxide semiconductor, etc. For example, the channel area may be a semiconductor pattern undoped (or not doped) with impurities and be an intrinsic semiconductor. Each of the first contact area and the second area may be a semiconductor pattern doped with impurities.

The gate electrode GE may be provided and/or formed on the gate insulating layer GI to correspond to the channel area of the semiconductor pattern SCP. The gate electrode GE may be provided on the gate insulating layer GI and overlap the channel area of the semiconductor pattern SCP. The gate electrode GE may have a single-layer structure formed of (or include) one or combination selected from the group consisting of (or at least one of) copper (Cu), molybdenum (Mo), tungsten (W), aluminum neodymium (AlNd), titanium (Ti), aluminum (Al), silver (Ag), and an alloy thereof, or may have a double-layer or multi-layer structure formed of molybdenum (Mo), titanium (Ti), copper (Cu), aluminum (Al), or silver (Ag) to reduce line resistance.

The gate insulating layer GI may be an inorganic insulating layer including inorganic material. For example, the gate insulating layer GI may include at least one of metal oxides such as silicon nitride ($SiN_x$), silicon oxide ($SiO_x$), silicon oxynitride ($SiO_xN_y$), and aluminum oxide ($AlO_x$). However, the material of the gate insulating layer GI is not limited to that of the foregoing embodiments. In an embodiment, the gate insulating layer GI may be formed of an organic insulating layer including organic material. Although the gate insulating layer GI may be provided in a single-layer structure, the gate insulating layer GI may be provided in a multi-layer structure having at least two or more layers.

The first terminal TE1 and the second terminal TE2 each may be provided and/or formed on the interlayer insulating layer ILD, and may respectively contact the first contact area and the second contact area of the semiconductor pattern SCP through passing holes (or through-holes) successively passing through the gate insulating layer GI and the interlayer insulating layer ILD. For example, the first terminal TE1 may contact the first contact area of the semiconductor pattern SCP, and the second terminal TE2 may contact the second contact area of the semiconductor pattern SCP. Each of the first and second terminals TE1 and TE2 and the gate electrode GE may include the same material, or the interlayer insulating layer ILD may include one or more materials selected from among materials exemplified as the material for forming the gate electrode GE.

The interlayer insulating layer ILD may be provided and/or formed on the gate electrode GE and the gate insulating layer GI. The interlayer insulating layer ILD and the gate insulating layer GI may include the same material, or the interlayer insulating layer ILD may include one or more materials selected from among materials exemplified as the material for forming the gate insulating layer GI.

Although in the foregoing embodiment the first and second terminals TE1 and TE2 of the transistors T have been described as being separate electrodes which are electrically connected with the semiconductor pattern SCP through a through-hole successively passing through the gate insulating layer GI and the interlayer insulating layer ILD, the disclosure is not limited thereto. In an embodiment, the first terminal TE1 of each of the transistors T may be a first contact area adjacent to the channel area of the corresponding semiconductor pattern SCP. The second terminal TE2 of each of the transistors T may be a second contact area adjacent to the channel area of the corresponding semiconductor pattern SCP.

In an embodiment, the transistors T may be low-temperature polycrystalline silicon thin-film transistors, but the disclosure is not limited thereto. In an embodiment, the transistors T each may be formed of an oxide semiconductor thin-film transistor. Furthermore, although in the foregoing embodiment, there has been illustrated the case where each of the transistors T is a thin-film transistor having a top gate structure, the disclosure is not limited thereto. The structure of the transistors T may be changed in various ways.

In an embodiment, a bottom metal layer that overlap the first transistor T1 may be provided and/or formed between the substrate SUB and the buffer layer BFL. The bottom metal layer may be a first conductive layer of the conductive layers provided on the substrate SUB. Although not directly illustrated in the drawings, the bottom metal layer may be electrically connected to the first transistor T1 and thus increase a driving range of a predetermined voltage to be supplied to the gate electrode GE of the first transistor T1. For example, the bottom metal layer may be electrically and/or physically connected with one of the first and second terminals TE1 and TE2 of the first transistor T1.

The pixel circuit layer PCL may include a power line provided and/or formed on the interlayer insulating layer ILD. For example, the power line may include a second power line PL2. The second power line PL2 and the first and second terminals TE1 and TE2 of the transistors T may be provided on the same layer. A voltage of the second driving power supply VSS may be applied to the second power line PL2. Although not directly illustrated in FIGS. 9 to 15, the pixel circuit layer PCL may further include a first power line PL1. The first power line PL1 and the second power line PL2 may be provided on the same layer or may be provided on different layers. Although in the foregoing embodiment the second power line PL2 has been described as being provided and/or formed on the interlayer insulating layer ILD, the disclosure is not limited thereto. In an embodiment, the second power line PL2 and one of the conductive layers provided on the pixel circuit layer PCL may be provided on the same layer. In other words, the location of the second power line PL2 in the pixel circuit layer PCL may be changed in various ways.

Each of the first power line PL1 and the second power line PL2 may include conductive material (or substance). For example, each of the first power line PL1 and the second power line PL2 may have a single-layer structure formed of one or combination selected from the group consisting of (or at least one of) copper (Cu), molybdenum (Mo), tungsten (W), aluminum neodymium (AlNd), titanium (Ti), aluminum (Al), silver (Ag), and an alloy thereof, or may have a double-layer or multi-layer structure formed of molybdenum (Mo), titanium (Ti), copper (Cu), aluminum (Al), or silver (Ag) to reduce line resistance. For instance, each of the first power line PL1 and the second power line PL2 may be formed of double layers stacked in a sequence of titanium (Ti) and copper (Cu).

The first power line PL1 may be electrically connected with some components of the display element layer DPL. The second power line PL2 may be electrically connected with other components of the display element layer DPL.

The passivation layer PSV may be provided and/or formed on the transistors T and the second power line PL2.

The passivation layer (or referred to as "protective layer") PSV may be provided and/or formed on overall surfaces of the first and second terminals TE1 and TE2, the second power line PL2, and the interlayer insulating layer ILD. The passivation layer PSV may be an inorganic insulating layer including inorganic material or an organic insulating layer including organic material. The passivation layer PSV and the interlayer insulating layer ILD may have the same material, but the disclosure is not limited thereto. The passivation layer PSV may be provided in a single-layer structure or a multi-layer structure having at least two or more layers.

The passivation layer PSV may be partially open to allow each of a portion of the first terminal TE1 and a portion of the second power line PL2 to be exposed. For example, the passivation layer PSV may include a first contact portion CNT1 which exposes the portion of the first terminal TE1, and a second contact portion CNT2 which exposes the portion of the second power line PL2.

The passivation layer PSV may be selectively provided, or may be omitted depending on embodiments.

The via layer VIA may be provided and/or formed on the overall surface of the passivation layer PSV.

The via layer VIA may be formed of an inorganic layer (or an inorganic insulating layer) including inorganic material, or an organic layer (or an organic insulating layer) including organic material. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). The organic insulating layer may include, for example, at least one of polyacrylates resin, epoxy resin, phenolic resin, polyamides resin, polyimides rein, unsaturated polyesters resin, polyphenylen ethers resin, polyphenylen sulfides resin, and benzocyclobutene resin.

In an embodiment, the via layer VIA and the passivation layer PSV may include the same material, but the disclosure is not limited thereto. The via layer VIA may be provided in a single-layer structure or a multi-layer structure having at least two or more layers. The via layer VIA may be partially open to allow each of a portion of the first terminal TE1 and a portion of the second power line PL2 to be exposed. For example, the via layer VIA may be partially open to include a first contact portion CNT1 corresponding to the first contact portion CNT1 of the passivation layer PSV, and a second contact portion CNT2 corresponding to the second contact portion CNT2 of the passivation layer PSV.

The display element layer DPL may be provided and/or formed on the via layer VIA.

The display element layer DPL may include bank patterns BNP, alignment electrodes ALE, bridge patterns BRP, a bank BNK, light emitting elements LD, pixel electrodes PE, and intermediate electrodes CTE. Furthermore, the display element layer DPL may include at least one or more insulating layers disposed between the foregoing components. For example, the display element layer DPL may include a first insulating layer INS1, a second insulating layer INS2, a third insulating layer INS3, and a fourth insulating layer INS4. In an embodiment, the third insulating layer INS3 may be selectively provided.

The bank patterns BNP may be provided and/or formed on the via layer VIA.

The bank patterns BNP may be disposed on one surface of the via layer VIA. For example, the bank patterns BNP may protrude in the third direction DR3 on the one surface of the via layer VIA. Hence, an area of each of the alignment electrodes ALE disposed on the bank patterns BNP may protrude in the third direction DR3 (or the thickness-wise direction of the substrate SUB).

The bank patterns BNP may be an inorganic insulating layer including inorganic material or an organic insulating layer including organic material. In an embodiment, the bank patterns BNP may include an organic insulating layer having a single-layer structure and/or an inorganic insulating layer having a single-layer structure, but the disclosure is not limited thereto. In an embodiment, the bank patterns BNP may be provided in a multi-layer structure formed by stacking at least one organic insulating layer and at least one inorganic insulating layer. However, the material of the bank patterns BNP is not limited to the foregoing embodiment. In an embodiment, the bank patterns BNP may include conductive material (or conductive substance).

The bank patterns BNP may have a trapezoidal cross-section, a width of which reduces from a surface (e.g., an upper surface) of the via layer VIA upward in the third direction DR3, but the disclosure is not limited thereto. In an embodiment, as illustrated in FIG. 11, the bank patterns BNP may include a curved surface having a cross-sectional shape such as a semi-elliptical shape or a semi-circular shape (or a hemispherical shape), a width of which reduces from a surface of the via layer VIA upward in the third direction DR3. In a sectional view, the shape of the bank patterns BNP is not limited to the foregoing examples, and may be changed in various ways within a range in which the efficiency of light emitted from each of the light emitting elements LD may be enhanced. Furthermore, in some embodiments, at least one of the bank patterns BNP may be omitted, or the position thereof may be changed.

In an embodiment, the bank patterns BNP each may be used as a reflector. For example, the bank patterns BNP, along with the alignment electrodes ALE disposed thereover, may be used as reflectors to guide light emitted from each light emitting element LD in a desired direction, so that the light output efficiency of the pixel PXL may be enhanced.

The alignment electrodes ALE may be provided and/or formed on the bank patterns BNP.

The first alignment electrode ALE1 may be provided and/or formed on the via layer VIA and the first bank pattern BNP1. The second alignment electrode ALE2 may be provided and/or formed on the via layer VIA and the second bank pattern BNP2. The third alignment electrode ALE3 may be provided and/or formed on the via layer VIA and the second bank pattern BNP2. The fourth alignment electrode ALE4 may be provided and/or formed on the via layer VIA and the third bank pattern BNP3.

The first alignment electrode ALE1 may have a shape corresponding to an inclination of the first bank pattern BNP1 disposed thereunder. The second alignment electrode ALE2 may have a shape corresponding to an inclination of the second bank pattern BNP2 disposed thereunder. The third alignment electrode ALE3 may have a shape corresponding to an inclination of the second bank pattern BNP2 disposed thereunder. The fourth alignment electrode ALE4 may have a shape corresponding to an inclination of the third bank pattern BNP3 disposed thereunder.

The alignment electrodes ALE may be disposed on an the same plane and have a same thickness in the third direction DR3. Furthermore, the alignment electrodes ALE may be simultaneously formed by a same process.

The alignment electrodes ALE may be formed of material having a predetermined (or uniform) reflectivity to allow light emitted from the light emitting elements LD to travel in an image display direction of the display device DD. For example, the alignment electrodes ALE may be formed of conductive material. The conductive material may include opaque metal that has an advantage in reflecting, in the image display direction of the display device DD, light emitted from the light emitting elements LD. For example, the opaque metal may include metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the material of the alignment electrodes ALE is not limited to the foregoing embodiment.

Each of the alignment electrodes ALE may be provided and/or formed to have a single-layer structure, but the disclosure is not limited thereto. In an embodiment, each of the alignment electrodes ALE may be provided and/or formed in a multi-layer structure formed by stacking at least two materials among metals, alloys, conductive oxides, and conductive polymers. Each of the alignment electrodes ALE may be formed of a multi-layer structure including at least two layers to minimize distortion resulting from a signal delay in case that signals (or voltages) are transmitted to the opposite ends EP1 and EP2 of the respective light emitting elements LD. For example, each of the alignment electrodes ALE may include at least one reflective electrode layer. Furthermore, each of the alignment electrodes ALE may selectively further include at least one of at least one transparent electrode layer disposed over and/or under the reflective electrode layer, and at least one conductive capping layer covering an upper portion of the reflective electrode layer and/or the transparent electrode layer.

In an embodiment, the alignment electrodes ALE may have a single-layer structure including aluminum (AL).

As described above, in case that the alignment electrodes ALE are formed of conductive material having a constant reflectivity, light emitted from the opposite ends, for example, the first and second ends EP1 and EP2, of each of the light emitting elements LD may more effectively travel in the image display direction of the display device DD (or the third direction DR3). If the alignment electrodes ALE have inclined or curved surfaces corresponding to the shape of the bank pattern BNP and are disposed to face the first and second ends EP1 and EP2 of the light emitting elements LD, light emitted from the first and second ends EP1 and EP2 of each of the light emitting elements LD may be reflected by the alignment electrodes ALE and thus may more reliably travel in the image display direction of the display device DD. Consequently, the efficiency of light emitted from the light emitting elements LD may be enhanced.

The first insulating layer INS1 may be provided and/or formed on the alignment electrodes ALE.

The first insulating layer INS1 may be formed of an inorganic insulating layer including inorganic material, or an organic insulating layer including organic material. The first insulating layer INS1 may be formed of an inorganic insulating layer having an advantage in protecting the light emitting elements LD from the pixel circuit layer PCL. For example, the first insulating layer INS1 may include at least one of silicon nitride ($SiN_x$), silicon oxide ($SiO_x$), silicon oxynitride (SiOxNy), and metal oxide such as aluminum oxide (AlOx), but the disclosure is not limited thereto. In an embodiment, the first insulating layer INS1 may be formed of an organic insulating layer that has an advantage in planarization of support surfaces of the light emitting elements LD.

The first insulating layer INS1 may be provided to have a single or multi-layer structure. In case that the first insulating layer INS1 is formed of multiple layers, the first insulating layer INS1 may have a distributed Bragg reflector (DBR) structure formed by alternately stacking first layers and second layers which are formed of inorganic insulating layers and have different refractive indexes. For example, the first insulating layer INS1 may have a stacked structure formed by alternating (or alternately stacking) the first layers having a low refractive index and the second layers having a refractive index greater than that of the first layers. As described above, in case that the first insulating layer INS1 is formed of multiple layers, the first insulating layer INS1 may be used as a reflector configured to reflect light emitted from the light emitting elements LD in a target direction using constructive interference due to a difference in refractive index between the first layers and the second layers. Each of the first and second layers may include at least one of silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), silicon oxycarbide ($SiO_xC_y$), aluminum oxide (AlO$_x$), aluminum nitride (AlN$_x$), hafnium oxide (HfO$_x$), zirconium oxide (ZrO$_x$), titanium oxide (TiO$_x$), and tantalum oxide (TaO$_x$).

The first insulating layer INS1 may be partially open at least in an area of the non-emission area NEMA so that components disposed thereunder may be exposed. For example, the first insulating layer INS1 may be partially open by removing an area thereof at least in the non-emission area NEMA and thus may include a first contact portion CNT1 through which the first terminal TE1 of the first transistor T1 is exposed, and a second contact portion CNT2 through which a portion of the second power line PL2 is exposed. The first contact portion CNT1 of the first insulating layer INS1 may correspond the first contact portion CNT1 of each of the passivation layer PSV and the via layer VIA. The second contact portion CNT2 of the first insulating layer INS1 may correspond to the second contact portion CNT2 of each of the passivation layer PSV and the via layer VIA.

The first insulating layer INS1 may be partially open at least in another area of the non-emission area NEMA so that components disposed thereunder may be exposed. For example, the first insulating layer INS1 may be partially open by removing an area thereof at least in the corresponding area of the non-emission area NEMA and thus may include contact holes CH which expose respective portions of the alignment electrodes ALE.

The bridge patterns BRP may be provided and/or formed on the first insulating layer INS1.

The bridge patterns BRP may be disposed on a surface of the first insulating layer INS1 in the non-emission area NEMA. The bridge patterns BRP may be disposed on the first insulating layer INS1 in the non-emission area NEMA and partially overlap the alignment electrodes ALE. The bridge patterns BRP may have the same thickness in the third direction DR3, and be simultaneously formed by the same process.

The bridge patterns BRP may be formed of conductive material (or conductive substance). For example, the bridge patterns BRP may include transparent conductive material. The transparent conductive material (or substance) may include conductive oxides (or transparent conductive oxides) such as indium tin oxide (ITO), indium zinc oxide (IZO), zinc oxide (ZnO), indium gallium zinc oxide (IGZO), and indium tin zinc oxide (ITZO), and a conductive polymer such as poly(3,4-ethylenedioxythiophene) (PEDOT). However, the material of the bridge patterns BRP is not limited to the foregoing materials.

In an embodiment, the bridge patterns BRP may be formed of transparent conductive oxide such as indium tin oxide (ITO).

The first bridge pattern BRP1 may be disposed on the first insulating layer INS1 in the non-emission area NEMA and partially overlap the first alignment electrode ALE1. The first bridge pattern BRP1 may include a 1-1-th bridge pattern BRP1_1 and a 1-2-th bridge pattern BRP1_2.

The 1-1-th bridge pattern BRP1_1 may be electrically connected, in an area of the non-emission area NEMA, to one end of the first alignment electrode ALE1 that is exposed through a contact hole CH passing through the first insulating layer INS1. The 1-2-th bridge pattern BRP1_2 may be electrically connected, in another area of the non-emission area NEMA, to a remaining end (or another end) of the first alignment electrode ALE1 that is exposed through a contact hole CH passing through the first insulating layer INS1.

The second bridge pattern BRP2 may be disposed on the first insulating layer INS1 in the non-emission area NEMA and partially overlap the second alignment electrode ALE2. The second bridge pattern BRP2 may include a 2-1-th bridge pattern BRP2_1 and a 2-2-th bridge pattern BRP2_2.

The 2-1-th bridge pattern BRP2_1 may be electrically connected, in an area of the non-emission area NEMA, to an end of the second alignment electrode ALE2 that is exposed through a contact hole CH passing through the first insulating layer INS1. The 2-2-th bridge pattern BRP2_2 may be electrically connected, in another area of the non-emission area NEMA, to a remaining end (or another end) of the second alignment electrode ALE2 that is exposed through a contact hole CH passing through the first insulating layer INS1.

The third bridge pattern BRP3 may be disposed on the first insulating layer INS1 in the non-emission area NEMA and partially overlap the third alignment electrode ALE3. The third bridge pattern BRP3 may include a 3-1-th bridge pattern BRP3_1 and a 3-2-th bridge pattern BRP3_2.

The 3-1-th bridge pattern BRP3_1 may be electrically connected, in an area of the non-emission area NEMA, to an end of the third alignment electrode ALE3 that is exposed through a contact hole CH passing through the first insulating layer INS1. The 3-2-th bridge pattern BRP3_2 may be electrically connected, in another area of the non-emission area NEMA, to a remaining end (or another end) of the third alignment electrode ALE3 that is exposed through a contact hole CH passing through the first insulating layer INS1.

The fourth bridge pattern BRP4 may be disposed on the first insulating layer INS1 in the non-emission area NEMA and partially overlap the fourth alignment electrode ALE4. The fourth bridge pattern BRP4 may include 4-1-th bridge pattern BRP4_1 and a 4-2-th bridge pattern BRP4_2.

The 4-1-th bridge pattern BRP4_1 may be electrically connected, in an area of the non-emission area NEMA, to an end of the fourth alignment electrode ALE4 that is exposed through a contact hole CH passing through the first insulating layer INS1. The 4-2-th bridge pattern BRP4_2 may be electrically connected, in another area of the non-emission area NEMA, to a remaining end (or another end) of the fourth alignment electrode ALE4 that is exposed through a contact hole CH passing through the first insulating layer INS1.

The 1-1-th bridge pattern BRP1_1 may be electrically connected with the first transistor T1 through the first contact portion CNT1. The 3-1-th bridge pattern BRP3_1 may be electrically connected with the second power line PL2 through the second contact portion CNT2. The 1-1-th bridge pattern BRP1_1 may directly contact the first terminal TE1 exposed through the first contact portion CNT1 of each of the passivation layer PSV, the via layer VIA, and the first insulating layer INS1, and be electrically connected with the first transistor T1 through the first terminal TE1. The 3-1-th bridge pattern BRP3_1 may directly contact the second power line PL2 exposed through the second contact portion CNT2 of each of the passivation layer PSV, the via layer VIA, and the first insulating layer INS1, and may be electrically connected with the second power line PL2.

The bank BNK may be provided and/or formed on the bridge patterns BRP and the first insulating layer INS1.

The bank BNK may be formed between adjacent pixels PXL to enclose the emission area EMA of the pixel PXL so that a pixel defining layer for defining the emission area EMA of the corresponding pixel PXL may be formed. At the step of supplying the light emitting elements LD to the emission area EMA, the bank BNK may be a dam structure configured to prevent a solution mixed with the light emitting elements LD from being drawn (or introduced) into the emission area EMA of an adjacent pixel PXL or control the amount of solution such that a constant amount of solution is supplied to each emission area EMA.

In an embodiment, the bank BNK may cover (or overlap) contact holes CH that pass through the first insulating layer INS1. For example, at least in the non-emission area NEMA, the bank BNK may cover contact holes CH formed to electrically and/or physically connect the first bridge pattern BRP1 and the first alignment electrode ALE1, contact holes CH formed to electrically and/or physically connect the second bridge pattern BRP2 and the second alignment electrode ALE2, contact holes CH formed to electrically and/or physically connect the third bridge pattern BRP3 and the third alignment electrode ALE3, and contact holes CH formed to electrically and/or physically connect the fourth bridge pattern BRP4 and the fourth alignment electrode ALE4.

As described above, the contact holes CH of the first insulating layer INS1 that are connection points between the bridge patterns BRP and the alignment electrodes ALE may be covered with the bank BNK and prevented from being exposed to the outside. Hence, predetermined signals applied to the connection points between the bridge patterns BRP and the alignment electrodes ALE may be prevented from affecting an electric field formed between the alignment electrodes ALE at the step of aligning the light emitting elements LD.

The light emitting elements LD may be supplied to and aligned in the emission area EMA of the pixel PXL that is defined by the bank BNK.

The light emitting elements LD may be supplied (or input) to the emission area EMA by an inkjet printing method or the like. The light emitting elements LD may be aligned between the alignment electrodes ALE in the emission area EMA by an alignment signal (or an alignment voltage) applied to each of the alignment electrodes ALE and the bridge patterns BRP. A same alignment signal may be applied to the first alignment electrode ALE1 and the fourth alignment electrode ALE4. For example, a ground voltage may be applied to the first alignment electrode ALE1 and the fourth alignment electrode ALE4. A same alignment signal may be applied to the second alignment electrode ALE2 and the third alignment electrode ALE3. For example, an AC signal may be applied to the second alignment electrode ALE2 and the third alignment electrode ALE3.

In the emission area EMA, the second insulating layer INS2 may be provided and/or formed on the light emitting elements LD. The second insulating layer INS2 may be provided and/or formed on the light emitting elements LD to partially cover (or overlap) the outer circumferential surface (or the surface) of each of the light emitting elements LD such that the first end EP1 and the second end EP2 of each of the light emitting element LD are exposed to the outside.

The second insulating layer INS2 may be formed of a single layer or multiple layers, and include an inorganic insulating layer including at least one inorganic material or an organic insulating layer including at least one organic material. The second insulating layer INS2 may include an inorganic insulating layer that has an advantage in protecting the active layer 12 (see FIG. 1) of each of the light emitting elements LD from external oxygen, water, etc. However, the disclosure is not limited thereto. The second insulating layer INS2 may be formed of an organic insulating layer including organic material, depending on design conditions, etc. of the display device DD to which the light emitting elements LD are applied. Since the second insulating layer INS2 is formed on the light emitting elements LD after the alignment of the light emitting elements LD in the pixel area PXA (or the emission area EMA) of the pixel PXL has been completed, the light emitting elements LD may be prevented from being removed from the aligned positions.

In case that a gap (or space) is present between the first insulating layer INS1 and the light emitting elements LD before the formation of the second insulating layer INS2, the gap may be filled with the second insulating layer INS2 during a process of forming the second insulating layer INS2. In this case, the second insulating layer INS2 may be formed of an organic insulating layer that has an advantage in filling the gap between the first insulating layer INS1 and the light emitting elements LD with the second insulating layer INS2, but the disclosure is not limited thereto.

The third insulating layer INS3 may be disposed to cover any one of the pixel electrodes PE and the intermediate electrodes CTE that are disposed on the first and second ends EP1 and EP2 of the light emitting elements LD. For example, as illustrated in FIGS. 9, 10, 11, 13, and 14, the third insulating layer INS3 may be disposed on each of the first pixel electrode PE1, the second pixel electrode PE2, and the second intermediate electrode CTE2 to cover each of the first pixel electrode PE1, the second pixel electrode PE2, and the second intermediate electrode CTE2. The third insulating layer INS3 may be formed of an inorganic insulating layer including inorganic material, or an organic insulating layer including organic material. For example, the third insulating layer INS3 may include at least one of silicon nitride ($SiN_x$), silicon oxide ($SiO_x$), silicon oxynitride ($SiO_xN_y$), and metal oxide such as aluminum oxide ($AlO_x$), but the disclosure is not limited thereto. The third insulating layer INS3 may be formed of a single layer or multiple layers.

If the second and/or third insulating layers INS2 and/or INS3 are formed over the light emitting elements LD, electrical stability between the first and second ends EP1 and EP2 of the light emitting elements LD may be secured. For example, the pixel electrode PE and the intermediate electrode CTE that are adjacent to each other may be reliably separated from each other by the second and/or third insulating layers INS2 and/or INS3. Hence, a short-circuit defect between the first and second ends EP1 and EP2 of the light emitting elements LD may be prevented from occurring.

As illustrated in FIG. 12, in an embodiment where the pixel electrodes PE and the intermediate electrodes CTE are disposed on the same layer, the third insulating layer INS3 may not be provided.

The pixel electrodes PE may be disposed, at least in the emission area EMA, on the light emitting elements LD, the second insulating layer INS2 provided on the light emitting elements LD, and the first insulating layer INS1 provided on the alignment electrode ALE. Furthermore, the pixel electrodes PE may be disposed on some bridge patterns BRP at least in the non-emission area NEMA.

At least in the emission area EMA, the first pixel electrode PE1 may be disposed on the first end EP1 of the first light emitting element LD1, the second insulating layer INS2 provided on the first light emitting element LD1, and the first insulating layer INS1 provided on the first alignment electrode ALE1.

In an area of at least the non-emission area NEMA (or in the second opening OP2 of the bank BNK), the first pixel electrode PE1 may be disposed on the 1-2-th bridge pattern BRP1_2, as illustrated in FIG. 15. Hence, the first pixel electrode PE1 may directly contact the 1-2-th bridge pattern BRP1_2 and may be connected to the 1-2-th bridge pattern BRP1_2.

At least in the emission area EMA, the second pixel electrode PE2 may be disposed on the second end EP2 of the fourth light emitting element LD4, the second insulating layer INS2 provided on the fourth light emitting element LD4, and the first insulating layer INS1 provided on the third alignment electrode ALE3.

In an area of at least the non-emission area NEMA (or in the second opening OP2 of the bank BNK), the second pixel electrode PE2 may be disposed on the 3-2-th bridge pattern BRP3_2, as illustrated in FIG. 15. Hence, the second pixel electrode PE2 may directly contact the 3-2-th bridge pattern BRP3_2 and may be electrically connected to the 3-2-th bridge pattern BRP3_2.

The first pixel electrode PE1 and the second pixel electrode PE2 may be formed by the same process and be provided on the same layer. However, the disclosure is not limited thereto. In some embodiments, the first pixel electrode PE1 and the second pixel electrode PE2 may be formed by different processes and be provided on different layers.

The pixel electrodes PE may be formed of various transparent conductive materials. For example, the pixel electrodes PE may include at least one of various transparent conductive materials (or substances) including indium tin oxide (ITO), indium zinc oxide (IZO), zinc oxide (ZnO), indium gallium zinc oxide (IGZO), and indium tin zinc oxide (ITZO), and be substantially transparent or translucent to satisfy a predetermined transmittancy (or transmittance). However, the material of the pixel electrodes PE is not limited to the foregoing embodiment. In an embodiment, the pixel electrodes PE may be formed of various opaque conductive materials (or substances). The pixel electrodes PE may be formed of a single layer or multiple layers. In an embodiment, the pixel electrodes PE and the bridge patterns BRP may include the same material.

At least one of the intermediate electrodes CTE, and the pixel electrodes PE may be formed by the same process and may be formed on the same layer. The other intermediate electrodes CTE and the pixel electrodes PE may be formed by different processes and may be formed on different layers. For example, the first and third intermediate electrodes CTE1 and CTE3 may be formed on the third insulating layer INS3 and be spaced from the pixel electrodes PE that are covered with the third insulating layer INS3. Furthermore, the second intermediate electrode CTE2 and the pixel electrodes PE may be formed by the same process and be provided on the same layer. However, the disclosure is not limited to the foregoing embodiments. In an embodiment, the first, second, and third intermediate electrodes CTE1, CTE2, and CTE3 and the pixel electrodes PE may be formed by the same process and may be provided on the same layer.

The intermediate electrodes CTE may be formed of various transparent conductive materials. The intermediate electrodes CTE and the pixel electrodes PE may include the same material, or may include one or more materials selected from among materials exemplified as the material for forming the pixel electrodes PE.

The fourth insulating layer INS4 may be provided and/or formed on the intermediate electrodes CTE. The fourth insulating layer INS4 may be an inorganic insulating layer including inorganic material or an organic insulating layer including organic material. For example, the fourth insulating layer INS4 may have a structure formed by alternately stacking at least one inorganic insulating layer and at least one organic insulating layer. The fourth insulating layer INS4 may cover the entirety of the display element layer DPL and prevent water or moisture from being introduced into the display element layer DPL including the light emitting elements LD from the outside. In an embodiment, at least one overcoat layer (e.g., a layer for planarizing the upper surface of the display element layer DPL) may be further disposed over the fourth insulating layer INS4.

In an embodiment, as illustrated in FIG. 13, an upper substrate may be further disposed on the fourth insulating layer INS4. The upper substrate may be provided on the display element layer DPL to cover the display area DA of the substrate SUB on which the pixel PXL is disposed. An intermediate layer CTL may be provided on the display element layer DPL.

The intermediate layer CTL may be a transparent adhesive layer (or a transparent bonding layer), e.g., an optically clear adhesive layer, for enhancing the adhesive force between the display element layer DPL and the upper substrate, but the disclosure is not limited thereto. In an embodiment, the intermediate layer CTL may be a refractive index conversion layer configured to change the refractive index of light emitted from the light emitting elements LD toward the upper substrate and may enhance the emission luminance of each pixel PXL.

The upper substrate may be formed of an encapsulation substrate (or a thin-film encapsulation layer) and/or a window layer of the display device DD. The upper substrate may include a base layer BSL and a light conversion pattern LCP.

The base layer BSL may be a rigid or flexible substrate, and the material or properties thereof are not particularly limited. The base layer BSL and the substrate SUB may be formed of (or include) the same material or different materials.

The light conversion pattern LCP may be disposed on a surface of the base layer BSL to face the pixels PXL of the substrate SUB. The light conversion pattern LCP may include a color conversion layer CCL and a color filter CF.

The color conversion layer CCL may include color conversion particles QD corresponding to a specific color. The color filter CF may allow light having a specific color to selectively pass therethrough.

The color conversion layer CCL may be disposed on a surface of the base layer BSL to face the corresponding pixel PXL, and include color conversion particles QD which convert a first color of light emitted from the light emitting elements LD disposed in the corresponding pixel PXL to a second color of light. For example, in case that the pixel PXL is a red pixel (or a red sub-pixel), the color conversion layer CCL may include color conversion particles QD formed of red quantum dots which convert a first color of light emitted from the light emitting elements LD to a second color of light, e.g., red light. For example, in case that the pixel PXL is a green pixel (or a green sub-pixel), the color conversion layer CCL of the corresponding pixel PXL may include color conversion particles QD formed of green quantum dots which convert a first color of light emitted from the light emitting elements LD to a second color of light, e.g., green light. For example, in case that the pixel PXL is a blue pixel (or a blue sub-pixel), the color conversion layer CCL of the corresponding pixel PXL may include color conversion particles QD formed of blue quantum dots which convert a first color of light emitted from the light emitting elements LD to a second color of light, e.g., blue light. In an embodiment, in case that the pixel PXL is a blue pixel (or a blue sub-pixel), a light scattering layer having light scattering particles may be provided, in place of the color conversion layer CCL having the color conversion particles QD. For example, in case that the light emitting elements LD emit blue-based light, the pixel PXL may include a light scattering layer including light scattering particles. The light scattering layer may be omitted depending on embodiments. In an embodiment, in case that the pixel PXL is a blue pixel (or a blue sub-pixel), a transparent polymer may be provided in place of the color conversion layer CCL.

The color filter CF may allow a specific color of light to selectively pass therethrough. The color filter CF along with the color conversion layer CCL may form the light conversion pattern LCP, and include color filter material which allows a specific color of light converted by the color conversion layer CCL to selectively pass therethrough. The color filter CF may include a red color filter, a green color filter, and a blue color filter. The color filter CF may be provided in the pixel area PXA of the pixel PXL to correspond to the color conversion layer CCL.

The light conversion pattern LCP including the color conversion layer CCL and the color filter CF may correspond to the emission area EMA of the pixel PXL.

A first light block pattern LBP1 may be disposed between the color filters CF of adjacent pixels PXL. The first light block pattern LBP1 may be provided on a surface of the base layer BSL to overlap the bank BNK provided in the pixel area PXA of the pixel PXL.

In an embodiment, the first light block pattern LBP1 may be provided in the form of a multi-layer structure formed by overlapping at least two color filters allowing different colors of light to selectively pass therethrough, among a red color filter, a green color filter, and a blue color filter. For example, the first light block pattern LBP1 may be provided in the form of a structure including a red color filter, a green color filter disposed on the red color filter and overlapping with the red color filter, and a blue color filter disposed on the green color filter and overlapping the green color filter. In other words, the first light block pattern LBP1 may be provided in the form of a structure formed by successively stacking the red color filter, the green color filter, and the blue color filter. In this case, in the non-emission area NEMA of the pixel area PXA, the red color filter, the green color filter, and the blue color filter may be used as the first light block pattern LBP1 for blocking transmission of light.

In an embodiment, a second light block pattern LBP2 may be disposed on or under the first light block pattern LBP1. The first light block pattern LBP1 and the second light block pattern LBP2 may include the same material. The first light block pattern LBP1 and the second light block pattern LBP2 each may be formed of a black matrix.

Although in the foregoing embodiment there has been described that the upper substrate including the base layer BSL and the light conversion pattern LCP is provided over the pixel PXL, the disclosure is not limited thereto.

In an embodiment, the light conversion pattern LCP may be formed on a surface of the substrate SUB on which the pixel PXL is provided.

In an embodiment, as illustrated in FIG. 14, some components of the light conversion pattern LCP, e.g., the color conversion layer CCL, may be formed on the surface of the substrate SUB on which the pixel PXL is provided, and another component (or the other components) of the light conversion pattern LCP, e.g., the color filter CF, may be formed on one surface of the base layer BSL and provided to face the color conversion layer CCL with the intermediate layer CTL interposed therebetween.

In this case, a dummy bank DBNK may be provided and/or formed on the bank BNK. The dummy bank DBNK may be disposed on the bank BNK and embody a dam DAM along with the bank BNK. The dam DAM may be a structure which ultimately defines, in the pixel PXL, the emission area EMA from which light is to be emitted. In an embodiment, during a process of supplying a color conversion layer CCL including color conversion particles QD to the emission area PXA, the dam DAM may be a structure which ultimately defines the emission area EMA to which the color conversion layer CCL is to be supplied. For example, since the emission area EMA of the pixel PXL is ultimately defined by the dam DAM, the color conversion layer CCL including a target amount and/or type of light conversion particles QD may be supplied (or input) to the emission area EMA.

The dummy bank DBNK may be provided and/or formed on the bank BNK on the fourth insulating layer INS4. The dummy bank DBNK may include light block material. For example, the dummy bank DBNK may be a black matrix. In an embodiment, the dummy bank DBNK may include at least one light block material and/or at least one reflective material, and allow light emitted from the light emitting elements LD to more reliably travel in the image display direction of the display device DD (or the third direction DR3), thus enhancing the light output efficiency of the light emitting elements LD.

In the foregoing embodiment, the alignment electrode ALE may not be disposed in an area of the non-emission area NEMA in which the first and second contact portions CNT1 and CNT2 are disposed, and the bridge patterns BRP that are formed of transparent conductive oxide may be disposed in an area of the non-emission area NEMA. Therefore, the 1-1-th bridge pattern BRP1_1 of the bridge patterns BRP may directly contact the first terminal TE1 of the first transistor T1 through the first contact portion CNT1 and may be electrically connected with the first terminal TE1. The 3-1-th bridge pattern BRP3_1 of the bridge patterns BRP may directly contact the second power line PL2 through the second contact portion CNT2 and may be electrically connected with the second power line PL2.

In the pixel circuit layer PCL, a conductive layer including the first terminal TE1 and the second power line PL2 may be formed of double layers stacked in a sequence of titanium/copper (Ti/Cu). If as in the typical display device the conductive layer formed by stacking layers in a sequence of titanium/copper directly contacts with the alignment electrode ALE formed of aluminum, the alignment electrode ALE formed of aluminum may be oxidized in case that a chemical solution (e.g., a developing solution) including a hydroxyl group (—OH) is applied to a contact surface between the conductive layer and the alignment electrode ALE during a fabrication process. Consequently, the alignment electrode ALE may be corroded. The corrosion may cause distortion resulting from a signal delay in case that a predetermined signal is applied to the alignment electrode ALE, so that an undesired failure may occur in case that the light emitting elements LD are aligned in the emission area EMA or the light emitting elements LD are driven.

To mitigate or minimize the failure, in the foregoing embodiment, at least in the non-emission area NEMA, the first terminal TE1 exposed through the first contact portion CNT1 may directly contact the 1-1-th bridge pattern BRP1_1 formed of transparent conductive oxide, and the second power line PL2 exposed through the second contact portion CNT2 may directly contact the 3-1-th bridge pattern BRP3_1 formed of transparent conductive oxide, so that the first terminal TE1 and the second power line PL2 each may be prevented from directly contacting the alignment electrodes ALE. Hence, the alignment electrodes ALE may be prevented from being corroded, so that the reliability of the alignment electrodes ALE may be improved.

In the foregoing embodiment, at least in the non-emission area NEMA, the bridge patterns BRP formed of transparent conductive oxide are disposed on the alignment electrodes ALE exposed through the contact holes CH passing through the first insulating layer INS1, so that the alignment electrodes ALE may be prevented from being exposed during the fabrication process, whereby the alignment electrodes ALE may be prevented from being oxidized. Consequently, the reliability of the alignment electrodes ALE may be further improved.

Furthermore, in the foregoing embodiment, at least in the non-emission area NEMA, the connection points (e.g., the contact holes CH in the first insulating layer INS1) between the alignment electrodes ALE and the bridge patterns BRP may be covered with the bank BNK. Hence, predetermined signals applied to the connection points between the alignment electrodes ALE and the bridge patterns BRP may be mitigated or minimized from affecting an electric field formed between the alignment electrodes ALE at the step of aligning the light emitting elements LD.

Furthermore, in the foregoing embodiment, in the second opening OP2 of the bank BNK, the 1-2-th bridge pattern BRP1_2 and the first pixel electrode PE1 may directly contact and electrically connected with each other, and the 3-2-th bridge pattern BRP3_2 and the second pixel electrode PE2 may directly contact and electrically connected with each other. Therefore, the pixel electrodes PE may be indirectly electrically connected with the alignment electrodes ALE through the bridge patterns BRP rather than being directly electrically connected with the alignment electrodes ALE, so that contact resistance of the pixel electrodes PE may not be increased. Therefore, the reliability of the pixel electrode PE may be enhanced, so that in case that a predetermined signal (or voltage) is supplied to the light emitting elements LD, distortion attributable to a signal delay may be mitigated or minimized, whereby the light emitting elements LD may be more reliably driven.

Figure 16:
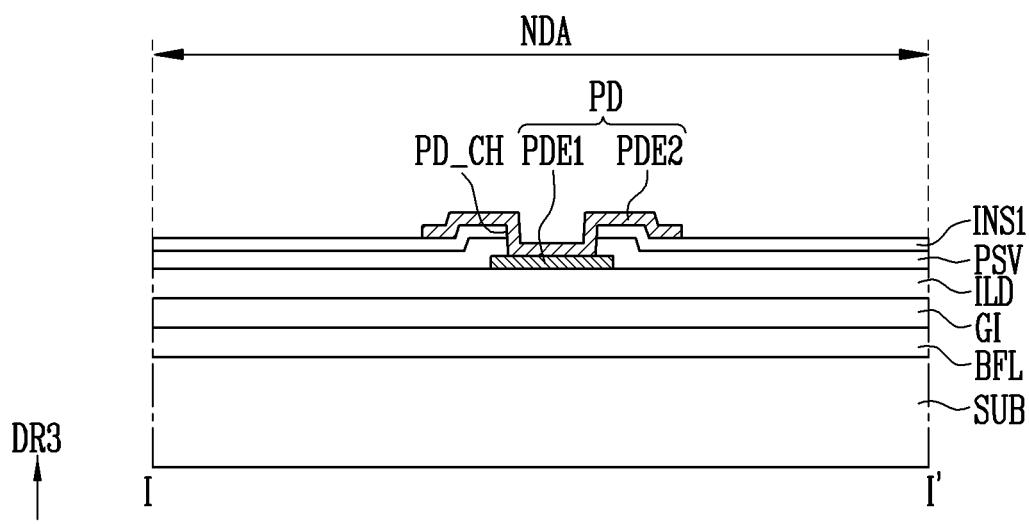
FIG. 16 is a schematic cross-sectional view taken along line I-I' of FIG. 4.
Figure 17:
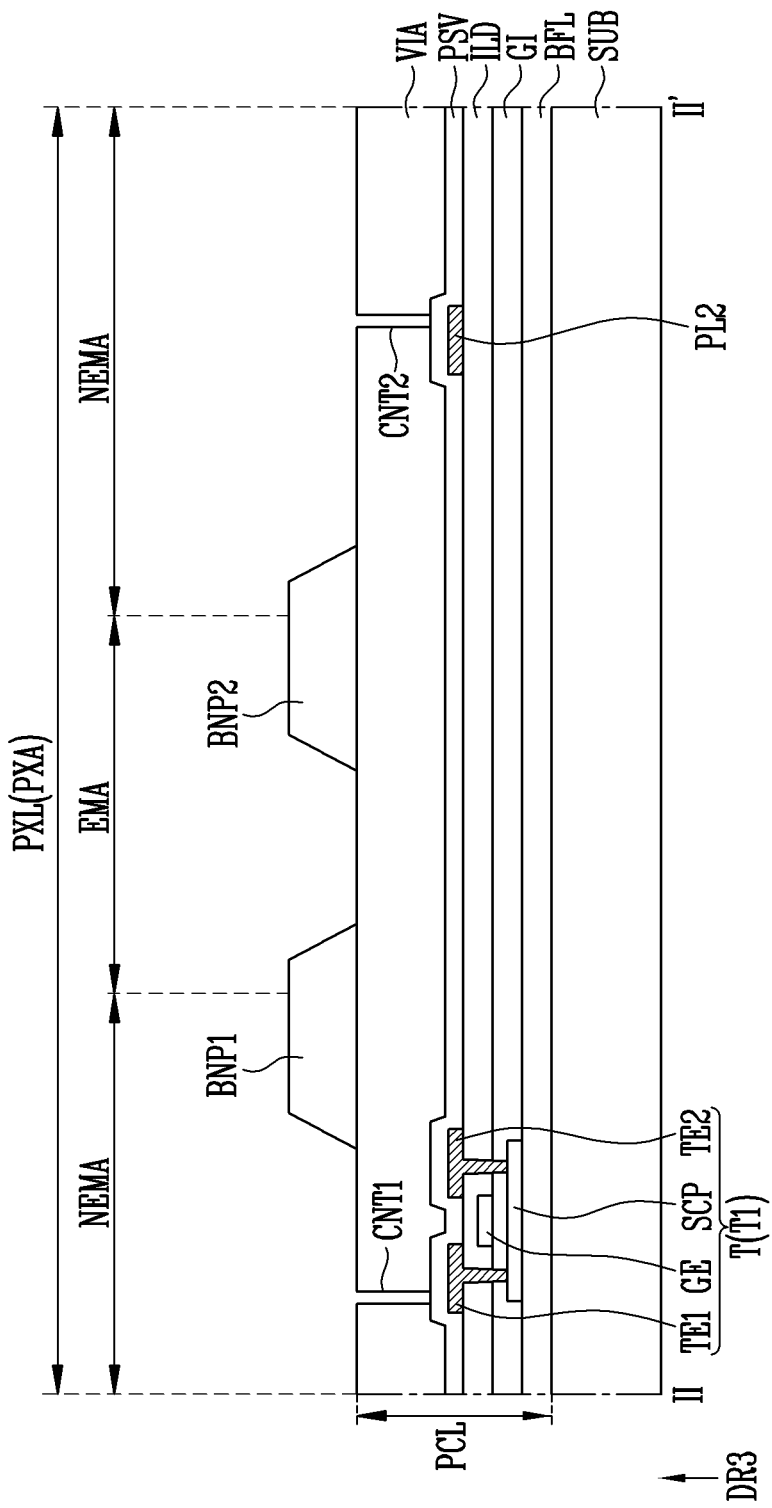
FIGS. 17 to 26 are schematic cross-sectional views schematically illustrating a method of fabricating the pixel illustrated in FIG. 9.
Figure 18:
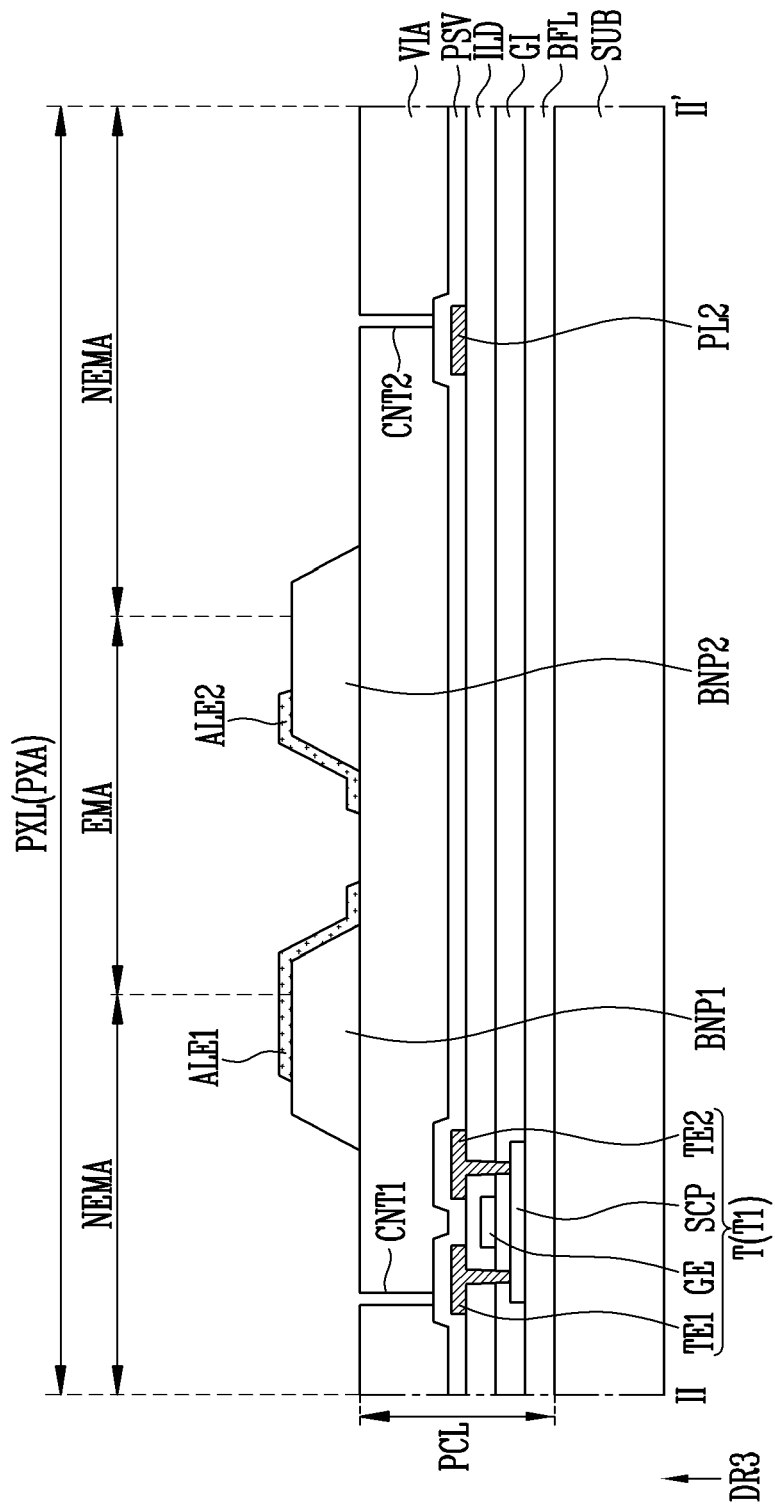
Figure 19:
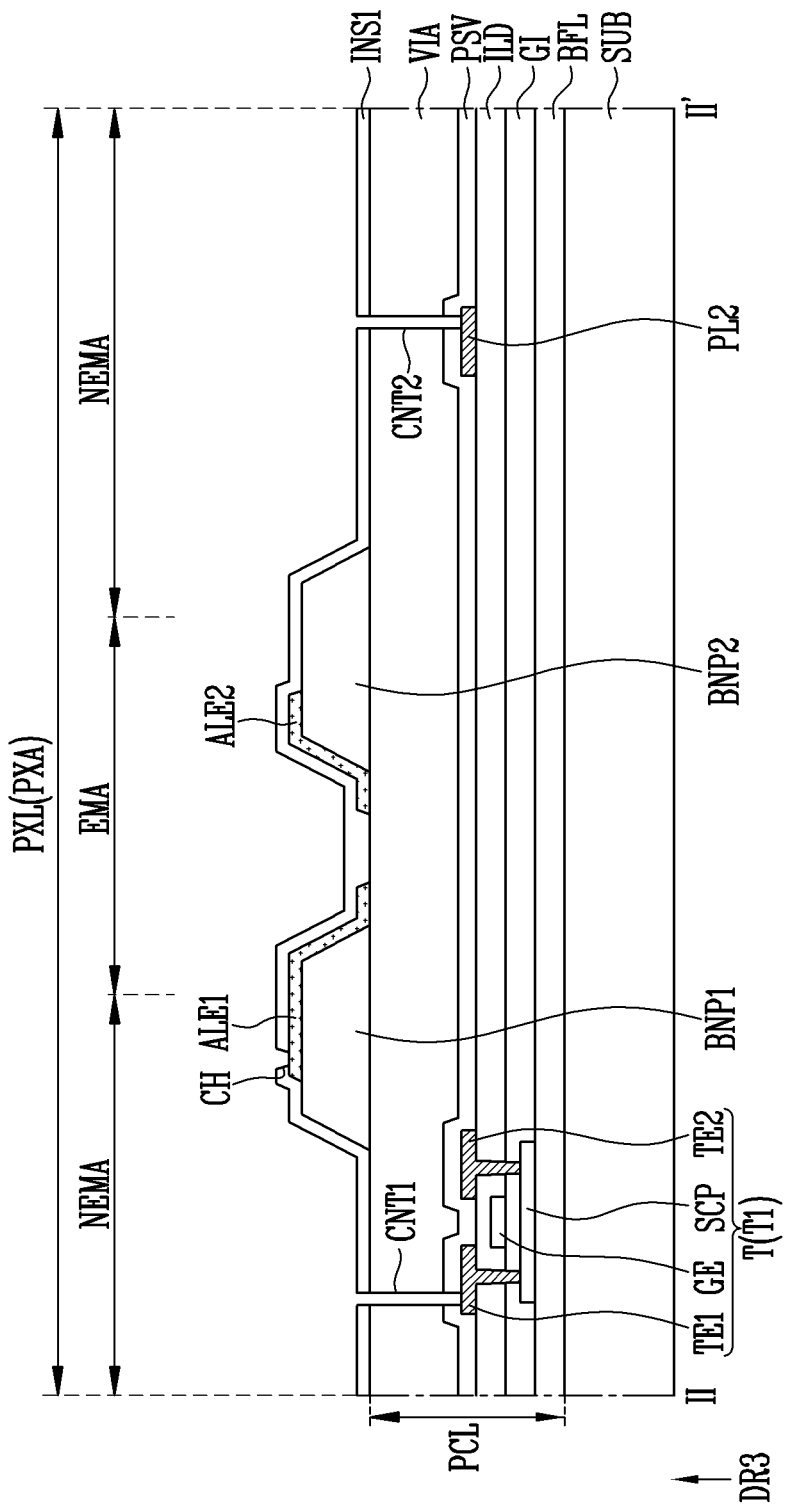
Figure 20:
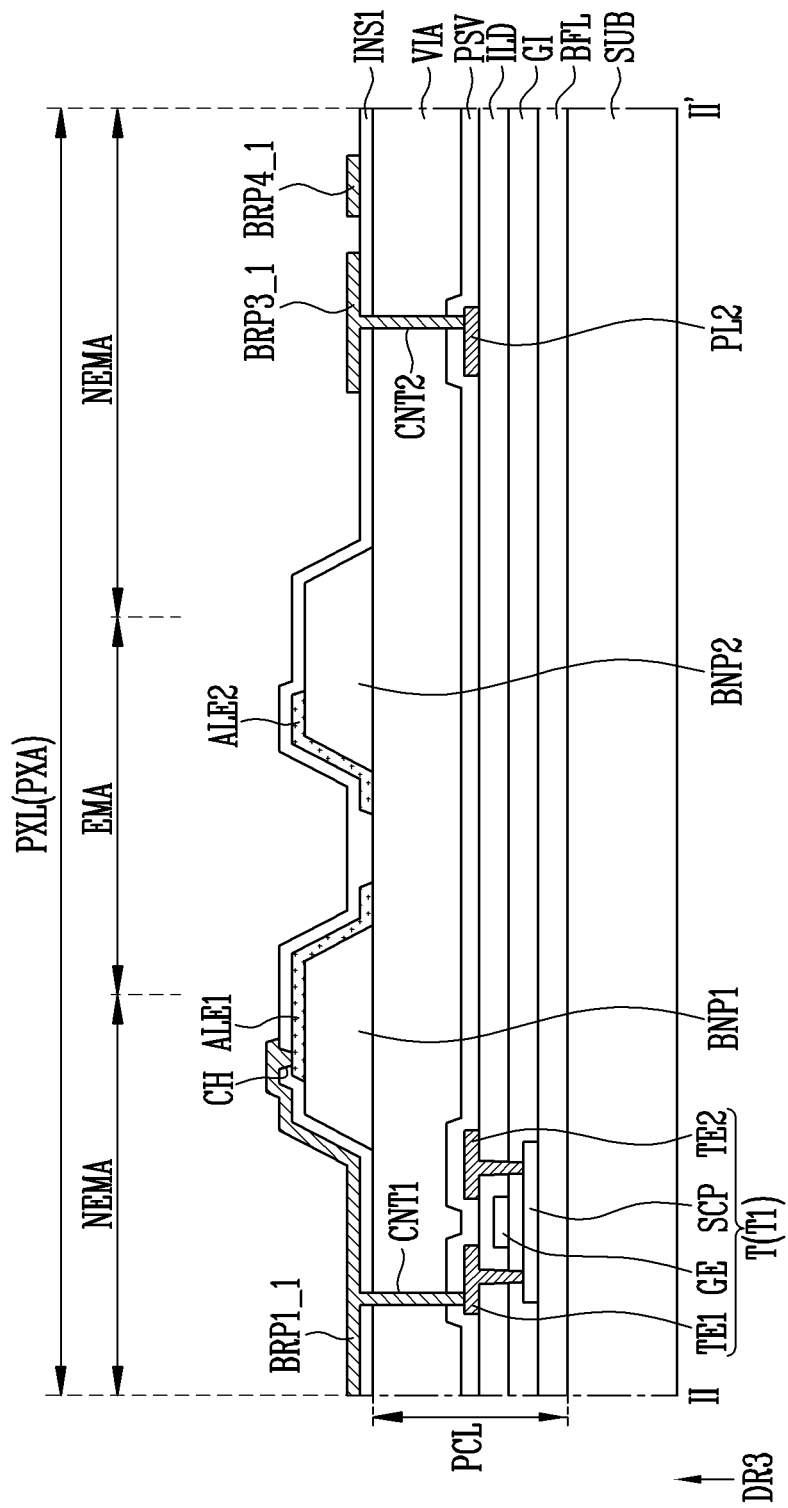
Figure 21:
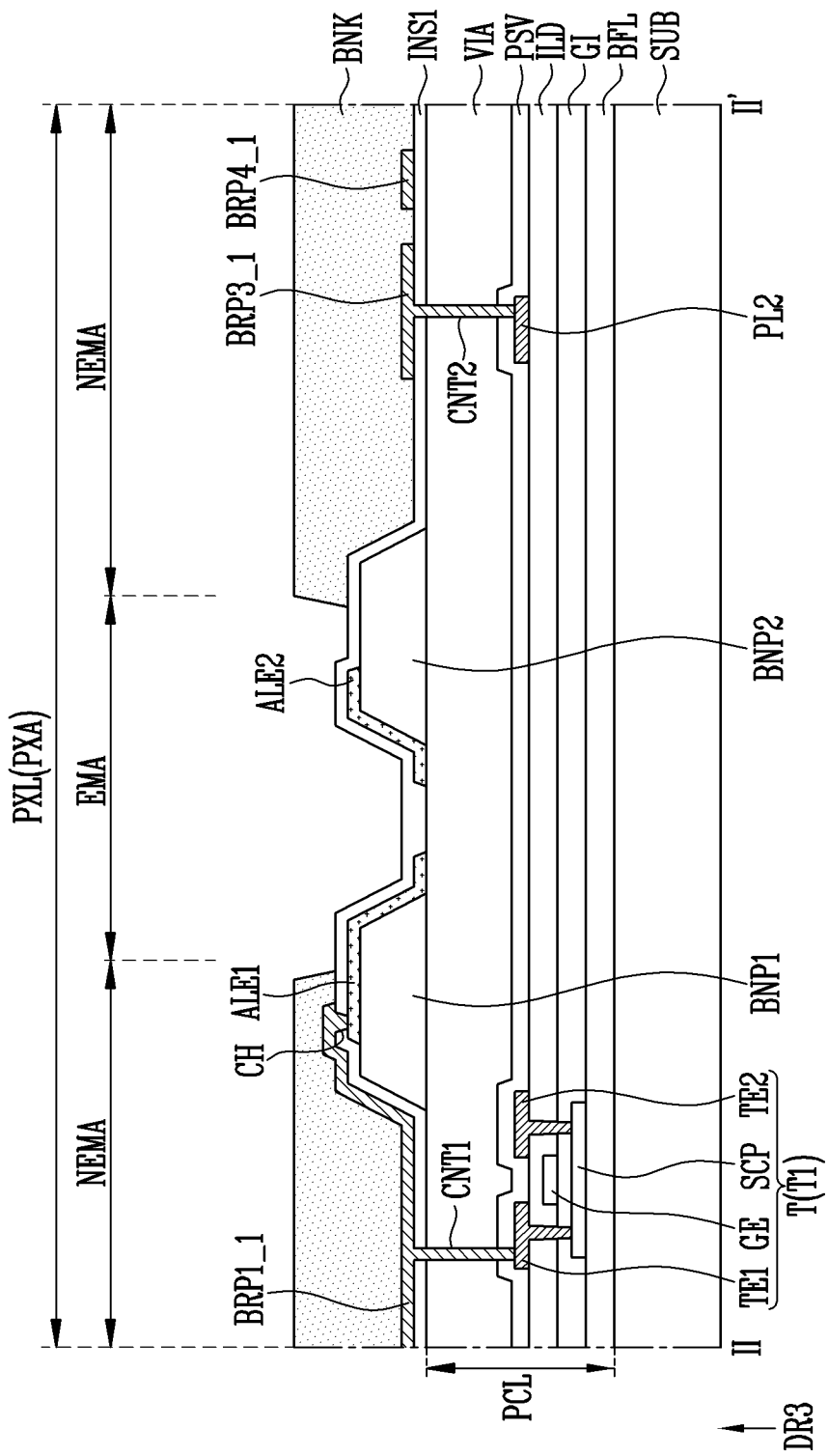
Figure 22:
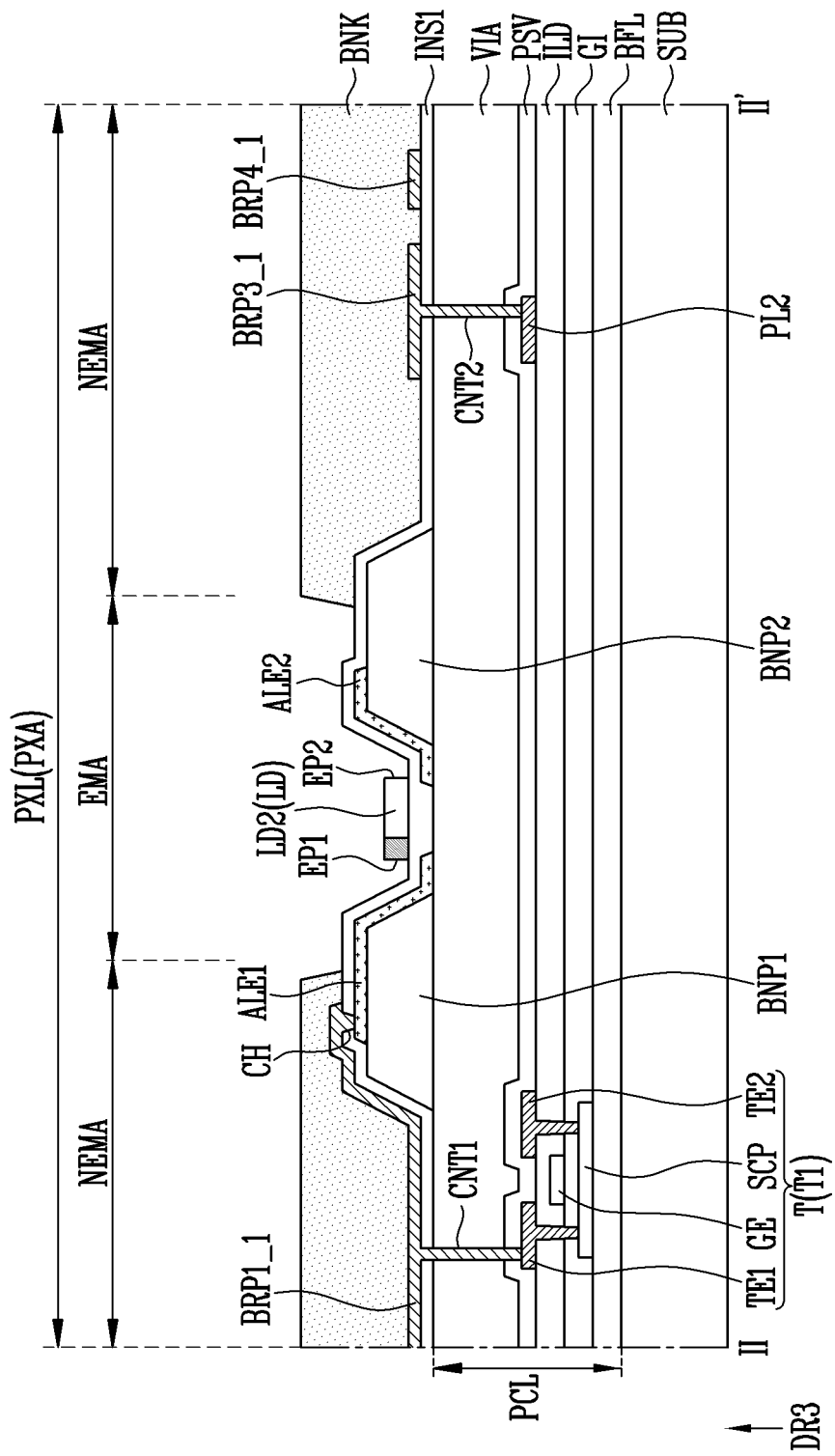
Figure 23:
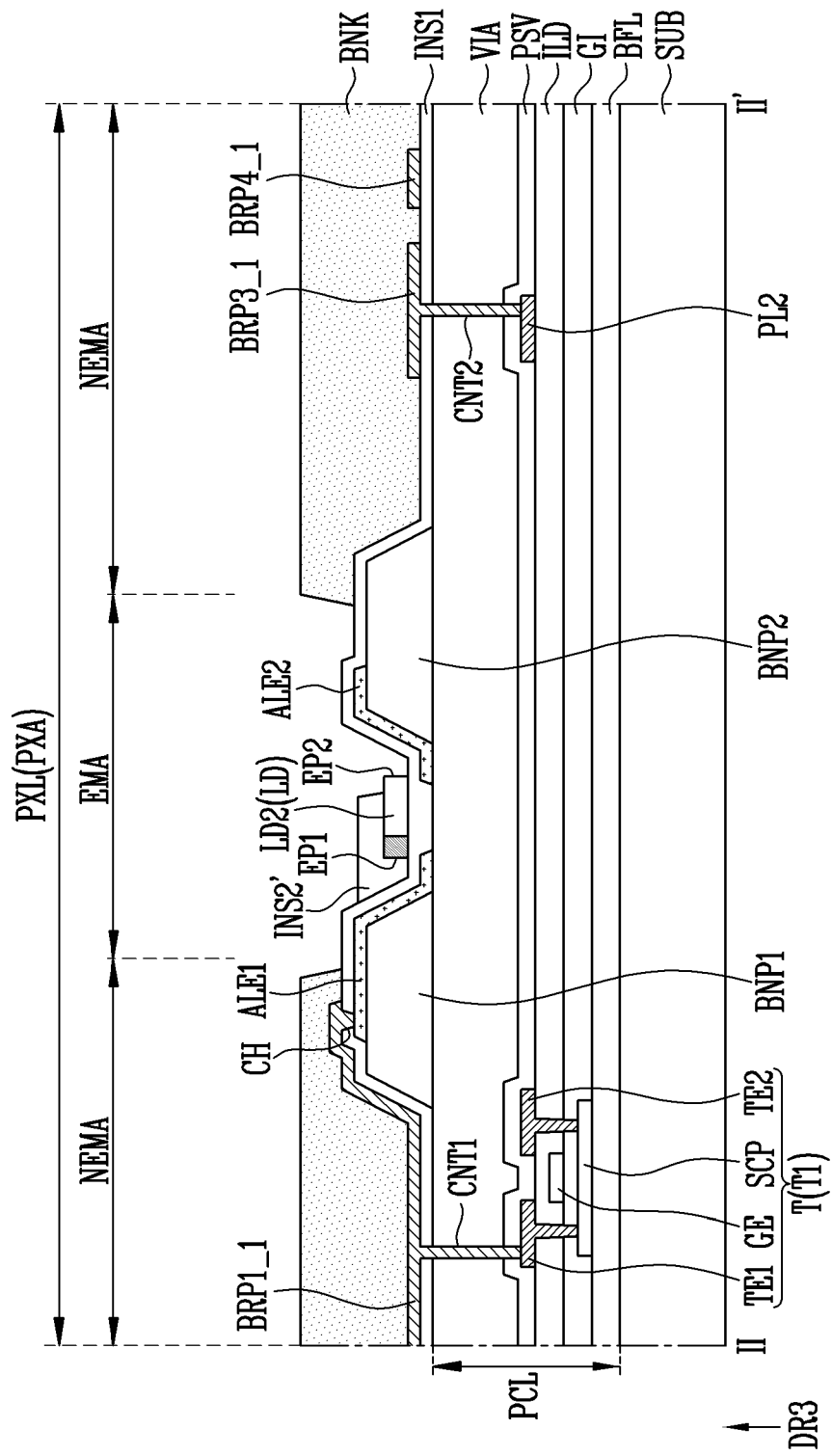
Figure 24:
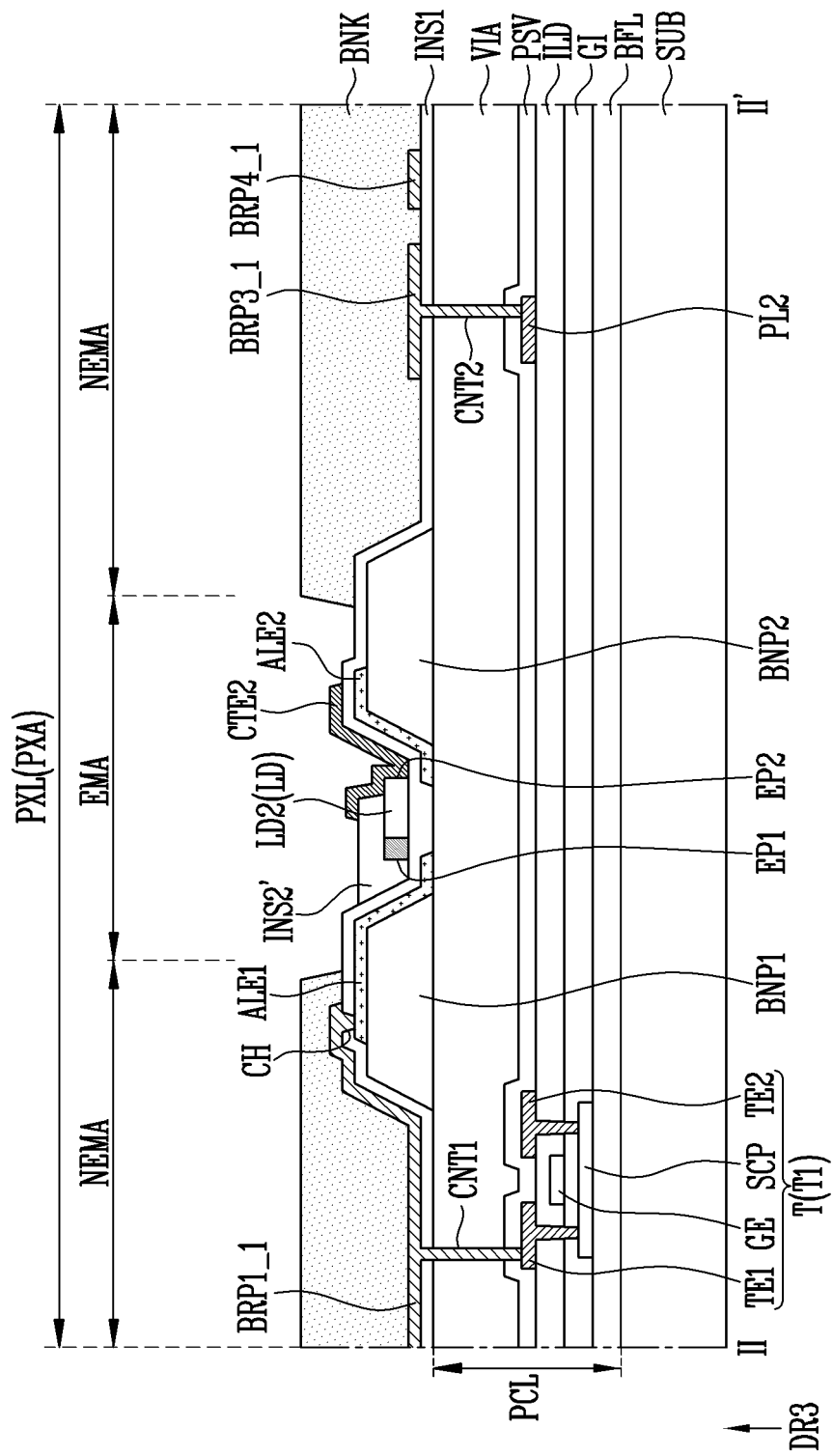
Figure 25:
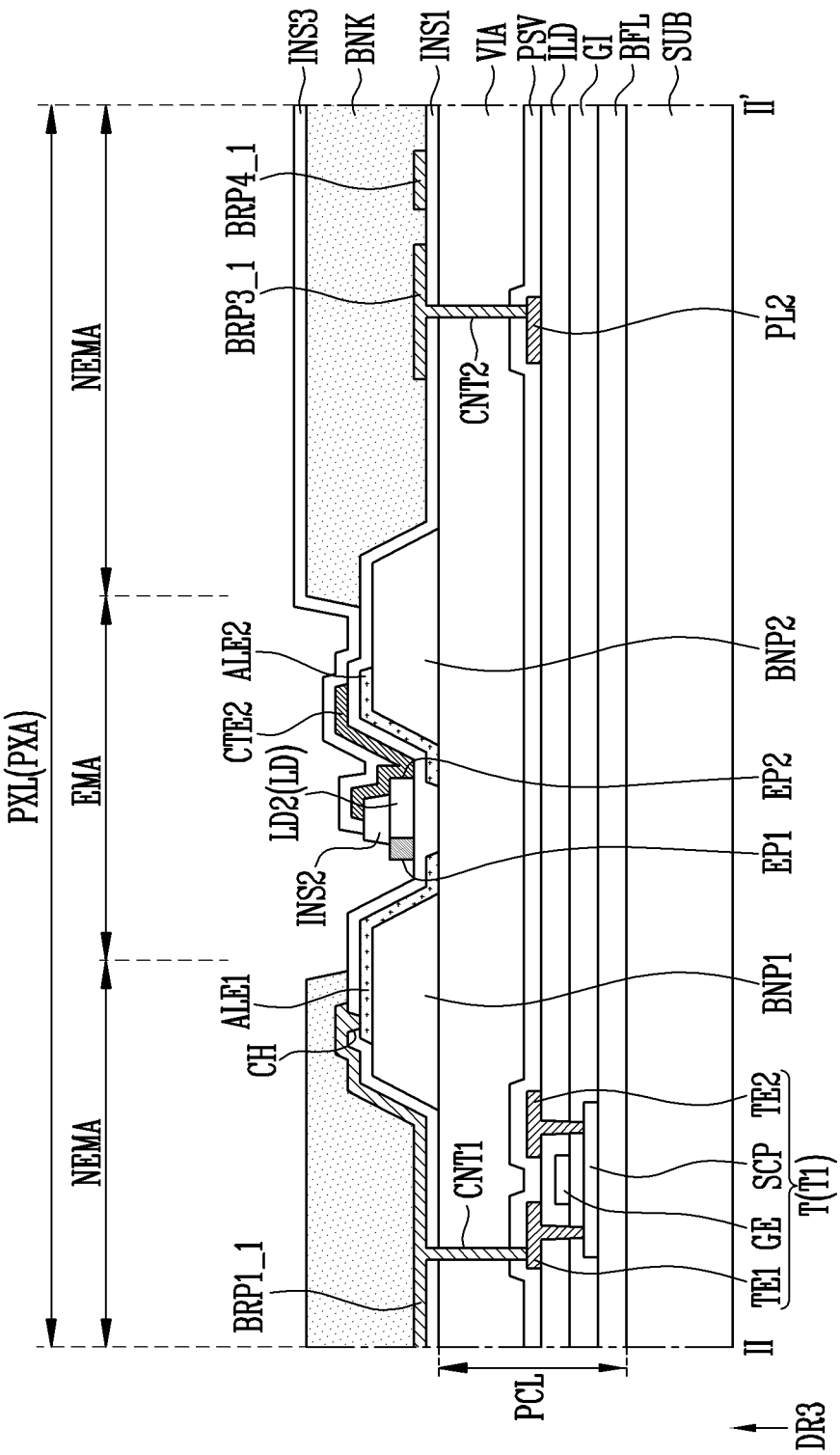
Figure 26:
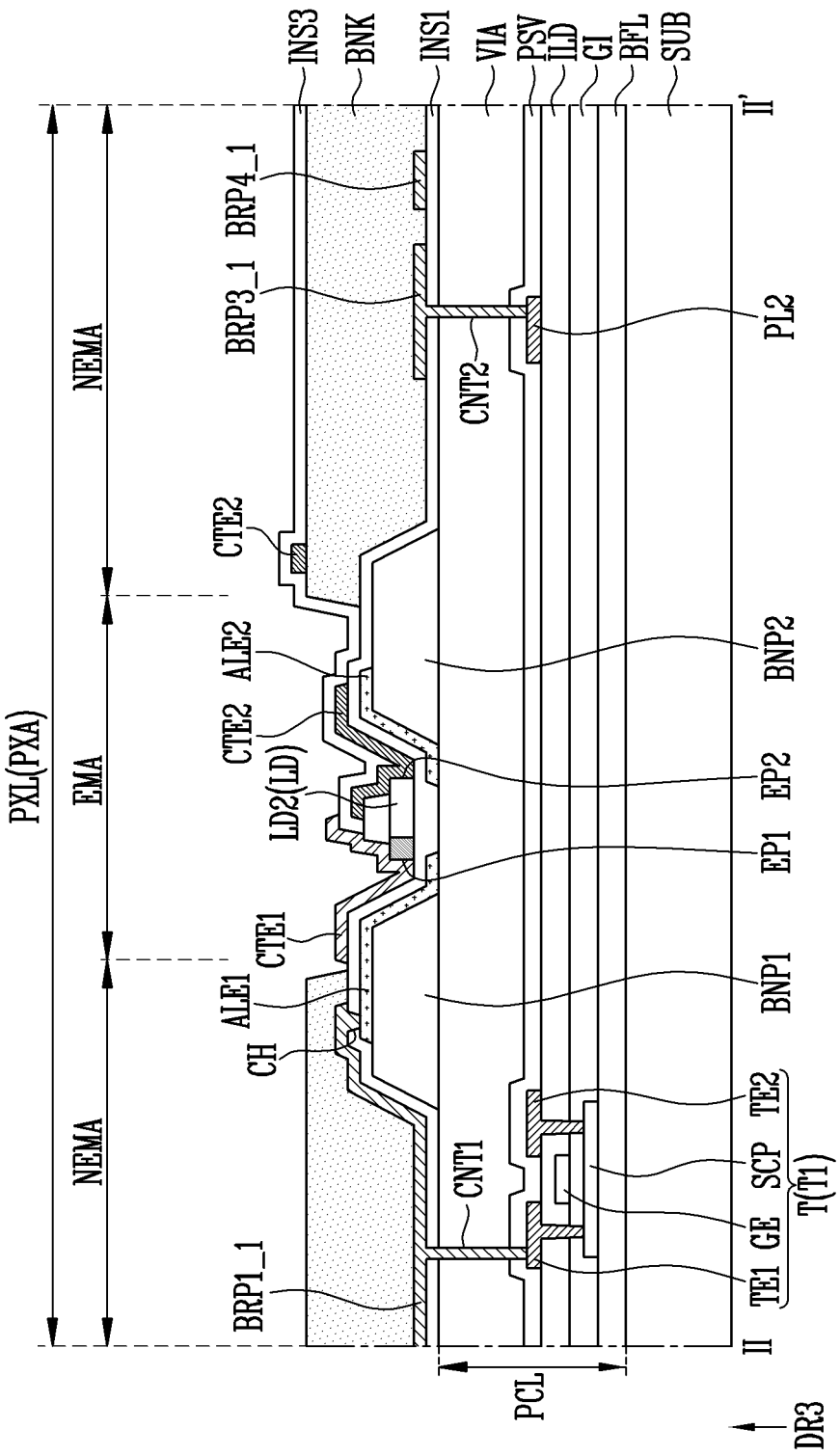

FIG. 16 is a schematic cross-sectional view taken along line I-I' of FIG. 4.

The following description with reference to FIG. 16 will be focused on differences from the foregoing embodiments to avoid repetitive descriptions. Components which are not separately explained in the following description of the embodiment of FIG. 16 may comply with those of the foregoing embodiments. The same reference numeral will be used to designate the same component, and a similar reference numeral will be used to designate a similar component.

Referring to FIGS. 4 and 16, each of the pads PD disposed in the non-display area NDA may include a first pad electrode PDE1 and a second pad electrode PDE2.

The first pad electrode PDE1 may be provided and/or formed on an interlayer insulating layer ILD. The interlayer insulating layer ILD and that described with reference to FIGS. 9 to 15 may have the same configuration, so that detailed descriptions thereof will be omitted.

The first pad electrode PDE1 may be provided on the interlayer insulating layer ILD, and the first pad electrode PDE1 and the first terminal TE1 and the second power line PL2 that are described with reference to FIGS. 9 to 15 may be provided on the same layer and include the same material. For example, the first pad electrode PDE1 and the conductive layer including the first terminal TE1 and the second power line PL2 may be formed by the same process. In an embodiment, the first pad electrode PDE1 may be formed as double layers stacked in a sequence of titanium (Ti)/copper (Cu).

A passivation layer PSV may be provided and/or formed on the first pad electrode PDE1 and the interlayer insulating layer ILD. The passivation layer PSV may be a passivation layer PSV described with reference to FIGS. 9 to 15.

The passivation layer PSV may be partially open to expose a portion of the first pad electrode PDE1 at least in the non-display area NDA. For example, the passivation layer PSV may be partially open to include a pad electrode contact hole PD_CH which exposes a portion of the first pad electrode PDE1 at least in the non-display area NDA.

At least in the non-display area NDA, a first insulating layer INS1 may be provided and/or formed on the overall surface of the passivation layer PSV. The first insulating layer INS1 may be the first insulating layer INS1 described with reference to FIGS. 9 to 15.

The first insulating layer INS1 may be partially open to expose a portion of the first pad electrode PDE1 at least in the non-display area NDA. For example, the first insulating layer INS1 may include a pad electrode contact hole PD_CH corresponding to the pad electrode contact hole PD_CH of the passivation layer PSV at least in the non-display area NDA and thus may be partially open to expose a portion of the first pad electrode PDE1.

The second pad electrode PDE2 may be provided and/or formed on the first insulating layer INS1.

The second pad electrode PDE2 may be disposed on the first insulating layer INS1 and overlap the first pad electrode PDE1. The second pad electrode PDE2 may contact the first pad electrode PDE1 exposed through the pad electrode contact hole PD_CH of each of the first insulating layer INS1 and the passivation layer PSV to be electrically connected to the first pad electrode PDE1. The second pad electrode PDE2 and the bridge patterns BRP described with reference to FIGS. 9 to 15 may be provided on a same layer and include a same material. For example, the second pad electrode PDE2 and the bridge patterns BRP may be formed by a same process. In an embodiment, the second pad electrode PDE2 may be formed of transparent conductive oxide such as indium tin oxide (ITO), indium zinc oxide (IZO), zinc oxide (ZnO), indium gallium zinc oxide (IGZO), and indium tin zinc oxide (ITZO). For example, the second pad electrode PDE2 may be formed of indium tin oxide.

The second pad electrode PDE2 may be exposed to the outside and may be electrically connected to a driver by a conductive adhesive or the like.

As described above, in each of the pads PD, the first pad electrode PDE1 formed by stacking layers in a sequence of titanium/copper and exposed through the pad electrode contact hole PD_CH may directly contact the second pad electrode PDE2 formed of transparent conductive oxide, so that the first pad electrode PDE1 may be prevented from directly contacting any conductive layer formed of aluminum (Al). Since the first pad electrode PDE1 is prevented from being electrically connected to any conductive layer formed of aluminum, corrosion may be prevented from occurring between the conductive layer and the first pad electrode PDE1 during the fabrication process. Consequently, the reliability of each of the pads PD may be improved.

FIGS. 17 to 26 are cross-sectional views schematically illustrating a method of fabricating the pixel PXL illustrated in FIG. 9.

Hereinafter, the method of fabricating the pixel PXL in accordance with an embodiment shown in FIG. 9 will be sequentially described with reference to FIGS. 17 to 26.

Herein, there is illustrated the case where the steps of fabricating the pixel PXL are sequentially performed according to the sectional views, but without changing the spirit of the present disclosure, some steps illustrated as being successively performed may be simultaneously performed, the sequence of the steps may be changed, some steps may be skipped, or another step may be further included between the steps.

The description with reference to FIGS. 17 to 26 will be focused on differences from the above-mentioned embodiments so as to avoid repetitive descriptions.

Referring to FIGS. 7 to 17, the pixel circuit layer PCL is formed on the substrate SUB of the display area DA.

The pixel circuit layer PCL may include the buffer layer BFL, the gate insulating layer GI, the interlayer insulating layer ILD, the first transistor T1, the second power line PL2, the passivation layer PSV, and the via layer VIA.

The buffer layer BFL, the gate insulating layer GI, the interlayer insulating layer ILD, and the passivation layer PSV may be common layers provided in the non-display area NDA.

At least in the non-emission area NEMA, the via layer VIA may include the first contactor CNT1 which exposes an area of the passivation layer PSV that corresponds to a component (or the first terminal TE1) of the first transistor T1, and the second contactor CNT2 which exposes another area of the passivation layer PSV that corresponds to the second power line PL2.

The first pad electrode PDE1 may be formed on the interlayer insulating layer ILD of the non-display area NDA. The first pad electrode PDE1, and the first and second terminals TE1 and TE2 of the first transistor T1, and the second power line PL2 may be formed by the same process. The passivation layer PSV may be formed on the first pad electrode PDE1.

The bank patterns BNP are formed on a surface of the via layer VIA of the display area DA (or the pixel area PXA). The bank patterns BNP may include the first bank pattern BNP1, the second bank pattern BNP2, and the third bank pattern BNP3 that are spaced apart from each other on a surface of the via layer VIA.

Referring to FIGS. 7 to 18, the alignment electrodes ALE are formed on the bank patterns BNP and the via layer VIA. The alignment electrodes ALE each may be formed of double layers stacked in a sequence of titanium/copper.

The alignment electrodes ALE may be formed on the bank patterns BNP and the via layer VIA at least in the emission area EMA. In an embodiment, the alignment electrodes ALE may be disposed in only an area of each of the emission area EMA and the non-emission area NEMA not to overlap the first and second contact portions CNT1 and CNT2.

The alignment electrodes ALE may be formed of opaque conductive material including metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. For example, the alignment electrodes ALE may be formed of opaque conductive material including aluminum (Al).

Referring to FIGS. 7 to 19, after an insulating material layer (not shown) is applied to the overall surfaces of the alignment electrodes ALE, the bank patterns BNP, and the via layer VIA, a photolithography process using a mask is performed, thus forming the first insulating layer INS1 that is partially open such that some components disposed thereunder are exposed. For example, the first insulating layer INS1 may be partially open in an area of the non-emission area NEMA to include a first contact portion CNT1 corresponding to the first contact portion CNT1 of the via layer VIA, and a second contact portion CNT2 corresponding to the second contact portion CNT2 of the via layer VIA. Furthermore, the first insulating layer INS1 may be partially open in another area of the non-emission area NEMA to include contact holes CH which expose respective portions of the alignment electrodes ALE.

During the foregoing process, the passivation layer PSV that is exposed through each of the first and second contact portions CNT1 and CNT2 of the via layer VIA may be partially open. For example, at an etching step of the foregoing process, a portion of the passivation layer PSV may be removed simultaneously with removal of a portion of the first insulating layer INS1. The portion of the passivation layer PSV that is removed may include an area corresponding to the first contact portion CNT1 of the via layer VIA, and an area corresponding to the second contact portion CNT2 of the via layer VIA. In an embodiment, during the process of forming the first insulating layer INS1, the passivation layer PSV may be partially open to include the first contact portion CNT1 corresponding to the first contact portion CNT1 of the via layer VIA, and the second contact portion CNT2 corresponding to the second contact portion CNT2 of the via layer VIA.

After the foregoing process has been performed, the first terminal TE1 may be exposed through the respective first contact portions CNT1 of the first insulating layer INS1, the via layer VIA, and the passivation layer PSV. Furthermore, after the foregoing process has been performed, the second power line PL2 may be exposed through the respective second contact portions CNT2 of the first insulating layer INS1, the via layer VIA, and the passivation layer PSV.

The first insulating layer INS1 may be formed on the passivation layer PSV in the non-display area NDA. In the non-display area NDA, the first insulating layer INS1 may be partially open to include a pad electrode contact hole PD_CH which exposes a portion of the first pad electrode PDE1. The passivation layer PSV disposed in the non-display area NDA may be partially open to include a pad electrode contact hole PD_CH corresponding to the pad electrode contact hole PD_CH of the first insulating layer INS1 during the foregoing process. A portion of the first pad electrode PDE1 may be exposed through the respective pad electrode contact holes PD_CH of the first insulating layer INS1 and the passivation layer PSV.

Referring to FIGS. 7 to 20, the bridge patterns BRP are formed on the first insulating layer INS1 disposed in the non-emission area NEMA. The bridge patterns BRP may be formed of transparent conductive oxide such as indium tin oxide (ITO) and indium zinc oxide (IZO).

The bridge patterns BRP may directly contact the alignment electrodes ALE through the contact holes CH of the first insulating layer INS1 and may be electrically connected with the alignment electrodes ALE.

Furthermore, the 1-1-th bridge pattern BRP1_1 of the bridge patterns BRP may directly contact the first terminal TE1 exposed through the first contact portion CNT1 and may be electrically connected with the first terminal T1. The 3-1-th bridge pattern BRP3_1 of the bridge patterns BRP may directly contact the second power line PL2 exposed through the second contact portion CNT2 and may be electrically connected with the second power line PL2.

During the foregoing process, the second pad electrode PDE2 may be formed on the first insulating layer INS1 of the non-display area NDA. The second pad electrode PDE2 and the bridge patterns BRP may be formed by the same process. The second pad electrode PDE2 may contact the first pad electrode PDE1 exposed through the pad electrode contact hole PD_CH and may be electrically connected to the first pad electrode PDE1.

Referring to FIGS. 7 to 21, the bank BNK is formed on the first insulating layer INS1 and the bridge patterns BRP disposed in the non-emission area NEMA.

The bank BNK may be disposed on the bridge patterns BRP and completely cover (or overlap) the bridge patterns BRP. Hence, the contact holes CH of the first insulating layer INS1 corresponding to the connection point between the bridge patterns BRP and the alignment electrodes ALE, and the first and second contact portions CNT1 and CNT2 formed to electrically connect the bridge patterns BRP and some components of the pixel circuit layer PCL (e.g., the first terminal TE1 and the second power line PL2) may be covered with the bank BNK and thus may be prevented from being exposed to the outside.

Referring to FIGS. 7 to 22, an electric field is formed between the alignment electrodes ALE by applying corresponding alignment signals to the respective alignment electrodes ALE through the bridge patterns BRP. For example, electric fields are respectively formed between the first alignment electrode ALE1 and the second alignment electrode ALE2 and between the third alignment electrode ALE3 and the fourth alignment electrode ALE4 by applying alignment signals to the respective first to fourth alignment electrodes ALE1 to ALE4 through the first to fourth bridge patterns BRP1 to BRP4.

Thereafter, while the electric fields is formed, ink including light emitting elements LD are input to the pixel area PXA of the pixel PXL by an inkjet printing scheme or the like. For example, at least one inkjet nozzle may be disposed on the first insulating layer INS1, and ink mixed with light emitting elements LD may be input to the pixel area PXA of the pixel PXL through the inkjet nozzle. The method of inputting the light emitting elements LD to the pixel area PXA is not limited to that of the foregoing embodiment. The method of supplying the light emitting elements LD may be changed in various ways.

In case that the light emitting elements LD are input to the pixel area PXA, self-alignment of the light emitting elements LD may be induced on the first insulating layer INS1 between the first and second alignment electrodes ALE1 and ALE2 and between the third and fourth alignment electrodes ALE3 and ALE4.

After the light emitting elements LD are self-aligned, a solvent included in the ink may be removed by a volatilization method or other methods.

Referring to FIGS. 7 to 23, after the light emitting elements LD are aligned in the pixel area PXA (or the emission area EMA), an insulating pattern INS2' is formed on the light emitting elements LD. The insulating pattern INS2' may be formed of an inorganic insulating layer (or an inorganic layer) including inorganic material or an organic insulating layer (or an organic layer) including organic material, as base material for forming the second insulating layer INS2.

The insulating pattern INS2' may allow one ends (or first ends) of the light emitting elements LD to be exposed and may cover (or overlap) remaining ends (or second ends) of the light emitting elements LD. Furthermore, the insulating pattern INS2' may cover a portion of the first insulating layer INS1 that is adjacent to the second ends of the light emitting elements LD. The insulating pattern INS2' may cover at least a portion of a surface (e.g., an upper surface in the third direction DR3) of each of the light emitting elements LD and allow the first end of each of the light emitting elements LD from being exposed to the outside.

While the process of forming the insulating pattern INS2' is performed, some of the alignment electrodes ALE may be removed from the second opening OP2 of the bank BNK that is an electrode separation area, so that each pixel PXL may be independently or individually driven from pixels PXL adjacent thereto.

Referring to FIGS. 7 to 24, the first and second pixel electrodes PE1 and PE2 and the second intermediate electrode CTE2 are formed on the insulating pattern INS2' and the light emitting elements LD.

The first pixel electrode PE1 may be disposed on the first ends EP1 of the first light emitting elements LD1 among the light emitting elements LD in the emission area EMA, and thus may be electrically connected with the first light emitting elements LD1. Furthermore, the first pixel electrode PE1 may be disposed on the 1-2-th bridge pattern BRP1_2 in an area of the non-emission area NEMA (or in the second opening OP2 of the bank BNK) and may directly contact and be electrically connected with the 1-2-th bridge pattern BRP1_2.

The second pixel electrode PE2 may be disposed on the second ends EP2 of the fourth light emitting elements LD4 among the light emitting elements LD in the emission area EMA, and thus may be electrically connected with the fourth light emitting elements LD4. Furthermore, the second pixel electrode PE2 may be disposed on the 3-2-th bridge pattern BRP3_2 in an area of the non-emission area NEMA (or in the second opening OP2 of the bank BNK) and may directly contact and be electrically connected with the 3-2-th bridge pattern BRP3_2.

The second intermediate electrode CTE2 may be disposed on the second ends EP2 of the second light emitting elements LD2 among the light emitting elements LD in the emission area EMA, and thus may be electrically connected with the second light emitting elements LD2. The second intermediate electrode CTE2 may be disposed on the first ends EP1 of the third light emitting elements LD3 among the light emitting elements LD in the emission area EMA, and thus may be electrically connected with the third light emitting elements LD3.

Referring to FIGS. 7 to 25, the third insulating layer INS3 is formed on the pixel electrodes PE and the second intermediate electrode CTE2. The third insulating layer INS3 may cover the pixel electrodes PE and the second intermediate electrode CTE2. The second insulating layer INS2 which allows the opposite ends EP1 and EP2 of the light emitting elements LD to be exposed may be formed by removing a portion of the insulating pattern INS2' during the process of forming the third insulating layer INS3.

Since the third insulating layer INS3 covers only the pixel electrodes PE and the second intermediate electrode CTE2, the second ends of the light emitting elements LD may be exposed by the second insulating layer INS2.

Referring to FIGS. 7 to 26, the first and third intermediate electrodes CTE1 and CTE3 are formed on the exposed second ends of the light emitting elements LD.

The first intermediate electrode CTE1 may be disposed on the second ends EP2 of the first light emitting elements LD1 in the emission area EMA, and thus may be electrically connected with the first light emitting elements LD1. Furthermore, the first intermediate electrode CTE1 may be disposed on the first ends EP1 of the second light emitting elements LD2 in the emission area EMA, and thus may be electrically connected with the second light emitting elements LD2.

The third intermediate electrode CTE3 may be disposed on the second ends EP2 of the third light emitting elements LD3 in the emission area EMA, and thus may be electrically connected with the third light emitting elements LD3. Furthermore, the third intermediate electrode CTE3 may be disposed on the first ends EP1 of the fourth light emitting elements LD4 in the emission area EMA, and thus may be electrically connected with the fourth light emitting elements LD4.

In the pixel PXL formed through the above-mentioned fabrication process, some components (the first transistor T1 and the second power line PL2) of the pixel circuit layer PCL and the alignment electrodes ALE of the display element layer DPL may not directly contact each other. In lieu of the alignment electrodes ALE, the bridge patterns BRP formed of transparent conductive oxide and electrically connected with the alignment electrodes ALE may directly contact the some components of the pixel circuit layer PCL, so that a failure which may occur because of material characteristics of the alignment electrodes ALE may be mitigated or prevented.

In an embodiment of the disclosure, an alignment electrode and some components (e.g., a transistor and/or a power line) of a pixel circuit layer may be electrically connected through a bridge pattern formed of transparent conductive oxide, so that corrosion may be prevented from occurring between the alignment electrode and the some components.

Furthermore, in accordance with an embodiment of the disclosure, since an alignment electrode and a pixel electrode are electrically connected through a bridge pattern, so that contact resistance of the pixel electrode may be prevented from increasing. Therefore, light emitting elements may be more reliably driven, whereby a display device having improved reliability may be provided.

The effects of an embodiment of the disclosure are not limited by the foregoing, and other various effects are anticipated herein.

While various embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the technical spirit of the disclosure. The scope of the claimed invention must be defined by the accompanying claims.

What is claimed is:

1. A pixel comprising:
an emission area and a non-emission area;
a first alignment electrode, a second alignment electrode, a third alignment electrode, and a fourth alignment electrode spaced apart from each other in the emission area and an area of the non-emission area;
an insulating layer disposed on the first to the fourth alignment electrodes;
a first bridge pattern, a second bridge pattern, a third bridge pattern, and a fourth bridge pattern disposed on the insulating layer in the non-emission area, and spaced apart from each other;
a bank disposed on the first to the fourth bridge patterns in the non-emission area, and including:
a first opening corresponding to the emission area; and
a second opening spaced apart from the first opening;
a first pixel electrode and a second pixel electrode disposed in the emission area, and spaced apart from each other; and
light emitting elements disposed in the emission area, and electrically connected with the first and the second pixel electrodes, wherein
the first alignment electrode, the first bridge pattern, and the first pixel electrode are electrically connected to each other, and
the third alignment electrode, the third bridge pattern, and the second pixel electrode are electrically connected to each other.

2. The pixel according to claim 1, wherein the insulating layer includes:
at least one first contact hole exposing a portion of the first alignment electrode;
at least one second contact hole exposing a portion of the second alignment electrode;
at least one third contact hole exposing a portion of the third alignment electrode; and
at least one fourth contact hole exposing a portion of the fourth alignment electrode.

3. The pixel according to claim 2, wherein
the first bridge pattern is electrically connected with the first alignment electrode through the first contact hole,
the second bridge pattern is electrically connected with the second alignment electrode through the second contact hole,
the third bridge pattern is electrically connected with the third alignment electrode through the third contact hole, and
the fourth bridge pattern is electrically connected with the fourth alignment electrode through the fourth contact hole.

4. The pixel according to claim 3, wherein the first, the second, the third, and the fourth contact holes are disposed in the non-emission area.

5. The pixel according to claim 4, wherein the first, the second, the third, and the fourth contact holes overlaps the bank in a plan view.

6. The pixel according to claim 4, wherein the first to the fourth alignment electrodes and the first to the fourth bridge patterns include different materials.

7. The pixel according to claim 6, wherein
the first to the fourth alignment electrodes include an opaque conductive material, and
the first to the fourth bridge patterns include a transparent conductive oxide.

8. The pixel according to claim 4, wherein
the first pixel electrode is disposed directly on the first bridge pattern in the second opening and electrically connected with the first bridge pattern, and
the second pixel electrode is disposed directly on the third bridge pattern in the second opening and electrically connected with the third bridge pattern.

9. The pixel according to claim 8, wherein
the first pixel electrode is disposed on the first alignment electrode in the first opening with the insulating layer disposed between the first pixel electrode and the first alignment electrode, and
the second pixel electrode is disposed on the third alignment electrode in the first opening with the insulating layer disposed between the second pixel electrode and the third alignment electrode.

10. The pixel according to claim 8, further comprising:
a substrate;
at least one transistor disposed on the substrate;

at least one power line disposed on the substrate and supplied with a power voltage;
a passivation layer disposed on the transistor and the power line, and including:
   a first contact portion exposing a portion of the transistor, and
   a second contact portion exposing a portion of the power line; and
a via layer including:
   a first contact portion corresponding to the first contact portion of the passivation layer; and
   a second contact portion corresponding to the second contact portion of the passivation layer.

11. The pixel according to claim 10, wherein the insulating layer is disposed on the via layer, and includes:
   a first contact portion corresponding to the first contact portion of the via layer; and
   a second contact portion corresponding to the second contact portion of the via layer.

12. The pixel according to claim 11, wherein the first contact portion and the second contact portion are disposed in the non-emission area and overlap the bank in a plan view.

13. The pixel according to claim 11, wherein
the first bridge pattern is electrically connected with the transistor through the first contact portion, and
the third bridge pattern is electrically connected with the power line through the second contact portion.

14. The pixel according to claim 7, further comprising:
a color conversion layer disposed over the light emitting elements, and converting a first color of light emitted from the light emitting elements to a second color of light; and
a color filter disposed over the color conversion layer and allowing the second color of light to selectively pass therethrough.

15. The pixel according to claim 7, further comprising:
an intermediate electrode spaced apart from the first and the second pixel electrodes.

16. A display device comprising:
a substrate including a display area and a non-display area;
pixels provided in the display area of the substrate; and
a pad disposed in the non-display area of the substrate, and electrically connected with each of the pixels, wherein
each of the pixels comprises:
   an emission area and a non-emission area;
   a first alignment electrode, a second alignment electrode, a third alignment electrode, and a fourth alignment electrode spaced apart from each other in the emission area and an area of the non-emission area;
   an insulating layer disposed on the first to the fourth alignment electrodes;
   a first bridge pattern, a second bridge pattern, a third bridge pattern, and a fourth bridge pattern disposed on the insulating layer in the non-emission area, and spaced apart from each other;
   a bank disposed on the first to the fourth bridge patterns in the non-emission area, and including:
      a first opening corresponding to the emission area; and
      a second opening spaced apart from the first opening;
   a first pixel electrode and a second pixel electrode disposed in the emission area, and spaced apart from each other; and
   light emitting elements disposed in the emission area, and electrically connected with the first and the second pixel electrodes,
the first alignment electrode, the first bridge pattern, and the first pixel electrode are electrically connected to each other, and
the third alignment electrode, the third bridge pattern, and the second pixel electrode are electrically connected to each other.

17. The display device according to claim 16, wherein the insulating layer includes:
   at least one first contact hole exposing a portion of the first alignment electrode;
   at least one second contact hole exposing a portion of the second alignment electrode;
   at least one third contact hole exposing a portion of the third alignment electrode; and
   at least one fourth contact hole exposing a portion of the fourth alignment electrode,
the first bridge pattern is electrically connected with the first alignment electrode through the first contact hole,
the second bridge pattern is electrically connected with the second alignment electrode through the second contact hole,
the third bridge pattern is electrically connected with the third alignment electrode through the third contact hole, and
the fourth bridge pattern is electrically connected with the fourth alignment electrode through the fourth contact hole.

18. The display device according to claim 17, wherein the first, the second, the third, and the fourth contact holes are disposed in the non-emission area, and overlap the bank in a plan view.

19. The display device according to claim 16, wherein the pad comprises:
   a first pad electrode disposed on the substrate;
   the insulating layer disposed on the first pad electrode, and including a pad electrode contact hole exposing a portion of the first pad electrode; and
   a second pad electrode disposed on the insulating layer and electrically connected with the first pad electrode through the pad electrode contact hole,
the second pad electrode and the first to the fourth bridge patterns are disposed on a same layer, and
the second pad electrode and the first to the fourth bridge patterns include a same material.

20. The display device according to claim 16, wherein
the first to the fourth alignment electrodes and the first to the fourth bridge patterns include different materials, and
the first to the fourth alignment electrodes include an opaque conductive material, and
the first to the fourth bridge patterns include a transparent conductive material.

* * * * *